(12) United States Patent
Masuda et al.

(10) Patent No.: US 12,354,696 B2
(45) Date of Patent: Jul. 8, 2025

(54) SEMICONDUCTOR MEMORY DEVICE

(71) Applicant: Kioxia Corporation, Tokyo (JP)

(72) Inventors: Takafumi Masuda, Kawasaki Kanagawa (JP); Nobuyoshi Saito, Ota Tokyo (JP); Mutsumi Okajima, Yokkaichi Mie (JP); Keiji Ikeda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 119 days.

(21) Appl. No.: 18/463,686

(22) Filed: Sep. 8, 2023

(65) Prior Publication Data

US 2024/0087616 A1    Mar. 14, 2024

(30) Foreign Application Priority Data

Sep. 9, 2022  (JP) ................ 2022-143829

(51) Int. Cl.
*G11C 5/10*  (2006.01)
*G11C 5/06*  (2006.01)

(52) U.S. Cl.
CPC ............ *G11C 5/063* (2013.01); *G11C 5/10* (2013.01)

(58) Field of Classification Search
CPC .. G11C 5/063; G11C 5/10; G11C 7/18; G11C 11/4097; H10B 12/00; H10B 12/482; H10B 12/30; H10B 12/488
USPC ................................ 365/63, 230.06
See application file for complete search history.

(56) References Cited

U.S. PATENT DOCUMENTS

| | | |
|---|---|---|
| 8,709,920 B2 | 4/2014 | Endo et al. |
| 9,514,792 B2 | 12/2016 | Kajigaya |
| 9,570,461 B2 | 2/2017 | Hashimoto et al. |
| 9,859,016 B2 | 1/2018 | Katoh et al. |
| 10,629,608 B2 | 4/2020 | Yeh et al. |
| 2020/0211631 A1 | 7/2020 | Karda et al. |
| 2020/0227416 A1 | 7/2020 | Lilak et al. |
| 2020/0227418 A1 | 7/2020 | Kim et al. |

(Continued)

FOREIGN PATENT DOCUMENTS

| | | |
|---|---|---|
| JP | 2016-009738 A | 1/2016 |
| JP | 2022-147872 A | 10/2022 |
| JP | 2024-017785 A | 2/2024 |

OTHER PUBLICATIONS

U.S. Appl. No. 18/184,792, filed Mar. 16, 2023, Kioxia Corp.

*Primary Examiner* — Michael T Tran
(74) *Attorney, Agent, or Firm* — Foley & Lardner LLP

(57) ABSTRACT

A semiconductor memory device comprises: memory layers arranged in a first direction; and a first and a second via wirings having different positions in a second direction. The memory layer comprises: a first transistor electrically connected to the first via wiring; a memory portion electrically connected to the first transistor; a wiring electrically connected to the first transistor; a second transistor electrically connected to the second via wiring; and an electrode provided in a current path between the second transistor and the wiring. The second transistor comprises: a semiconductor layer electrically connected to the electrode and the second via wiring; and a gate electrode facing the semiconductor layer. The semiconductor layer faces at least one of surfaces on one side or the other side in the first direction of the gate electrode. The electrode includes a portion arranged with the second via wiring in a third direction.

19 Claims, 76 Drawing Sheets

(56) References Cited

U.S. PATENT DOCUMENTS

| | | |
|---|---|---|
| 2020/0251151 A1 | 8/2020 | Kang et al. |
| 2022/0310612 A1 | 9/2022 | Okajima |
| 2024/0015965 A1* | 1/2024 | Choi .................... H10B 51/50 |
| 2024/0038280 A1 | 2/2024 | Masuda et al. |
| 2024/0090218 A1* | 3/2024 | Kim .................... H10N 70/253 |
| 2024/0220148 A1* | 7/2024 | Song .................... G06F 3/0679 |
| 2024/0222333 A1* | 7/2024 | Or-Bach ................ H10D 87/00 |

* cited by examiner

SEMICONDUCTOR MEMORY DEVICE

CROSS-REFERENCE TO RELATED APPLICATIONS

This application is based upon and claims the benefit of Japanese Patent Application No. 2022-143829, filed on Sep. 9, 2022, the entire contents of which are incorporated herein by reference.

BACKGROUND

Field

Embodiments relate to a semiconductor memory device.

Description of the Related Art

As degree-of-integration of semiconductor memory devices continues to rise, study is underway into how three-dimensionality of the semiconductor memory devices may be further promoted.

DETAILED DESCRIPTION

Figure 1:
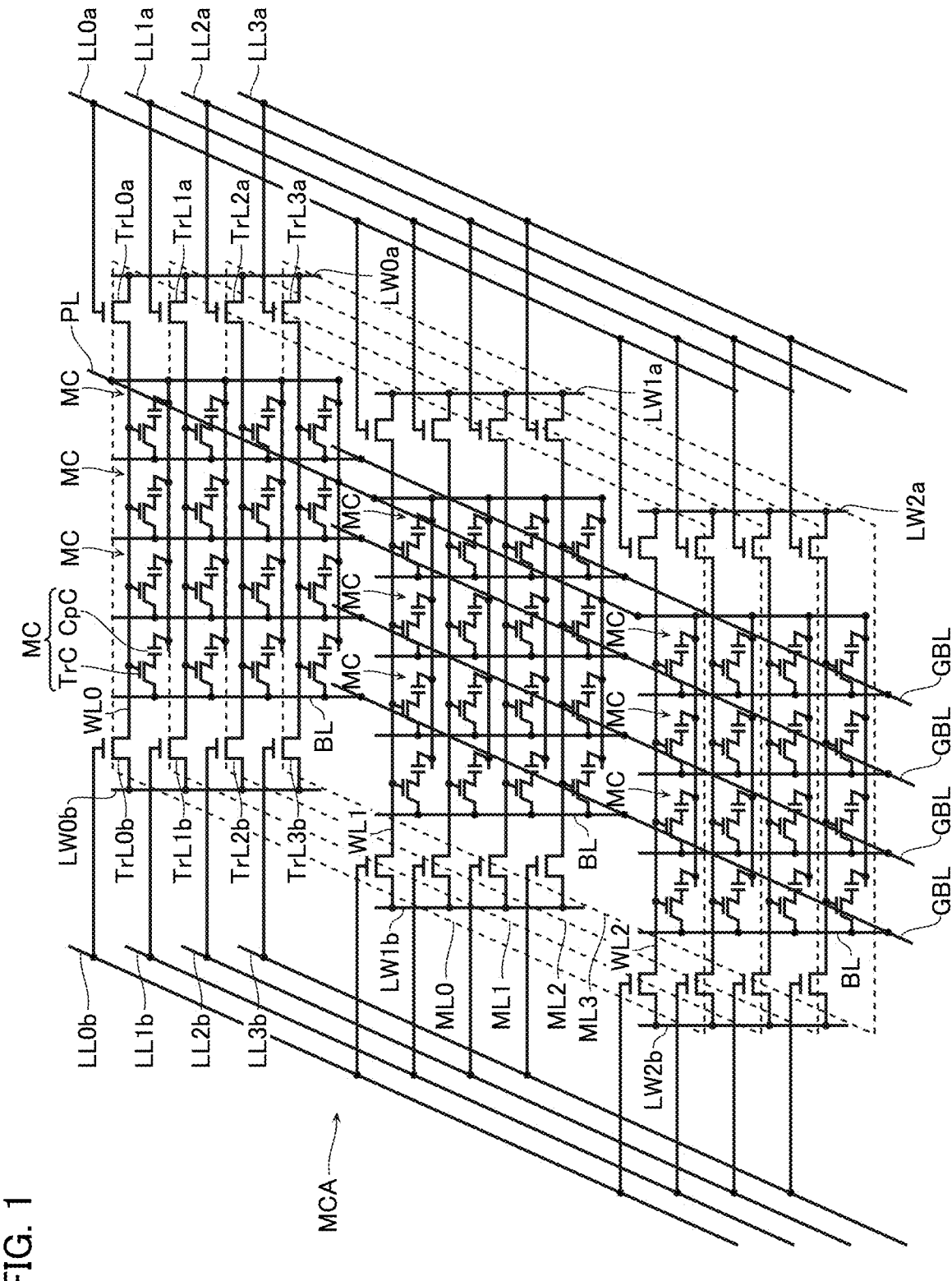
FIG. 1 is a schematic circuit diagram showing configurations of a semiconductor memory device according to a first embodiment.

A semiconductor memory device according to an embodiment comprises: a substrate; a plurality of memory layers arranged in a first direction intersecting a surface of the substrate; and a first via wiring and a second via wiring that extend in the first direction, and have different positions from each other in a second direction intersecting the first direction. The plurality of memory layers each comprise: a first transistor which is electrically connected to the first via wiring; a memory portion which is electrically connected to the first transistor; a first wiring which is electrically connected to the first transistor, and extends in the second direction; a second transistor which is electrically connected to the second via wiring, and is electrically connected to the first wiring; an electrode which is electrically connected to the second transistor, and is provided in a current path between the second transistor and the first wiring; and a second wiring which is electrically connected to the second transistor, and extends in a third direction intersecting the first direction and the second direction. The second transistor comprises: a first semiconductor layer which is electrically connected to the electrode and the second via wiring; a first gate electrode which is connected to the second wiring, and faces the first semiconductor layer; and a first gate insulating film which is provided between the first semiconductor layer and the first gate electrode. The first semiconductor layer faces at least one of surfaces on one side or the other side in the first direction of the first gate electrode. The electrode includes a portion arranged with the second via wiring in the third direction.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, parts of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even when the second transistor is in an OFF state.

Moreover, in the present specification, a certain direction parallel to an upper surface of a substrate will be referred to as an X-direction, a direction parallel to the upper surface of the substrate and perpendicular to the X-direction will be referred to as a Y-direction, and a direction perpendicular to the upper surface of the substrate will be referred to as a Z-direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may correspond to any of the X-direction, the Y-direction, and the Z-direction, but need not correspond to these directions.

Moreover, in the present specification, expressions such as "above" or "below" will be defined with reference to the substrate. For example, an orientation of moving away from the substrate along the above-described Z-direction will be referred to as above, and an orientation of coming closer to the substrate along the Z-direction will be referred to as below. Moreover, when a lower surface or a lower end is referred to for a certain configuration, this will be assumed to mean a surface or an end portion on a substrate side of this configuration, and when an upper surface or an upper end is referred to for a certain configuration, this will be assumed to mean a surface or an end portion on an opposite side to the substrate of this configuration. Moreover, a surface intersecting the X-direction or the Y-direction will be referred to as a side surface, and so on.

Moreover, in the present specification, when a "center position" of a certain configuration is referred to, it may mean a position of the center of a circumscribed circle of this configuration, or may mean the center of gravity on an image of this configuration, for example.

First Embodiment

[Circuit Configuration]

FIG. 1 is a schematic circuit diagram showing configurations of a semiconductor memory device according to a first embodiment. As shown in FIG. 1, the semiconductor memory device according to the present embodiment comprises a memory cell array MCA. The memory cell array MCA comprises: a plurality of memory layers ML0 to ML3; a plurality of bit lines BL connected to these plurality of memory layers ML0 to ML3; a plurality of global bit lines GBL electrically connected to the plurality of bit lines BL; and a plate line PL connected to the plurality of memory layers ML0 to ML3.

The memory layers ML0 to ML3 each comprise: a plurality of word lines WL0 to WL2 (hereafter, sometimes referred to as "word lines WL"); and pluralities of memory cells MC connected to these plurality of word lines WL0 to WL2. The memory cells MC each comprise a transistor TrC and a capacitor CpC. A source electrode of the transistor TrC is connected to the bit line BL. A drain electrode of the transistor TrC is connected to the capacitor CpC. A gate electrode of the transistor TrC is connected to any of the word lines WL0 to WL2. One electrode of the capacitor CpC is connected to the drain electrode of the transistor TrC. The other electrode of the capacitor CpC is connected to the plate line PL.

Note that each of the plurality of bit lines BL is connected to a plurality of the memory cells MC corresponding to the plurality of memory layers ML0 to ML3. Moreover, each of the plurality of bit lines BL is connected to the global bit line GBL.

In addition, the memory layers ML0 to ML3 respectively comprise pluralities of transistors TrL0a, TrL0b, TrL1a, TrL1b, TrL2a, TrL2b, TrL3a, TrL3b (hereafter, sometimes referred to as "transistors TrL") provided correspondingly to the plurality of word lines WL0 to WL2. Drain electrodes of the transistors TrL are each connected to any of the word lines WL0 to WL2. Source electrodes of the transistors TrL are respectively connected to word line select lines LW0a, LW0b, LW1a, LW1b, LW2a, LW2b (hereafter, sometimes referred to as "word line select lines LW"). Gate electrodes of the transistors TrL are respectively connected to layer select lines LL0a, LL0b, LL1a, LL1b, LL2a, LL2b, LL3a, LL3b (hereafter, sometimes referred to as "layer select lines LL").

Note that the word line select lines LW are connected to a plurality of the transistors TrL corresponding to the plurality of memory layers ML0 to ML3. Moreover, the layer select lines LL0a, LL1a, LL2a, LL3a are respectively commonly connected to all of the transistors TrL0a, TrL1a, TrL2a, TrL3a corresponding to the memory layers ML0 to ML3. Similarly, the layer select lines LL0b, LL1b, LL2b, LL3b are respectively commonly connected to all of the transistors TrL0b, TrL1b, TrL2b, TrL3b corresponding to the memory layers ML0 to ML3.

[Read Operation]

Figure 2:
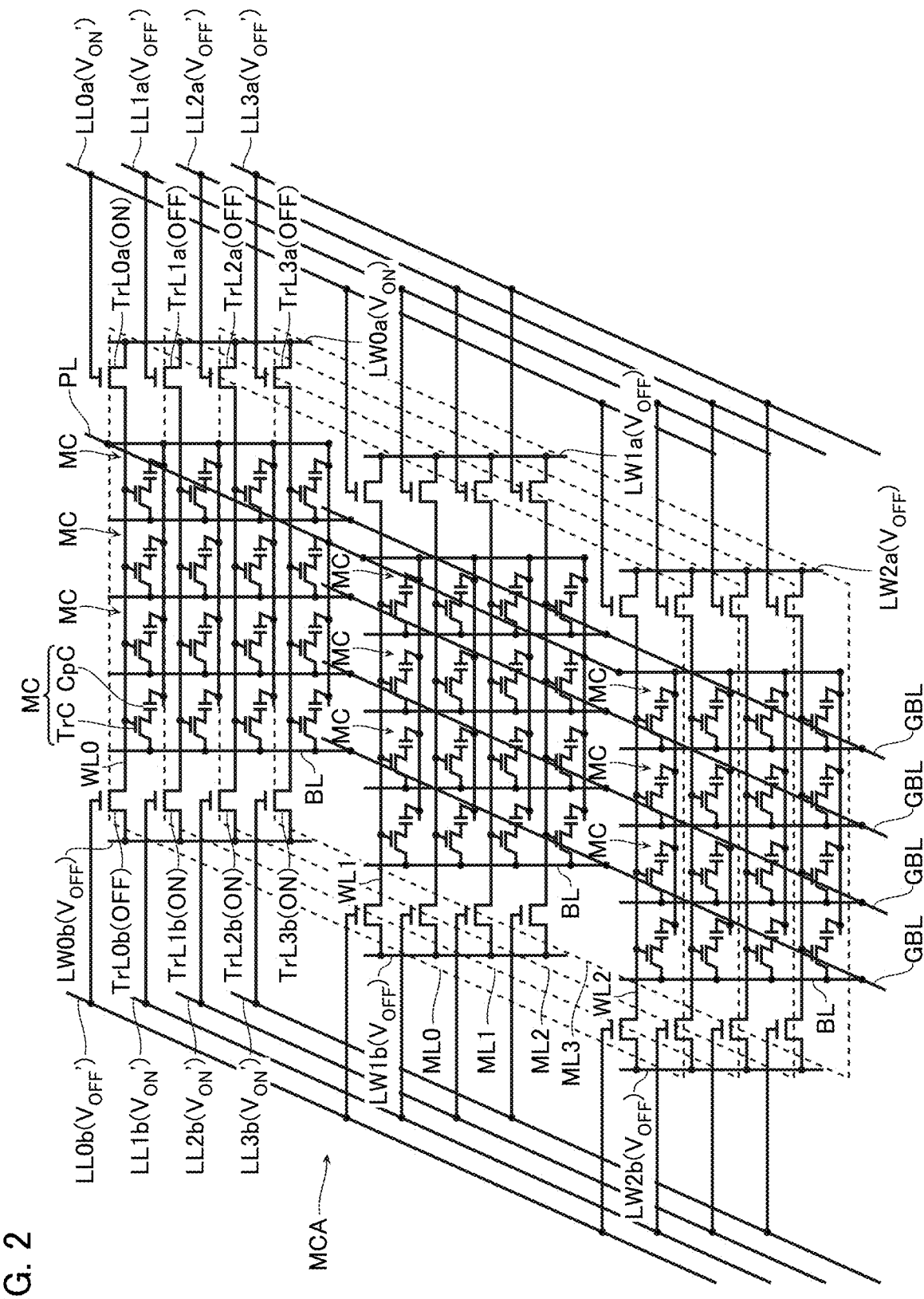
FIG. 2 is a schematic circuit diagram for explaining a read operation of the same semiconductor memory device.

FIG. 2 is a schematic circuit diagram for explaining a read operation of the semiconductor memory device according to the first embodiment.

During the read operation, one of the plurality of memory layers ML0 to ML3 is selected. In the example illustrated, the memory layer ML0 is selected. During selection of the memory layers ML0 to ML3, the layer select line LL0a corresponding to the memory layer ML0 that is a target of the read operation, of the plurality of layer select lines LL0a, LL1a, LL2a, LL3a is applied with a voltage $V_{ON}'$, and the other layer select lines LL1a, LL2a, LL3a are applied with a voltage $V_{OFF}'$, for example. Moreover, the layer select line LL0b corresponding to the memory layer ML0 that is a target of the read operation, of the plurality of layer select lines LL0b, LL1b, LL2b, LL3b is applied with the voltage $V_{OFF}'$, and the other layer select lines LL1b, LL2b, LL3b are applied with the voltage $V_{ON}'$, for example.

The voltage $V_{ON}'$ has a magnitude sufficient to set the transistors TrL to an ON state, for example. The voltage $V_{OFF}'$ has a magnitude sufficient to set the transistors TrL to an OFF state, for example. When the transistors TrL are NMOS transistors, for example, the voltage $V_{ON}'$ is larger than the voltage $V_{OFF}'$. Moreover, when the transistors TrL are PMOS transistors, for example, the voltage $V_{ON}'$ is smaller than the voltage $V_{OFF}'$. Note that hereafter, there will be described an example where the transistors TrL are NMOS transistors.

Moreover, during the read operation, one of the plurality of word lines WL0 to WL2 is selected. In the example illustrated, the word line WL0 is selected. During selection of the word lines WL0 to WL2, the word line select line LW0a corresponding to the word line WL0 that is a target of the read operation, of the plurality of word line select lines LW0a, LW1a, LW2a is applied with a voltage $V_{ON}$, and the other word line select lines LW1a, LW2a are applied with a voltage $V_{OFF}$, for example. Moreover, the plurality of word line select lines LW0b, LW1b, LW2b are applied with the voltage $V_{OFF}$, for example.

The voltage $V_{ON}$ has a magnitude sufficient to set the transistors TrC to an ON state, for example. The voltage $V_{OFF}$ has a magnitude sufficient to set the transistors TrC to an OFF state, for example. When the transistors TrC are NMOS transistors, for example, the voltage $V_{ON}$ is larger than the voltage $V_{OFF}$. Moreover, when the transistors TrC are PMOS transistors, for example, the voltage $V_{ON}$ is smaller than the voltage $V_{OFF}$. Note that hereafter, there will be described an example where the transistors TrC are NMOS transistors.

Now, the word line WL0 (hereafter, referred to as "selected word line WL0") connected to the memory cell MC (hereafter, referred to as "selected memory cell MC") that is a target of the read operation is applied with the voltage $V_{ON}$ via the transistor TrL0a. As a result, the transistor TrC in the selected memory cell MC attains an ON state. Accordingly, voltage of the global bit line GBL changes, or current flows in the global bit line GBL. By detecting this change in voltage or flow of current, it is possible for data stored in the selected memory cell MC to be read.

Moreover, the word lines WL1, WL2 (hereafter, referred to as "non-selected word lines WL1, WL2") other than the selected word line WL0, that correspond to the same memory layer ML0 as that of the selected memory cell MC are applied with the voltage $V_{OFF}$ via the transistors TrL0a. As a result, the transistors TrC in the memory cells MC connected to these non-selected word lines WL attain an OFF state.

Moreover, non-selected word lines WL0, WL1, WL2 that correspond to different memory layers ML1, ML2, ML3 from that of the selected memory cell MC are applied with the voltage $V_{OFF}$ via the transistors TrL1b, TrL2b, TrL3b. As a result, the transistors TrC in the memory cells MC connected to these non-selected word lines WL attain an OFF state.

Note that during the read operation, the word lines WL are each applied with voltages via the transistors TrL. The same applies to a write operation, too, although description of this will be omitted. Now, the larger a current of the transistors TrL becomes, the more a time required for charging and discharging of the word lines WL may be reduced, hence the faster it will be possible for the read operation and the write operation to be executed.

[Structure]

Figure 3:
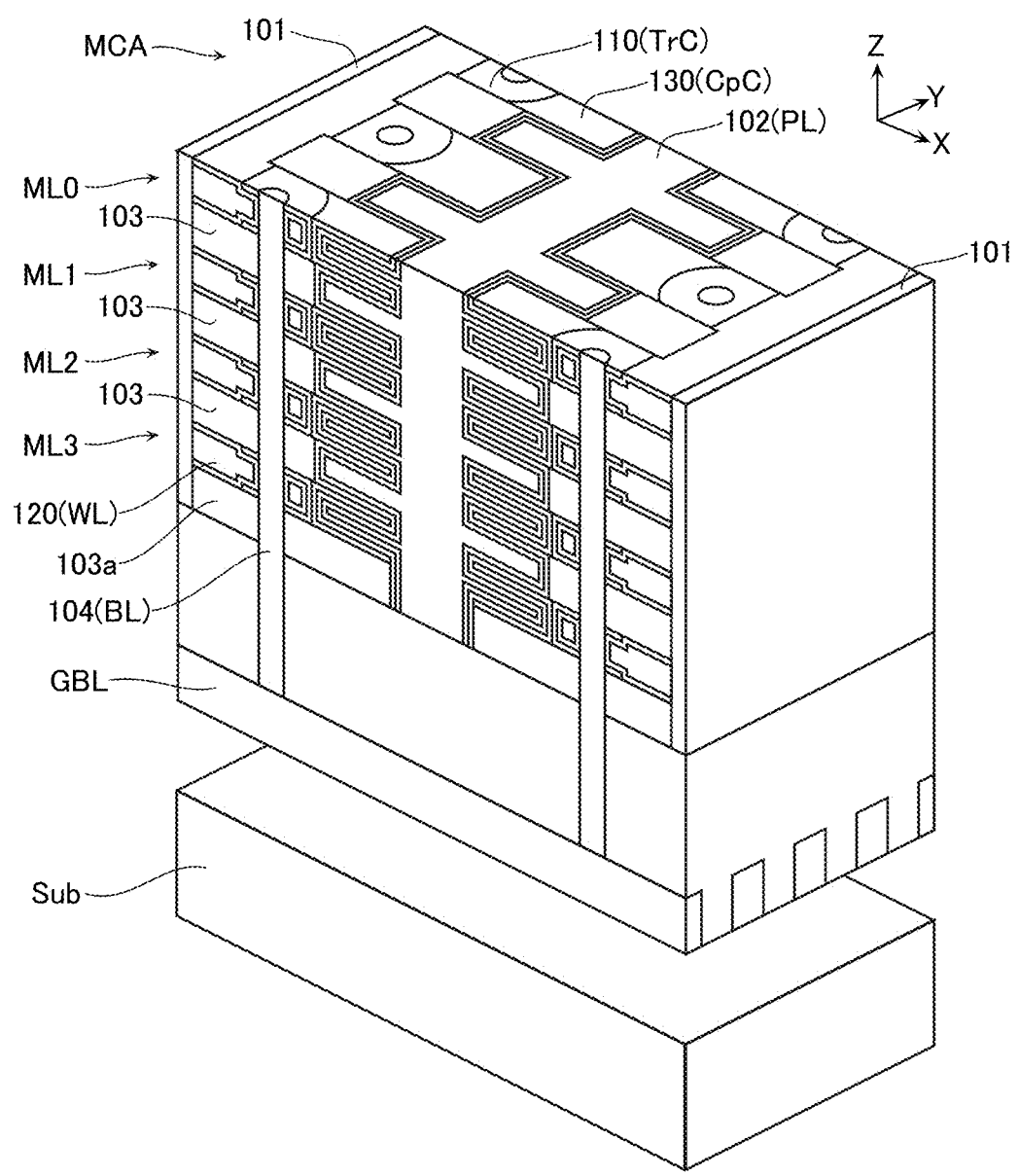
FIG. 3 is a schematic perspective view showing a part of a configuration of the same semiconductor memory device.
Figure 4:
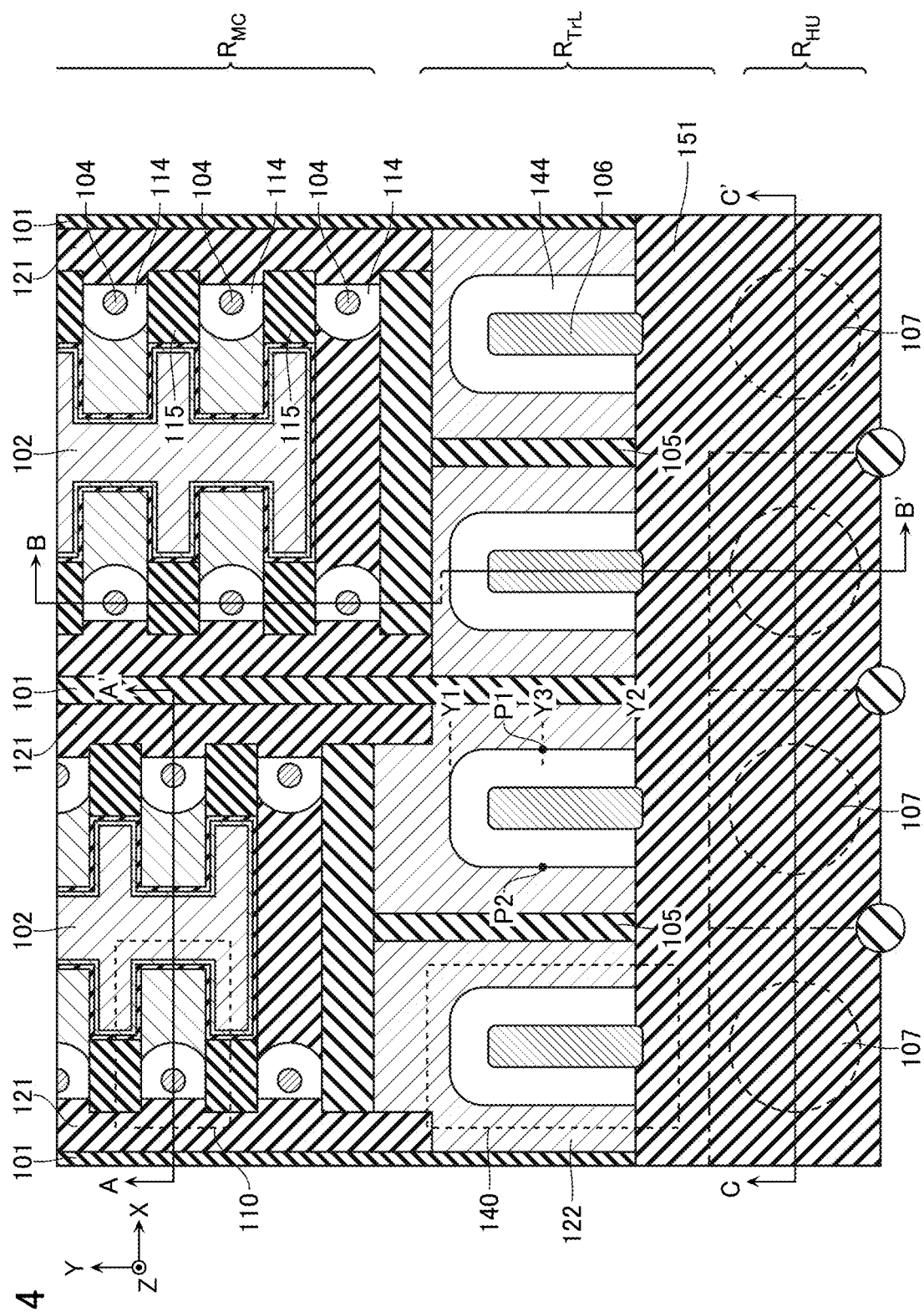
FIG. 4 is a schematic cross-sectional view showing a part of a configuration of the same semiconductor memory device.
Figure 5:
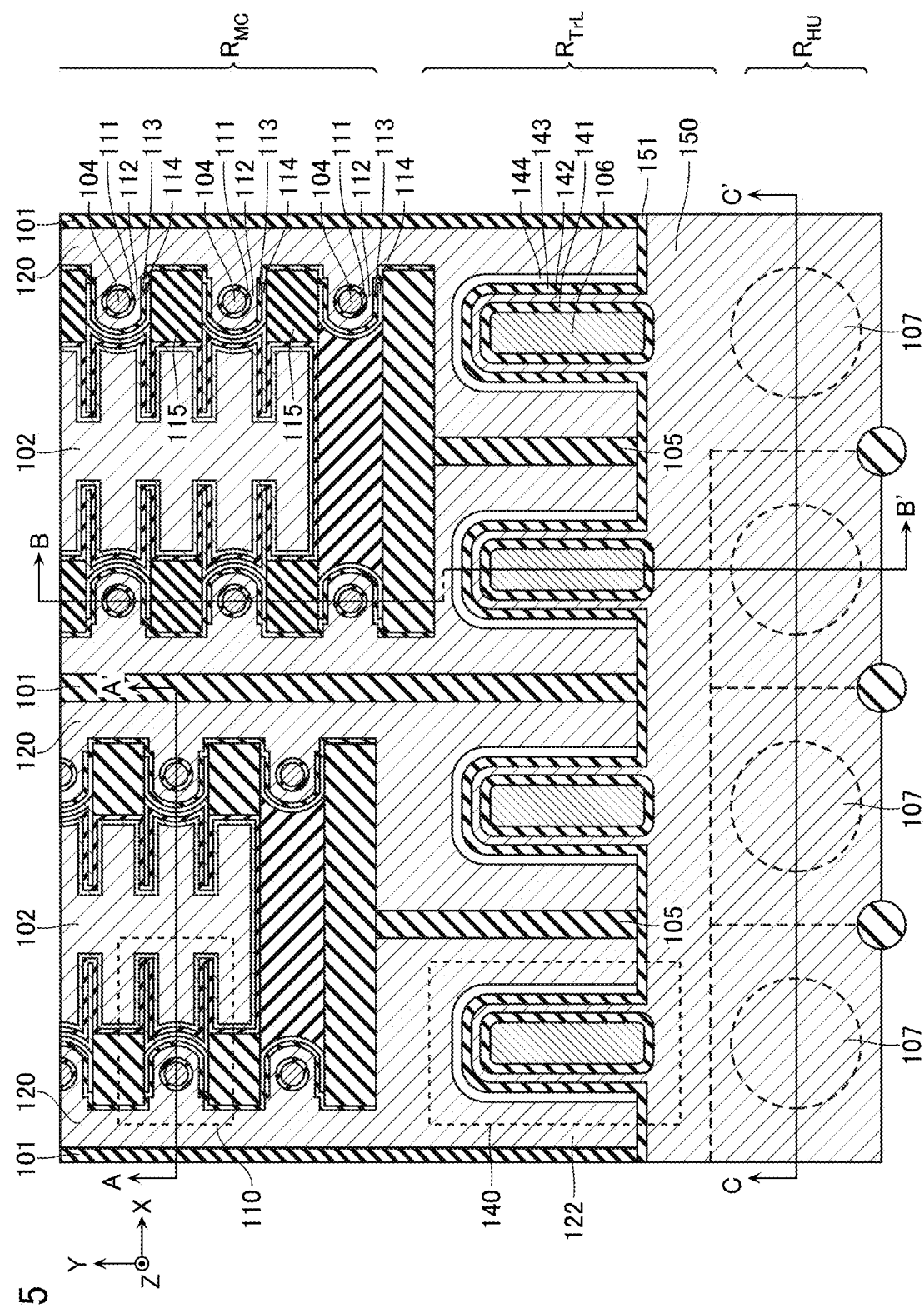
FIG. 5 is a schematic cross-sectional view showing a part of a configuration of the same semiconductor memory device.
Figure 6:
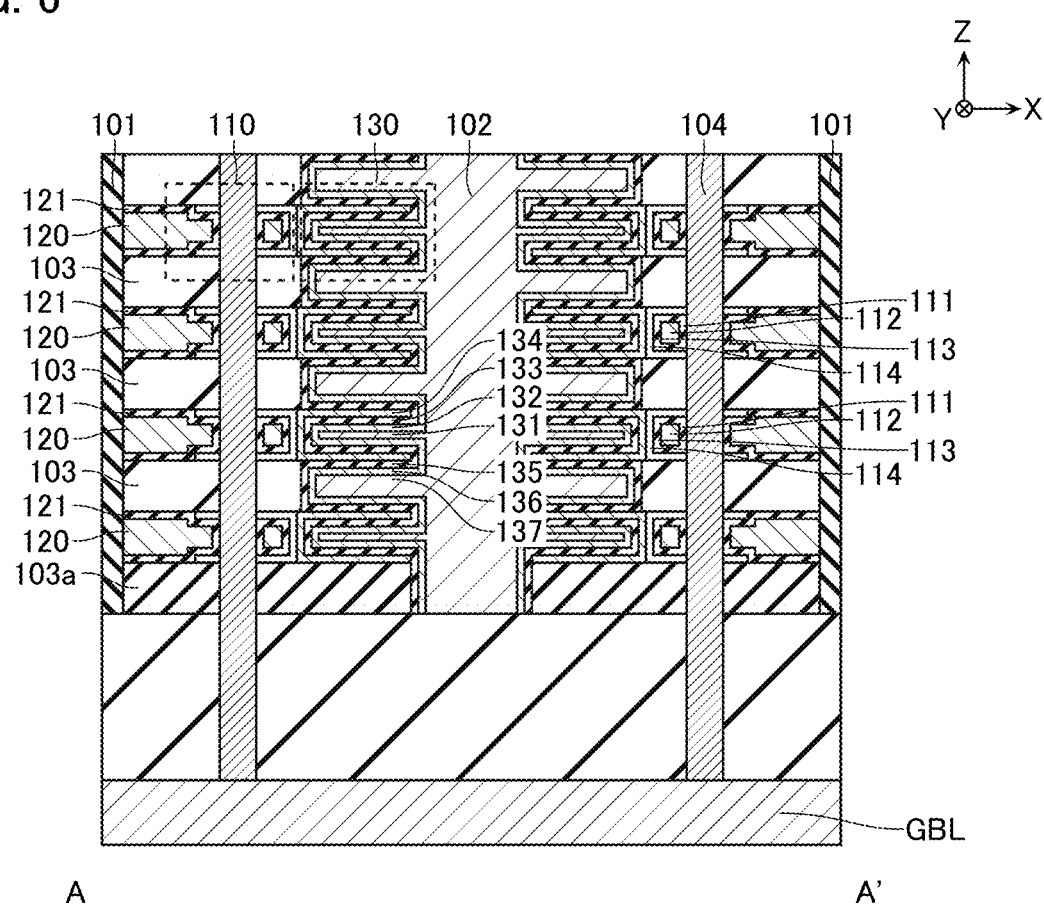
FIG. 6 is a schematic cross-sectional view showing a part of a configuration of the same semiconductor memory device.
Figure 7:
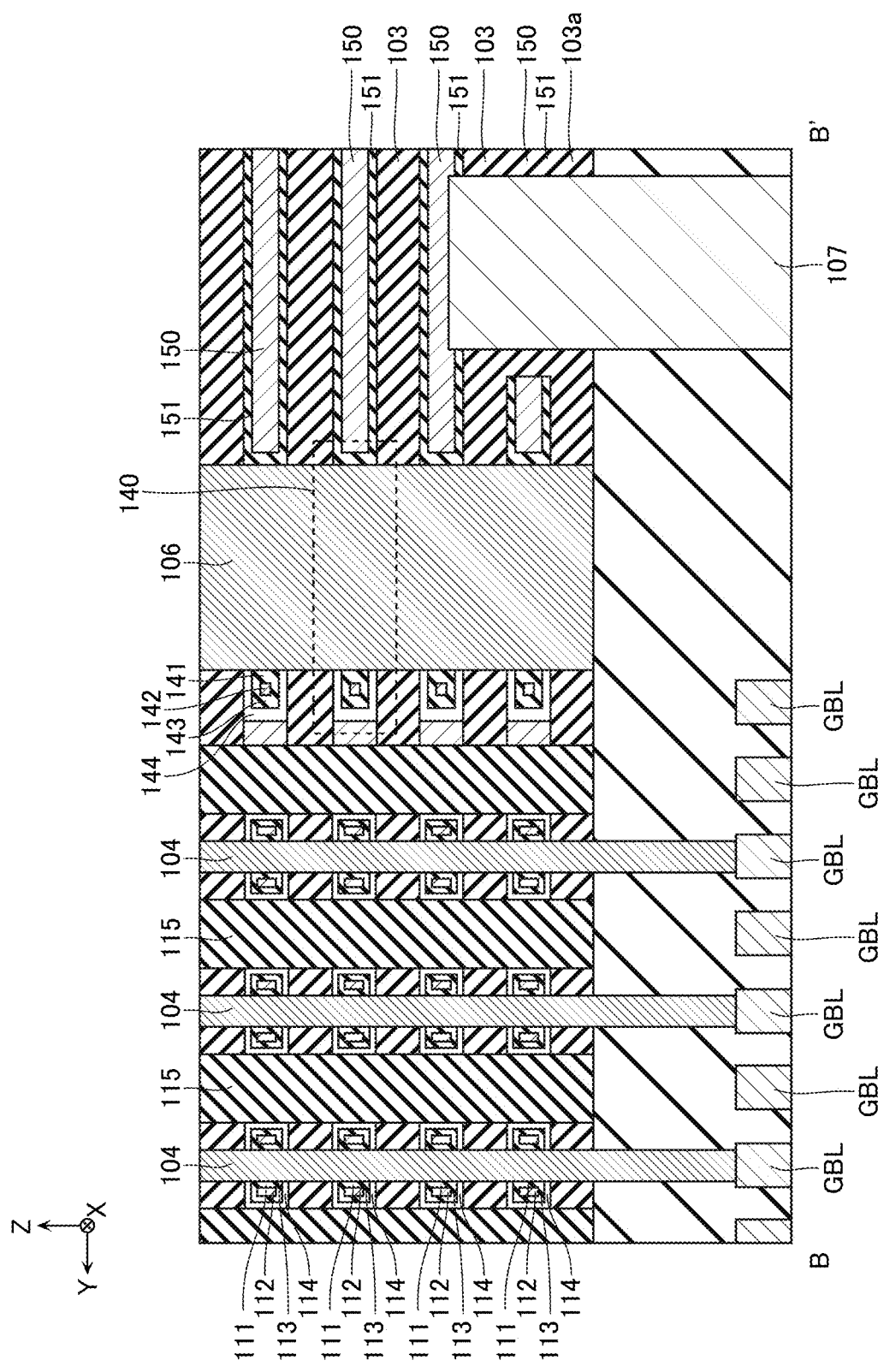
FIG. 7 is a schematic cross-sectional view showing a part of a configuration of the same semiconductor memory device.
Figure 8:
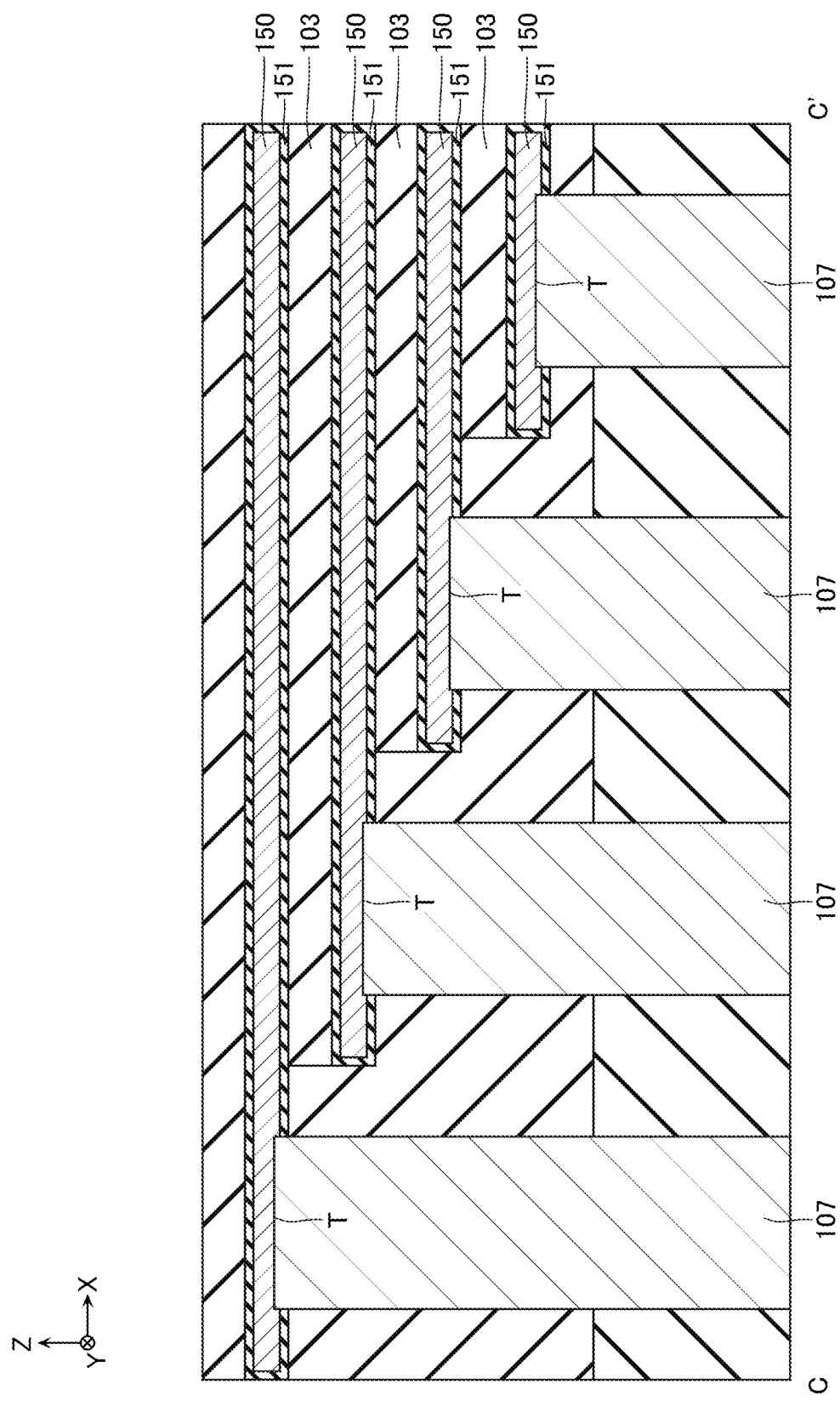
FIG. 8 is a schematic cross-sectional view showing a part of a configuration of the same semiconductor memory device.

FIG. 3 is a schematic perspective view showing a part of a configuration of the semiconductor memory device according to the first embodiment. FIGS. 4 and 5 are schematic XY cross-sectional views showing a part of a configuration of the same semiconductor memory device. Note that FIGS. 4 and 5 show XY cross sections at different height positions from each other. FIG. 6 is a schematic XZ cross-sectional view in which the configurations shown in FIGS. 4 and 5 have been cut along the line A-A' and viewed along a direction of the arrows. FIG. 7 is a schematic YZ cross-sectional view in which the configurations shown in FIGS. 4 and 5 have been cut along the line B-B' and viewed along a direction of the arrows. FIG. 8 is a schematic XZ cross-sectional view in which the configurations shown in FIGS. 4 and 5 have been cut along the line C-C' and viewed along a direction of the arrows.

FIG. 3 shows: a part of a semiconductor substrate Sub; and the memory cell array MCA which is provided above the semiconductor substrate Sub.

The semiconductor substrate Sub includes the likes of silicon (Si) containing P type impurities such as boron (B), for example. An unillustrated insulating layer and an unillustrated electrode layer are provided on an upper surface of the semiconductor substrate Sub. The upper surface of the semiconductor substrate Sub, the unillustrated insulating layer, and the electrode layer configure a control circuit for controlling the semiconductor memory device according to the first embodiment. For example, a region directly below the memory cell array MCA is provided with a sense amplifier circuit. The sense amplifier circuit is connected to the global bit line GBL. The sense amplifier circuit detects change in voltage or flow of current of the global bit line GBL in the read operation, and thereby enables data stored in the selected memory cell MC to be read in the read operation.

The memory cell array MCA comprises: the plurality of memory layers ML0 to ML3 which are arranged in the Z-direction; and the plurality of global bit lines GBL which are provided below these memory layers ML0 to ML3. Moreover, insulating layers 103 of the likes of silicon oxide ($SiO_2$) are respectively provided between the plurality of memory layers ML0 to ML3.

The memory layers ML0 to ML3 comprise a memory cell region $R_{MC}$, a transistor region $R_{TrL}$, and a hook-up region $R_{HU}$ that are arranged in the Y-direction, as shown in FIG. 4. Note that although FIG. 4 illustrates the transistor region $R_{TrL}$ and the hook-up region $R_{HU}$ that are provided on a negative side in the Y-direction with respect to the memory cell region $R_{MC}$, the transistor region $R_{TrL}$ and the hook-up region $R_{HU}$ are provided also on a positive side in the Y-direction with respect to the memory cell region $R_{MC}$.

The memory cell region $R_{MC}$ is provided with a plurality of insulating layers 101 and a plurality of conductive layers 102 arranged alternately in the X-direction. As shown in FIG. 3, the plurality of insulating layers 101 and the plurality of conductive layers 102 extend in the Y-direction and the Z-direction, and divide the memory layers ML0 to ML3 in the X-direction.

The insulating layer 101 includes the likes of silicon oxide ($SiO_2$), for example.

The conductive layer 102 includes the likes of a stacked structure of titanium nitride (TiN) and tungsten (W), for example. The conductive layer 102 functions as the plate line PL (FIG. 1), for example.

In addition, the memory cell region $R_{MC}$ is provided with a plurality of via wirings 104 that are provided between the insulating layer 101 and the conductive layer 102. The plurality of via wirings 104 are arranged in the Y-direction, and extend in the Z-direction penetrating the plurality of memory layers ML0 to ML3.

The via wiring 104 includes the likes of a stacked structure of indium tin oxide (ITO) or another conductive oxide, titanium nitride (TiN), and tungsten (W), for example. Note that the via wiring 104 may include ruthenium (Ru), iridium (Ir), or another metal, instead of the conductive oxide. Moreover, the via wiring 104 may include solely a conductive oxide, or may include solely ruthenium (Ru), iridium (Ir), or another metal. The via wiring 104 functions as the bit line BL (FIG. 1), for example. A plurality of the bit lines BL are provided correspondingly to the plurality of transistors TrC included in the memory layers ML0 to ML3.

Note that in the present specification, the conductive oxide is assumed to include indium tin oxide (ITO), indium zinc oxide (IZO), ruthenium oxide ($RuO_2$), iridium oxide ($IrO_2$), or another conductive material including oxygen, for example.

In the memory cell region $R_{MC}$, the memory layers ML0 to ML3 comprise: a plurality of transistor structures 110 provided correspondingly to the plurality of via wirings 104; a conductive layer 120 provided between the plurality of transistor structures 110 and the insulating layer 101; and a plurality of capacitor structures 130 provided between the plurality of transistor structures 110 and the conductive layer 102.

As shown in FIGS. 5 and 6, for example, the transistor structure 110 comprises: an insulating layer 111 provided on an outer peripheral surface of the via wiring 104; a conductive layer 112 provided on an outer peripheral surface of the insulating layer 111; an insulating layer 113 provided on an upper surface, a lower surface, and an outer peripheral surface of the conductive layer 112; and a semiconductor layer 114 provided on an upper surface, a lower surface, both side surfaces in the Y-direction, and a side surface on one side (a conductive layer 102 side) in the X-direction of the insulating layer 113.

In an XY cross section of the kind exemplified in FIG. 5, the outer peripheral surface of the insulating layer 111 may be formed along a circle centered on a center position of the via wiring 104, for example. Moreover, side surfaces on one side (the conductive layer 102 side) in the X-direction of the conductive layer 112, the insulating layer 113, and the semiconductor layer 114 may be formed along circles centered on the center position of the via wiring 104. Moreover, both side surfaces in the Y-direction of the conductive layer 112, the insulating layer 113, and the semiconductor layer 114 may be formed linearly along a side surface of an insulating layer 115.

The insulating layer 111 includes the likes of silicon oxide ($SiO_2$), for example. The insulating layer 111 surrounds the outer peripheral surface of the via wiring 104 over its entire periphery.

The conductive layer 112 functions as the gate electrode of the transistor TrC (FIG. 1), for example. The conductive layer 112 includes the likes of a stacked structure of titanium nitride (TiN) and tungsten (W), for example. The conductive layer 112 surrounds the outer peripheral surface of the insulating layer 111 over its entire periphery. As shown in FIG. 5, a plurality of the conductive layers 112 arranged in the Y-direction are commonly connected to the conductive layer 120 extending in the Y-direction.

The insulating layer 113 functions as a gate insulating film of the transistor TrC (FIG. 1), for example. The insulating layer 113 includes the likes of silicon oxide ($SiO_2$), for example. The insulating layer 113 covers both side surfaces in the Y-direction and a side surface on one side (the conductive layer 102 side) in the X-direction of the conductive layer 112.

The semiconductor layer 114 functions as a channel region of the transistor TrC (FIG. 1), for example. The semiconductor layer 114 may be, for example, a semiconductor including: at least one element of gallium (Ga) and aluminum (Al); indium (In); zinc (Zn); and oxygen (O), or may be, for example, another oxide semiconductor. The semiconductor layer 114 covers both side surfaces in the Y-direction and a side surface on one side (the conductive layer 102 side) in the X-direction of the conductive layer 112, via the insulating layer 113. As shown in FIG. 6, a plurality of the semiconductor layers 114 arranged in the Z-direction are commonly connected to the via wiring 104 extending in the Z-direction.

As shown in FIG. 4, the insulating layer 115 of the likes of silicon oxide ($SiO_2$) is provided between two semiconductor layers 114 adjacent in the Y-direction. The insulating layer 115 extends in the Z-direction penetrating the plurality of memory layers ML0 to ML3.

The conductive layer 120 functions as the word line WL (FIG. 1), for example. The conductive layer 120 extends in the Y-direction, and is connected to a plurality of the conductive layers 112 arranged in the Y-direction, as shown in FIG. 5, for example. The conductive layer 120 comprises the likes of a stacked structure of titanium nitride (TiN) and tungsten (W), for example. Note that the conductive layer 120 may include the likes of a stacked structure of indium tin oxide (ITO) or another conductive oxide, titanium nitride (TiN), and tungsten (W). Moreover, the conductive layer 120 may include ruthenium (Ru), iridium (Ir), or another metal, instead of the conductive oxide. Moreover, the conductive layer 120 may include solely a conductive oxide, or may include solely ruthenium (Ru), iridium (Ir), or another metal. As shown in FIG. 6, an upper surface and a lower surface of the conductive layer 120 are covered by an insulating layer 121 of the likes of silicon oxide ($SiO_2$). The insulating layer 121 is connected to the insulating layer 111 and the insulating layer 113.

As shown in FIGS. 5 and 6, for example, the capacitor structure 130 comprises: a conductive layer 131; a conductive layer 132 provided on an upper surface, a lower surface, both side surfaces in the Y-direction, and a side surface on one side (a transistor structure 110 side) in the X-direction of the conductive layer 131; an insulating layer 133 provided on an upper surface, a lower surface, both side surfaces in the Y-direction, and a side surface on one side (the transistor structure 110 side) in the X-direction of the conductive layer 132; a conductive layer 134 provided on an upper surface, a lower surface, both side surfaces in the Y-direction, and a side surface on one side (the transistor structure 110 side) in the X-direction of the insulating layer 133; an insulating layer 135 provided on an upper surface, a lower surface, and both side surfaces in the Y-direction of the conductive layer 134; a conductive layer 136 provided on an upper surface, a lower surface, and both side surfaces in the Y-direction of the insulating layer 135; and a conductive layer 137 provided on an upper surface, a lower surface, and both side surfaces in the Y-direction of the conductive layer 136.

The conductive layers 131, 132, 136, 137 function as one electrode of the capacitor CpC (FIG. 1). The conductive layers 131, 137 include the likes of tungsten (W), for example. The conductive layers 132, 136 include the likes of titanium nitride (TiN), for example. The conductive layers 131, 132, 136, 137 are connected to the conductive layer 102.

The insulating layers 133, 135 function as an insulating layer of the capacitor CpC (FIG. 1). The insulating layers 133, 135 may be alumina ($Al_2O_3$) or another insulating metal oxide, for example.

The conductive layer 134 functions as the other electrode of the capacitor CpC (FIG. 1), for example. The conductive layer 134 includes the likes of indium tin oxide (ITO), for example. The conductive layer 134 is insulated from the conductive layers 131, 132, 136, 137 via the insulating layers 133, 135. The conductive layer 134 is connected to a side surface in the X-direction of the semiconductor layer 114.

As shown in FIG. 5, for example, the transistor region $R_{TrL}$ is provided with parts of the above-mentioned plurality of insulating layers 101. Moreover, the transistor region $R_{TrL}$ is provided with a plurality of insulating layers 105 arranged alternately with these plurality of insulating layers 101 in the X-direction. The plurality of insulating layers 101 and the plurality of insulating layers 105 extend in the Y-direction and the Z-direction, and divide the memory layers ML0 to ML3 in the X-direction.

The insulating layer 105 includes the likes of silicon oxide ($SiO_2$), for example.

Moreover, in the transistor region $R_{TrL}$, via wirings 106 are provided one each to each of regions separated by the insulating layers 101 and the insulating layers 105. The plurality of via wirings 106 are arranged in the X-direction, and extend in the Z-direction penetrating the plurality of memory layers ML0 to ML3 (refer to FIG. 7).

The via wiring 106 includes the likes of a stacked structure of indium tin oxide (ITO) or another conductive oxide, titanium nitride (TiN), and tungsten (W), for example. Note that the via wiring 106 may include ruthenium (Ru), iridium (Ir), or another metal, instead of the conductive oxide. Moreover, the via wiring 106 may include solely a conductive oxide, or may include solely ruthenium (Ru), iridium (Ir), or another metal. The via wiring 106 functions as the word line select line LW (FIG. 1), for example. A plurality of the word line select lines LW are provided correspondingly to the plurality of transistors TrL included in the memory layers ML0 to ML3. As shown in FIG. 5, a length in the Y-direction of the via wiring 106 is larger than a length in the X-direction of the via wiring 106. In the example illustrated, an end portion on a negative side in the Y-direction of the via wiring 106 is disposed more to a negative side in the Y-direction than an end portion on a negative side in the Y-direction of a later-mentioned semiconductor layer 144.

In the transistor region $R_{TrL}$, as shown in FIG. 5, for example, the memory layers ML0 to ML3 comprise: a conductive layer 122 connected to an end portion in the Y-direction of the conductive layer 120; a plurality of transistor structures 140 provided correspondingly to the plurality of via wirings 106; and a conductive layer 150 extending in the X-direction along the plurality of transistor structures 140.

The conductive layer 122 includes the likes of a stacked structure of indium tin oxide (ITO) or another conductive oxide, titanium nitride (TiN), and tungsten (W), for example. Note that the conductive layer 122 may include ruthenium (Ru), iridium (Ir), or another metal, instead of the conductive oxide. Moreover, the conductive layer 122 may include solely a conductive oxide, or may include solely ruthenium (Ru), iridium (Ir), or another metal. The conductive layer 122 functions as the drain electrode of the transistor TrL (FIG. 1), for example. In the example illustrated, the conductive layer 122 includes a portion provided on a positive side in the X-direction of the transistor structure 140 and a portion provided on a negative side in the X-direction of the transistor structure 140. Moreover, these portions are each arranged in the X-direction with the via wiring 106 and the transistor structure 140. A side surface on one side in the X-direction of the conductive layer 122 is connected to a side surface in the X-direction of the insulating layer 101, and extends in the Y-direction along this side surface. A side surface on the other side in the X-direction of the conductive layer 122 is connected to a side surface in the X-direction of the insulating layer 105, and extends in the Y-direction along this side surface. A length in the X-direction of the conductive layer 122 is larger than a length in the X-direction of the conductive layer 120. A part of a side surface on one side in the Y-direction of the conductive layer 122 is connected to the conductive layer 120. A side surface on the other side in the Y-direction of the conductive layer 122 is connected to a later-mentioned insulating layer 151, and extends in the X-direction along the insulating layer 151. In the example illustrated, an end portion on a negative side in the Y-direction of the conductive layer 122 reaches a position in the Y-direction, of the end portion on a negative side in the Y-direction of the later-mentioned semiconductor layer 144.

As shown in FIGS. 5 and 7, for example, the transistor structure 140 comprises: an insulating layer 141 provided on both side surfaces in the X-direction and both side surfaces in the Y-direction of the via wiring 106; a conductive layer 142 provided on both side surfaces in the X-direction and a side surface on one side (a memory cell region $R_{MC}$ side) in the Y-direction of the insulating layer 141; an insulating layer 143 provided on an upper surface, a lower surface, both side surfaces in the X-direction, and a side surface on one side (the memory cell region $R_{MC}$ side) in the Y-direction of the conductive layer 142; and the semiconductor layer 144 provided on an upper surface, a lower surface, both side surfaces in the X-direction, and a side surface on one side (the memory cell region $R_{MC}$ side) in the Y-direction of the insulating layer 143.

In the XY cross section of the kind exemplified in FIG. 5, the insulating layer 141 is formed with a constant thickness along both side surfaces in the X-direction and both side surfaces in the Y-direction of the via wiring 106. The conductive layer 142, the insulating layer 143, and the semiconductor layer 144 are formed with constant thicknesses along both side surfaces in the X-direction and a side surface on a positive side in the Y-direction of the via wiring 106, in a range more to a positive side in the Y-direction than a position in the Y-direction corresponding to the end portion on a negative side in the Y-direction of the conductive layer 122. The conductive layer 122 is connected to both side surfaces in the X-direction and a side surface on a positive side in the Y-direction, of the semiconductor layer 144. In the example illustrated, lengths in the Y-direction of the insulating layer 141, the conductive layer 142, the insulating layer 143, and the semiconductor layer 144 are respectively larger than lengths in the X-direction of the insulating layer 141, the conductive layer 142, the insulating layer 143, and the semiconductor layer 144.

Moreover, in an XY cross section of the kind exemplified in FIG. 4, the semiconductor layer 144 is formed with a constant thickness along both side surfaces in the X-direction and a side surface on a positive side in the Y-direction of the via wiring 106, in a range more to a positive side in the Y-direction than a position in the Y-direction corresponding to the end portion on a negative side in the Y-direction of the conductive layer 122. Moreover, the semiconductor layer 144 is connected to both side surfaces in the X-direction and a side surface on a positive side in the Y-direction of the via wiring 106. In the XY cross section exemplified in FIG. 4, too, the conductive layer 122 is connected to both side surfaces in the X-direction and a side surface on a positive side in the Y-direction, of the semiconductor layer 144.

Note that in FIG. 4, a position in the Y-direction of an end portion on a positive side in the Y-direction of the semiconductor layer 144 is indicated as a position Y1. Moreover, a position in the Y-direction of an end portion on a negative side in the Y-direction of the semiconductor layer 144 is indicated as a position Y2. Moreover, a center position of the position Y1 and the position Y2 (a position in the Y-direction provided between the position Y1 and the position Y2, and equidistant from the position Y1 and the position Y2) is indicated as a position Y3. Moreover, portions provided at the position Y3, of side surfaces on a positive side and a negative side in the X-direction, of the semiconductor layer 144 are respectively indicated as positions P1, P2. In the example of FIG. 4, the semiconductor layer 144 is connected to the conductive layer 122 at the positions P1, P2. In the example illustrated, an end portion on a negative side in the Y-direction of a connecting surface between the conductive layer 122 and the semiconductor layer 144 reaches the position Y2.

The insulating layer 141 includes the likes of silicon oxide ($SiO_2$), for example. The insulating layer 141 surrounds an outer peripheral surface of the via wiring 106 over its entire periphery.

The conductive layer 142 functions as the gate electrode of the transistor TrL (FIG. 1), for example. The conductive layer 142 includes the likes of a stacked structure of titanium nitride (TiN) and tungsten (W), for example. The conductive layer 142, together with the conductive layer 150, surrounds an outer peripheral surface of the insulating layer 141 over its entire periphery. As shown in FIG. 5, a plurality of the conductive layers 142 arranged in the X-direction are commonly connected to the conductive layer 150 extending in the X-direction.

The insulating layer 143 functions as a gate insulating film of the transistor TrL (FIG. 1), for example. The insulating layer 143 includes the likes of silicon oxide ($SiO_2$), for example. The insulating layer 143 covers both side surfaces in the X-direction and a side surface on one side (the memory cell region $R_{MC}$ side) in the Y-direction of the conductive layer 142.

The semiconductor layer 144 functions as a channel region of the transistor TrL (FIG. 1), for example. The semiconductor layer 144 may be, for example, a semiconductor including: at least one element of gallium (Ga) and aluminum (Al); indium (In); zinc (Zn); and oxygen (O), or may be, for example, another oxide semiconductor. The semiconductor layer 144 covers both side surfaces in the X-direction and a side surface on one side (the memory cell region $R_{MC}$ side) in the Y-direction of the conductive layer 142, via the insulating layer 143. As shown in FIG. 7, a plurality of the semiconductor layers 144 arranged in the Z-direction are commonly connected to the via wiring 106 extending in the Z-direction. As shown in FIG. 4, the insulating layer 105 is provided between two semiconductor layers 144 adjacent in the X-direction. Note that the semiconductor layer 144 is connected to an end portion in the Y-direction of the conductive layer 120, via the conductive layer 122. A length in the Y-direction of the semiconductor layer 144 is larger than a length in the X-direction of the semiconductor layer 144.

The conductive layer 150 functions as the layer select line LL (FIG. 1), for example. As shown in FIG. 5, for example, the conductive layer 150 extends in the X-direction, and is connected to a plurality of the conductive layers 142 arranged in the X-direction. The conductive layer 150 comprises the likes of a stacked structure of titanium nitride (TiN) and tungsten (W), for example. Note that, as shown in FIG. 7, an upper surface and a lower surface of the conductive layer 150 are covered by the insulating layer 151 (FIG. 7) of the likes of silicon oxide ($SiO_2$). The insulating layer 151 is connected to the insulating layer 141 and the insulating layer 143.

The hook-up region $R_{HU}$ comprises a plurality of terrace portions T corresponding to a plurality of the conductive layers 150, as shown in FIG. 8. The terrace portion T is a region of a lower surface of the conductive layer 150 that, viewing from below, does not overlap another conductive layer 150. The plurality of conductive layers 150 are each provided with at least one terrace portion T.

Moreover, the hook-up region $R_{HU}$ is provided with a plurality of contact electrodes 107 arranged in the X-direction. As shown in FIG. 8, the contact electrode 107 extends in the Z-direction and has an upper end connected to the terrace portion T of the conductive layer 150. Moreover, the plurality of contact electrodes 107 arranged in the X-direction are respectively connected to the conductive layers 150 provided at different height positions from each other. The contact electrode 107 includes the likes of a stacked structure of titanium nitride (TiN) and tungsten (W), for example.

Moreover, as shown in FIG. 3, the plurality of global bit lines GBL are provided below the memory layers ML0 to ML3. The global bit lines GBL extend in the X-direction and are arranged in the Y-direction. The global bit line GBL includes the likes of a stacked structure of titanium nitride (TiN) and tungsten (W), for example. The global bit lines GBL are respectively connected to lower ends of pluralities of the via wirings 104 arranged in the X-direction.

Moreover, an insulating layer 103a is provided between the memory layers ML0 to ML3 and the global bit line GBL. The insulating layer 103a may include a material different from that of the other insulating layers 103, for example.

[Method of Manufacturing]

Figure 9:
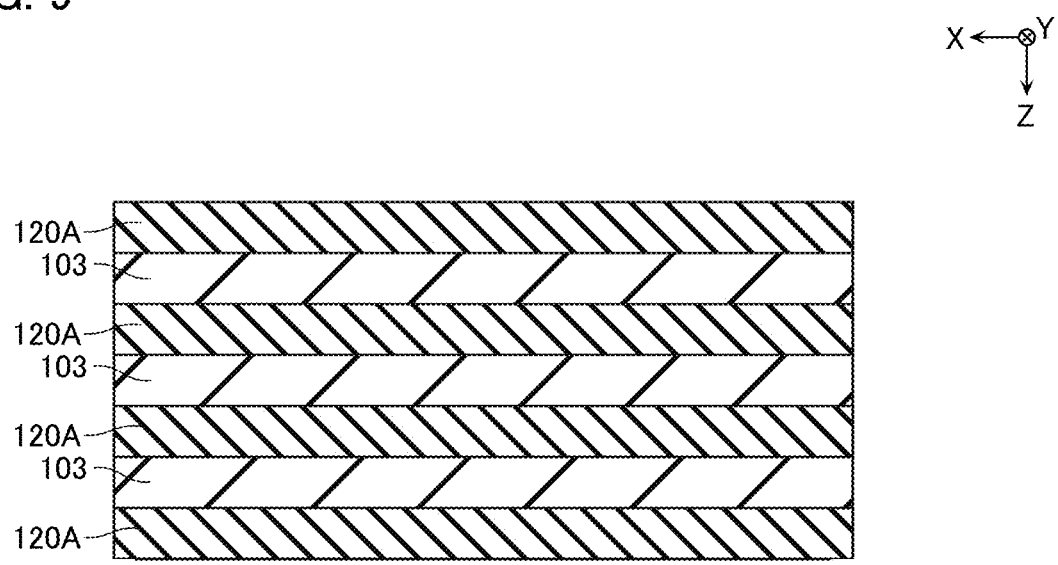
FIG. 9 is a schematic cross-sectional view for explaining a method of manufacturing the same semiconductor memory device.
Figure 68:
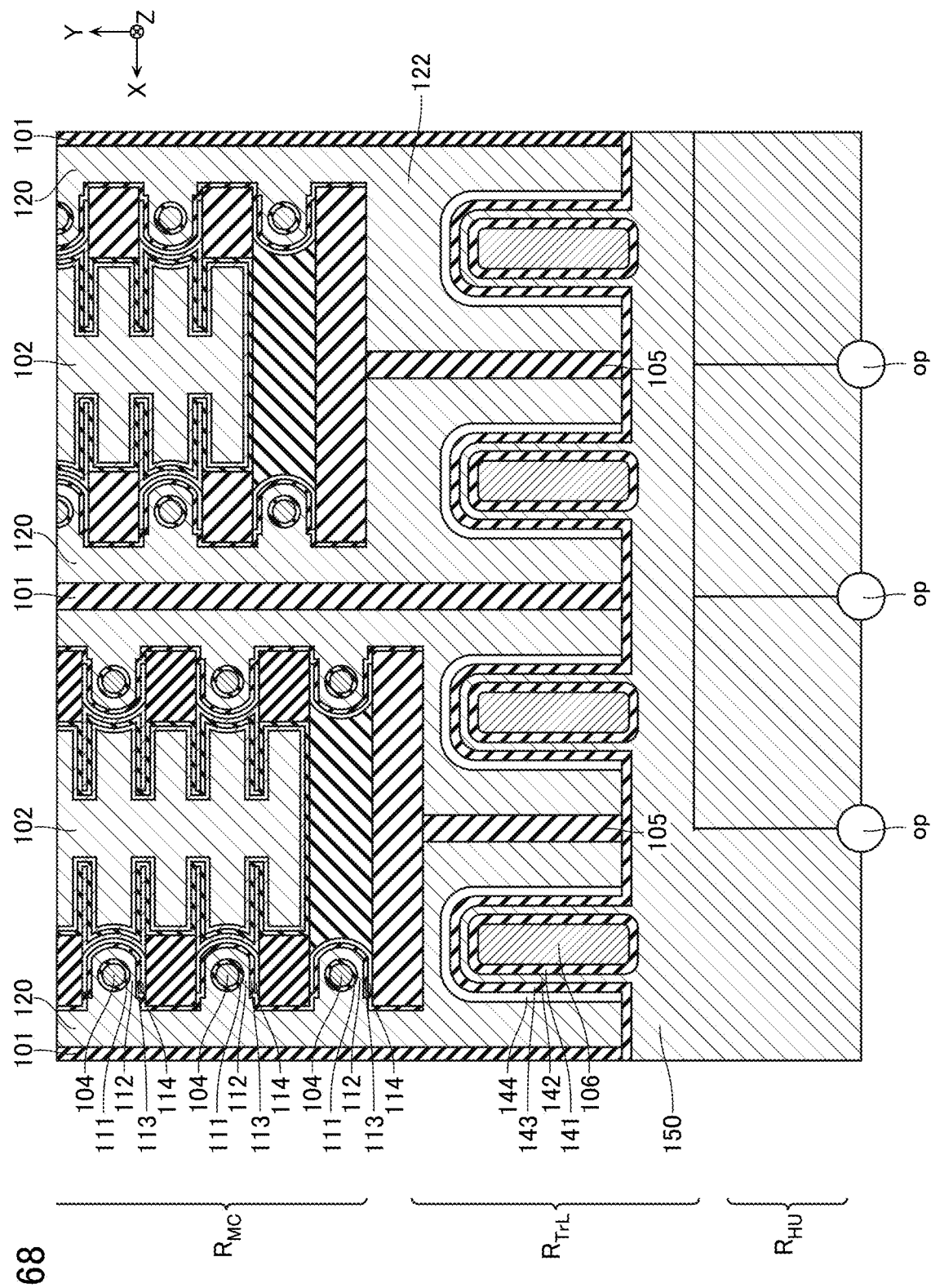
FIG. 68 is a schematic cross-sectional view for explaining the same method of manufacturing.
Figure 69:
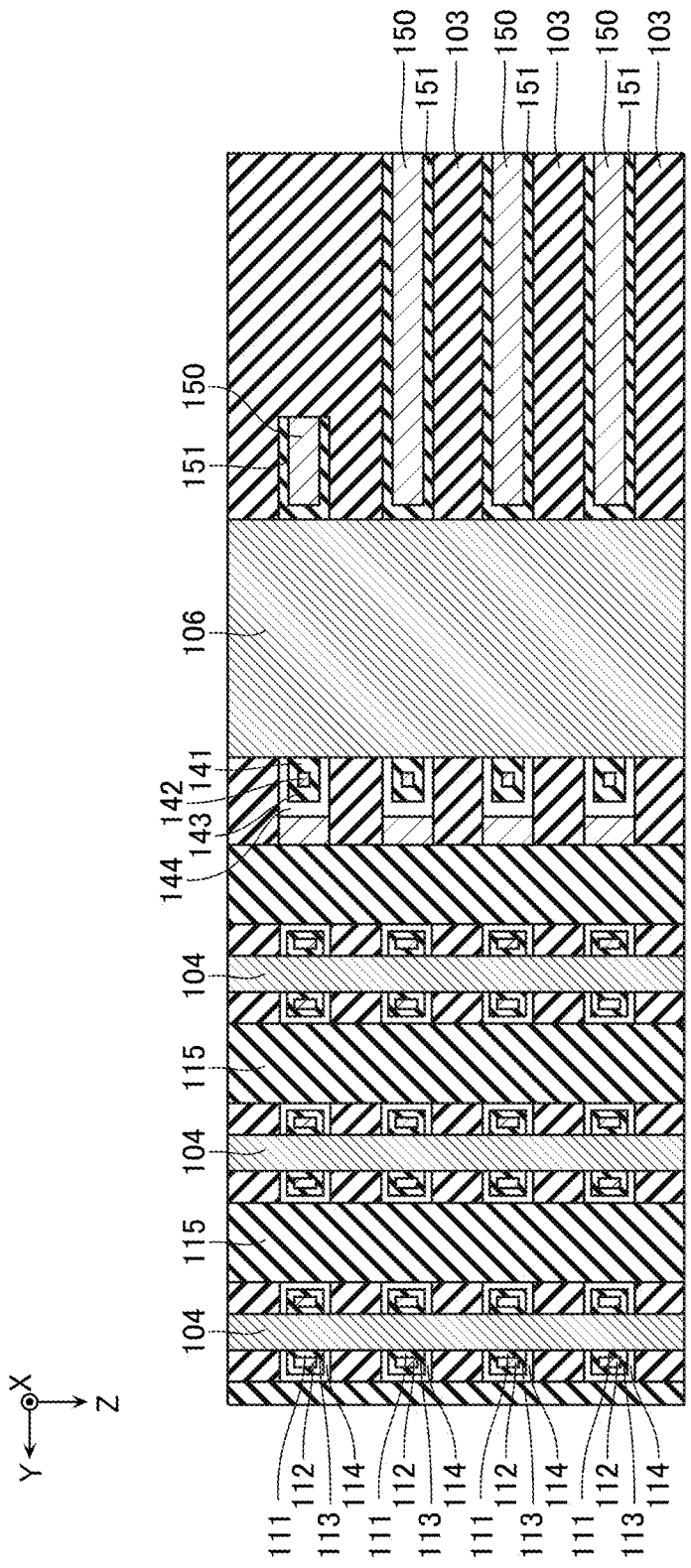
FIG. 69 is a schematic cross-sectional view for explaining the same method of manufacturing.

FIGS. 9 to 69 are schematic cross-sectional views for explaining a method of manufacturing the semiconductor memory device according to the first embodiment. FIGS. 10, 12, 14, 16, 19, 21, 23, 25, 27, 29, 34, 36, 38, 40, 42, 44, 45, 47, 49, 51, 53, 55, 57, 59, 60, 62 to 64, 66, and 68 show cross sections corresponding to FIG. 5. FIGS. 9, 15, 17, 18, 20, 22, 24, 26, 28, 30 to 33, 35, 37, 39, 41, and 43 show cross sections corresponding to FIG. 6. FIGS. 11, 13, 46, 48, 50, 52, 54, 56, 58, 61, 65, 67, and 69 show cross sections corresponding to FIG. 7.

Note that the semiconductor memory device according to the first embodiment is formed by having a memory cell array MCA and a peripheral circuit which is connected to the memory cell array MCA, manufactured on separate wafers, and by having these wafers bonded. In this connection, a vertical relationship of configurations in the memory cell array MCA is sometimes reversed between the case where the semiconductor substrate Sub shown in FIG. 3 is taken as reference, and the case where the wafer having the memory cell array MCA formed therein is taken as reference. In FIGS. 9 to 69, the X-direction, the Y-direction, and the Z-direction are illustrated matching the configurations in the memory cell array MCA.

In the same method of manufacturing, as shown in FIG. 9, for example, the plurality of insulating layers 103 and a plurality of sacrifice layers 120A are alternately formed. The sacrifice layer 120A includes the likes of silicon nitride ($Si_3N_4$), for example. This step is performed by the likes of CVD (Chemical Vapor Deposition), for example.

Figure 10:
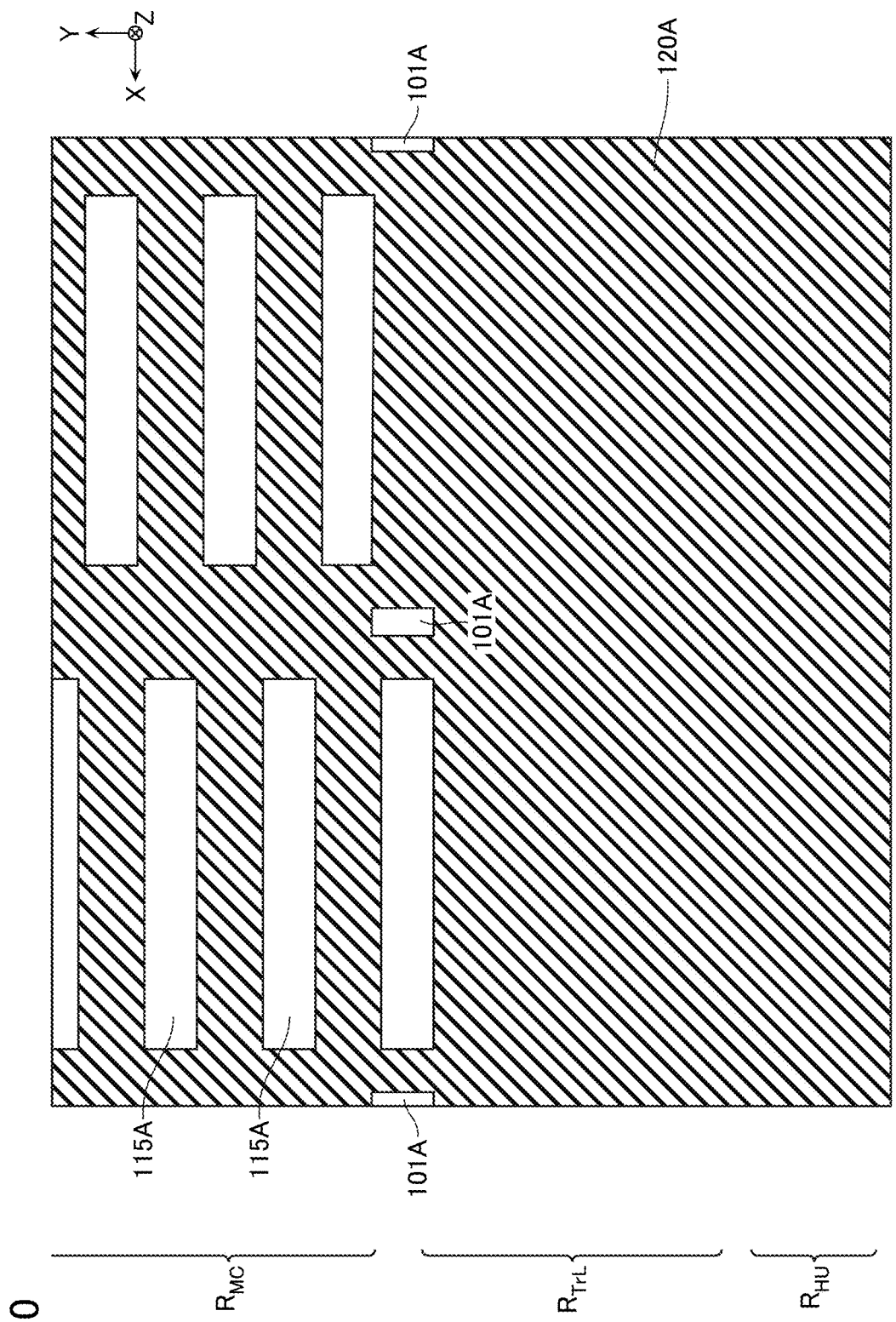
FIG. 10 is a schematic cross-sectional view for explaining the same method of manufacturing.
Figure 11:
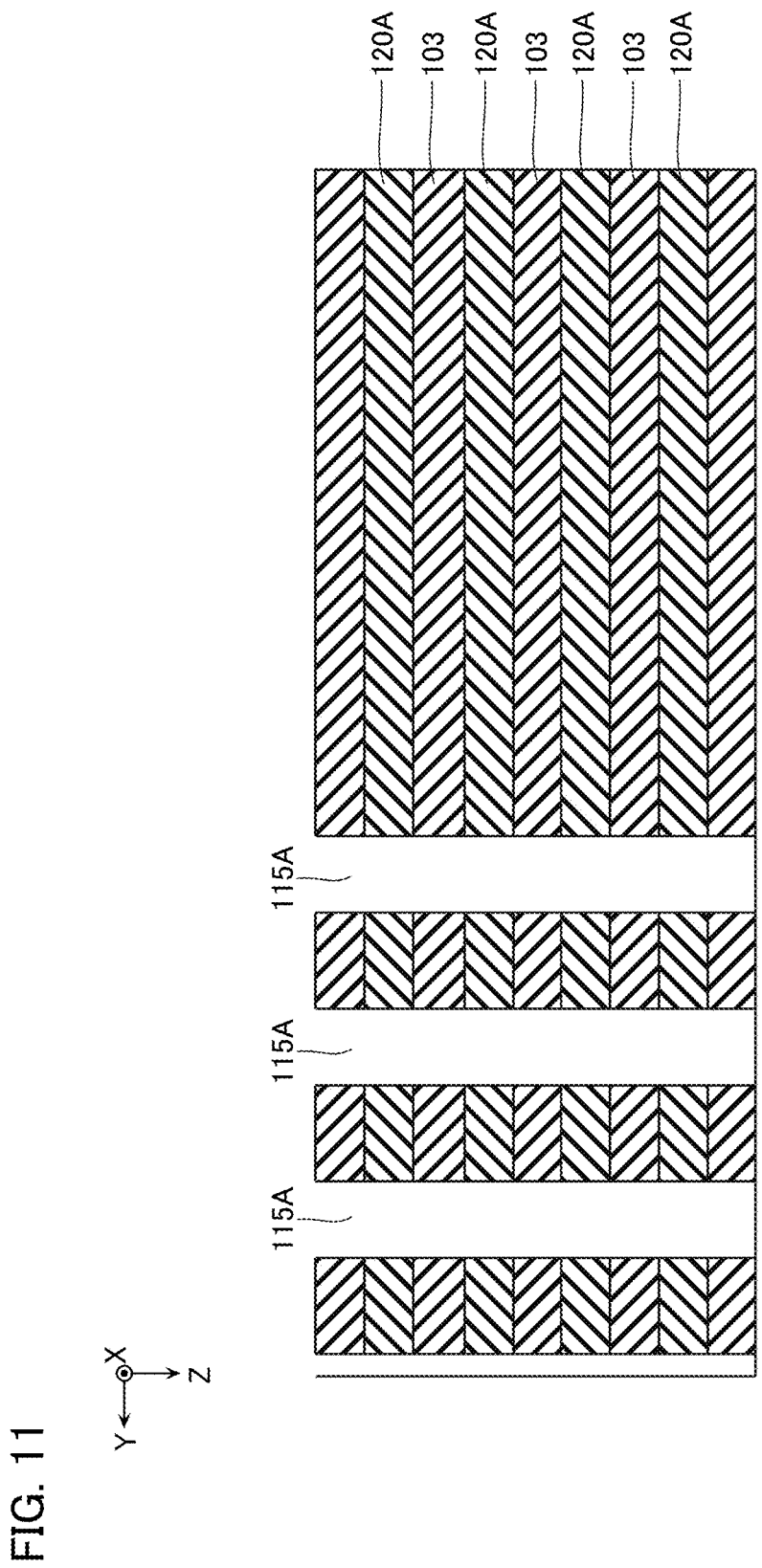
FIG. 11 is a schematic cross-sectional view for explaining the same method of manufacturing.

Next, as shown in FIGS. 10 and 11, for example, an opening 115A is formed at a position corresponding to the insulating layer 115. In addition, an opening 101A is formed in a region corresponding to a boundary of the memory cell region $R_{MC}$ and the transistor region $R_{TrL}$, of a position corresponding to the insulating layer 101. The openings 115A, 101A extend in the Z-direction and penetrate the plurality of insulating layers 103 and the plurality of sacrifice layers 120A arranged in the Z-direction, as shown in FIG. 11. This step is performed by the likes of RIE (Reactive Ion Etching), for example.

Figure 12:
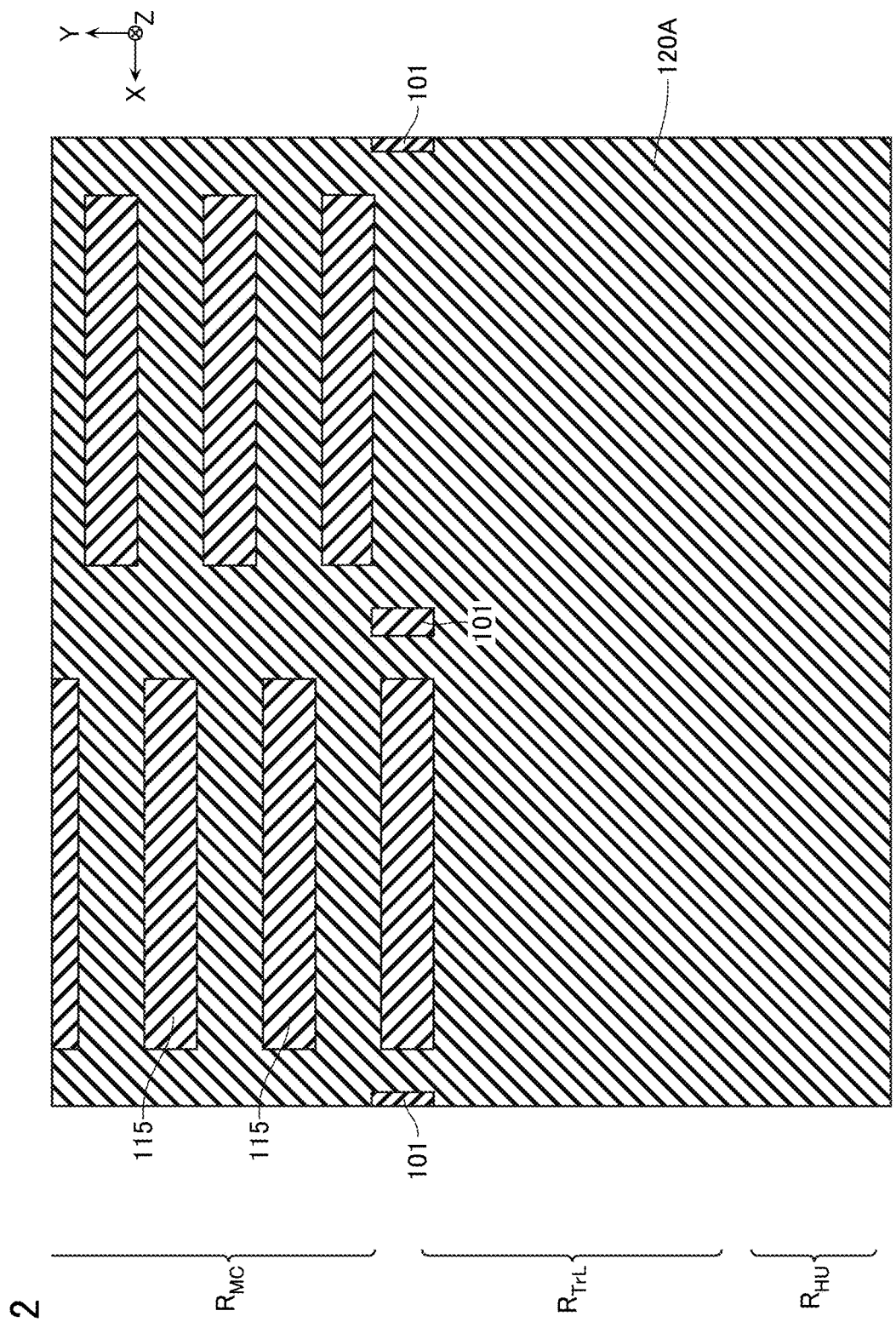
FIG. 12 is a schematic cross-sectional view for explaining the same method of manufacturing.
Figure 13:
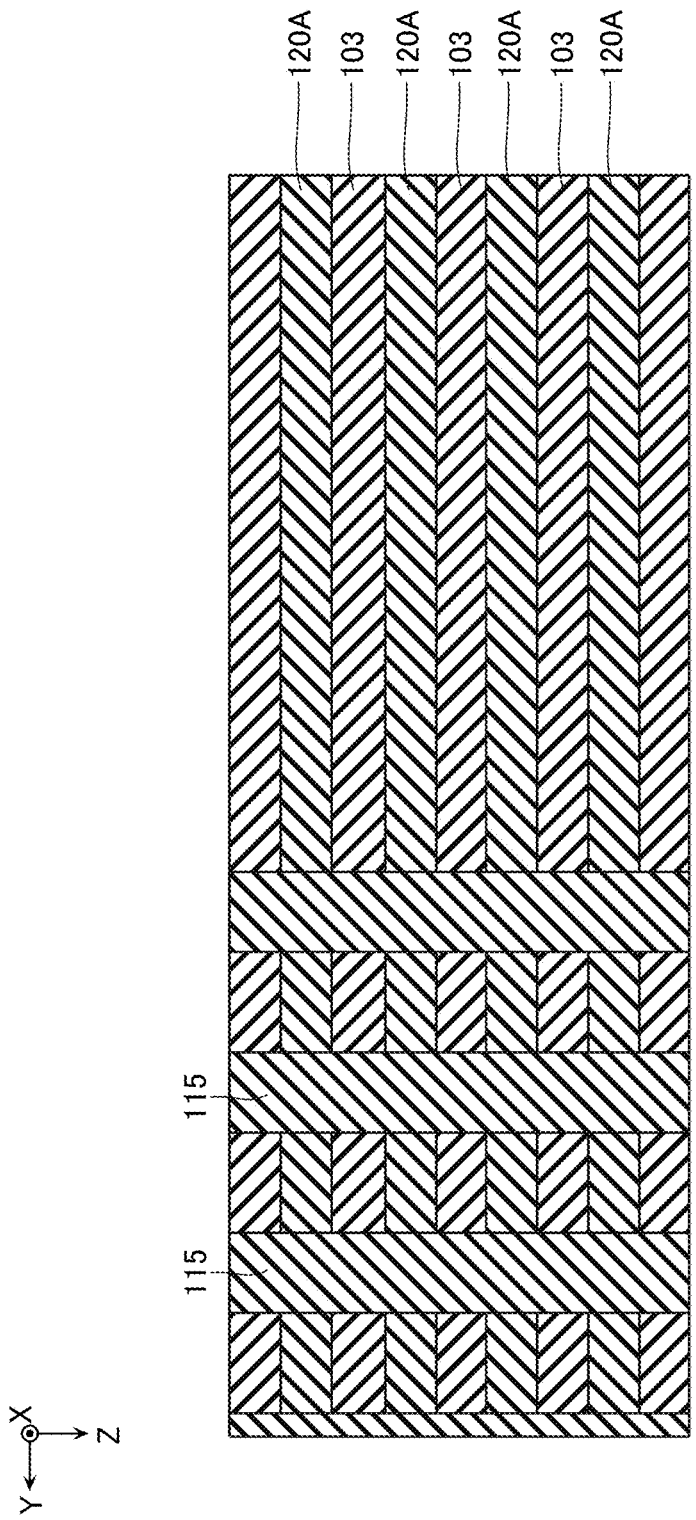
FIG. 13 is a schematic cross-sectional view for explaining the same method of manufacturing.

Next, as shown in FIGS. 12 and 13, for example, the insulating layer 115 and a part of the insulating layer 101 are formed. This step is performed by the likes of CVD, for example.

Figure 14:
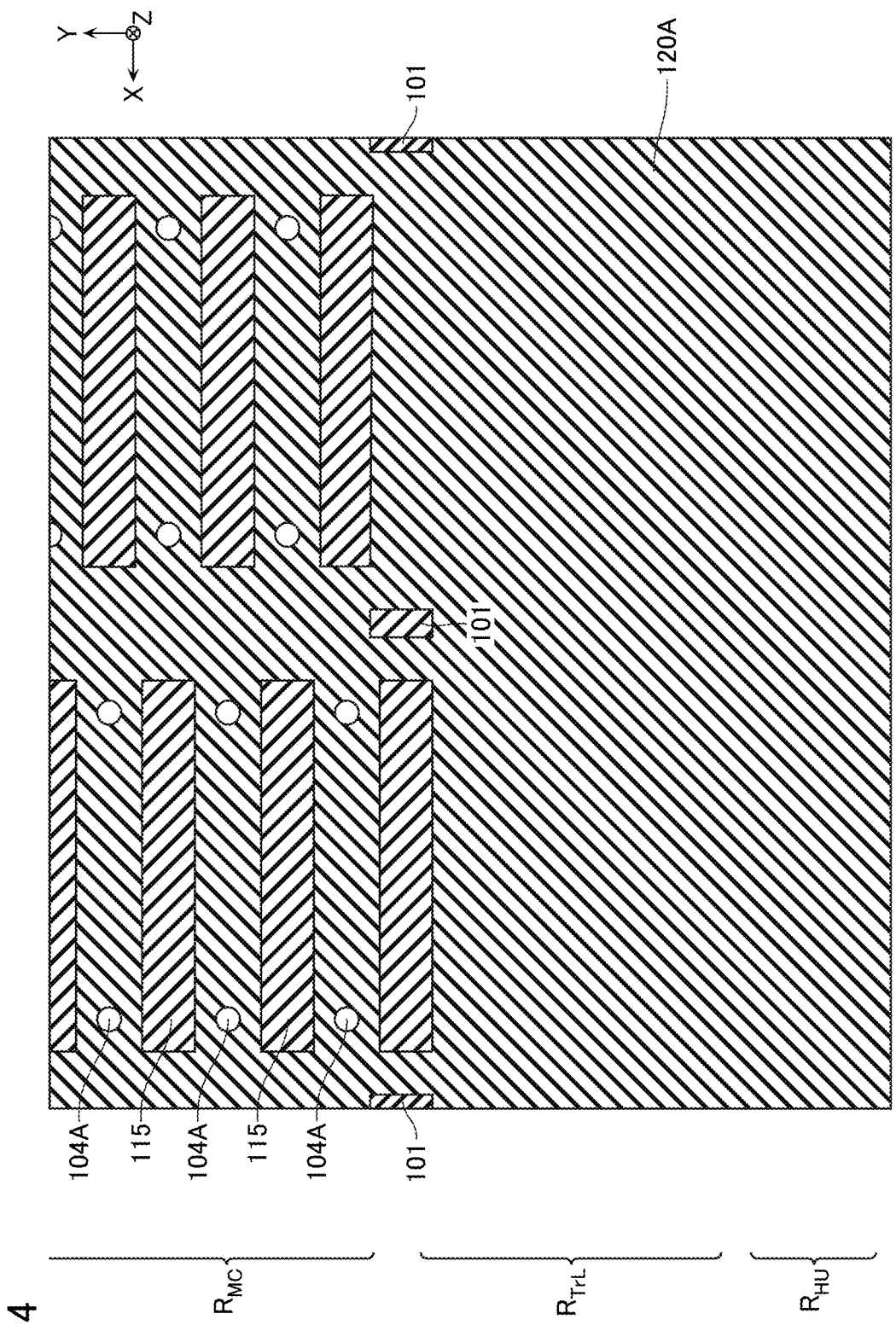
FIG. 14 is a schematic cross-sectional view for explaining the same method of manufacturing.
Figure 15:
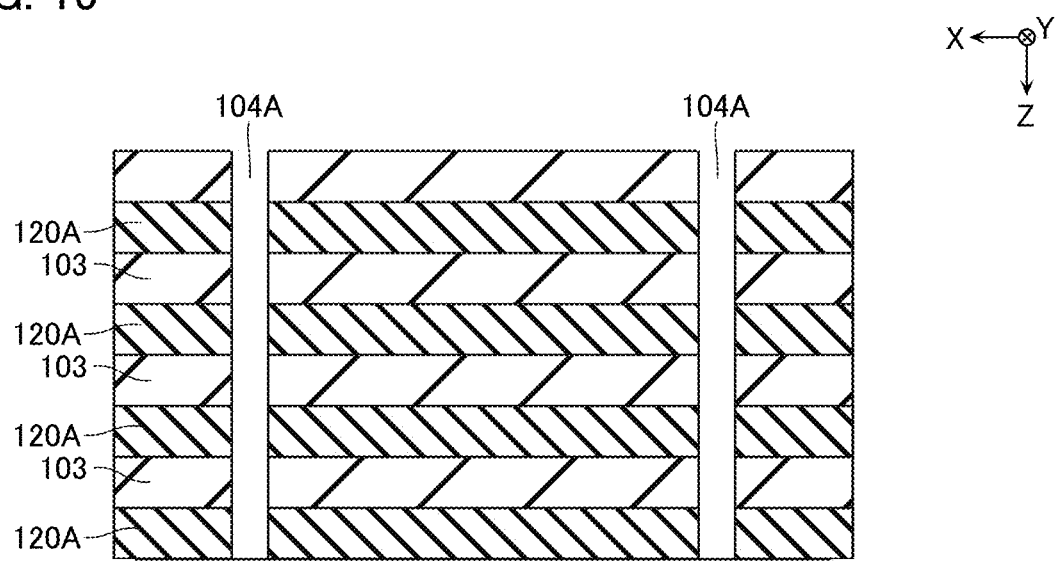
FIG. 15 is a schematic cross-sectional view for explaining the same method of manufacturing.

Next, as shown in FIGS. 14 and 15, for example, an opening 104A is formed at a position corresponding to the via wiring 104. The opening 104A extends in the Z-direction and penetrates the plurality of insulating layers 103 and the plurality of sacrifice layers 120A arranged in the Z-direction, as shown in FIG. 15. This step is performed by the likes of RIE, for example.

Figure 16:
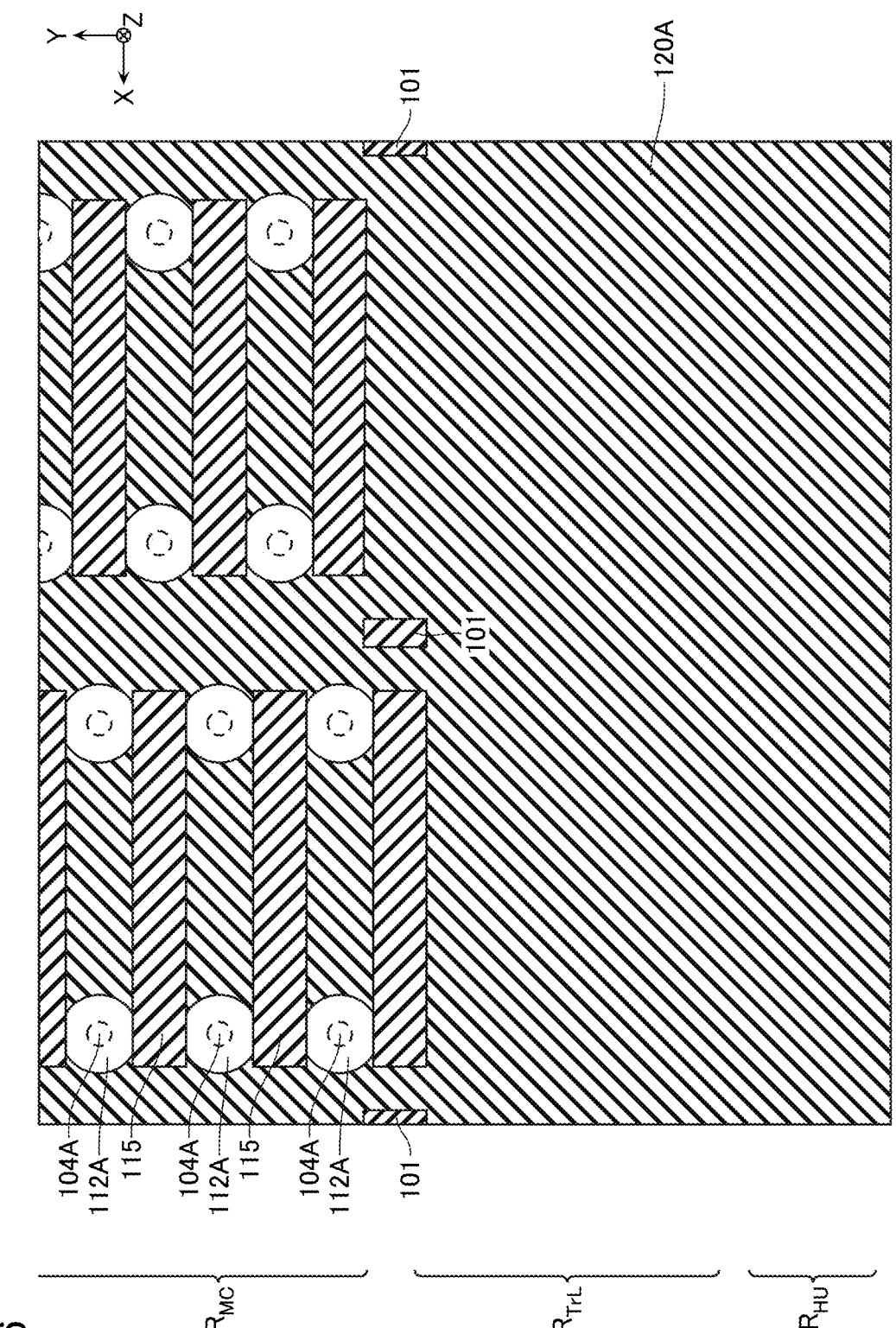
FIG. 16 is a schematic cross-sectional view for explaining the same method of manufacturing.
Figure 17:
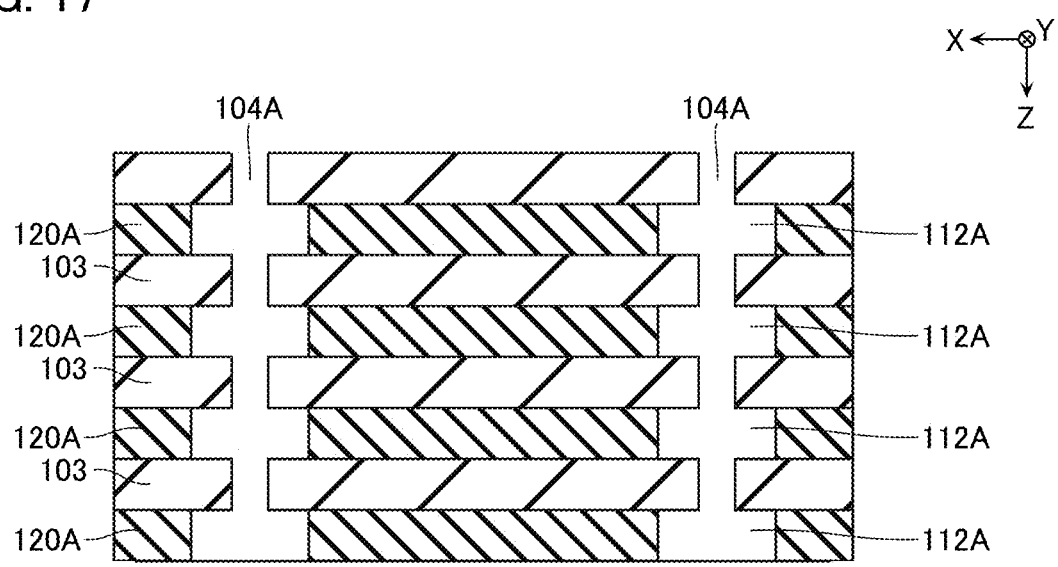
FIG. 17 is a schematic cross-sectional view for explaining the same method of manufacturing.

Next, as shown in FIGS. 16 and 17, for example, a part of the sacrifice layer 120A is selectively removed via the opening 104A. In this step, a side surface in the Y-direction of the insulating layer 115 is exposed inside the opening 104A, whereby the sacrifice layer 120A is divided in the X-direction. This step is performed by the likes of wet etching, for example. Note that in the drawings, an opening formed in a portion where the sacrifice layer 120A is provided, is indicated as an opening 112A.

Figure 18:
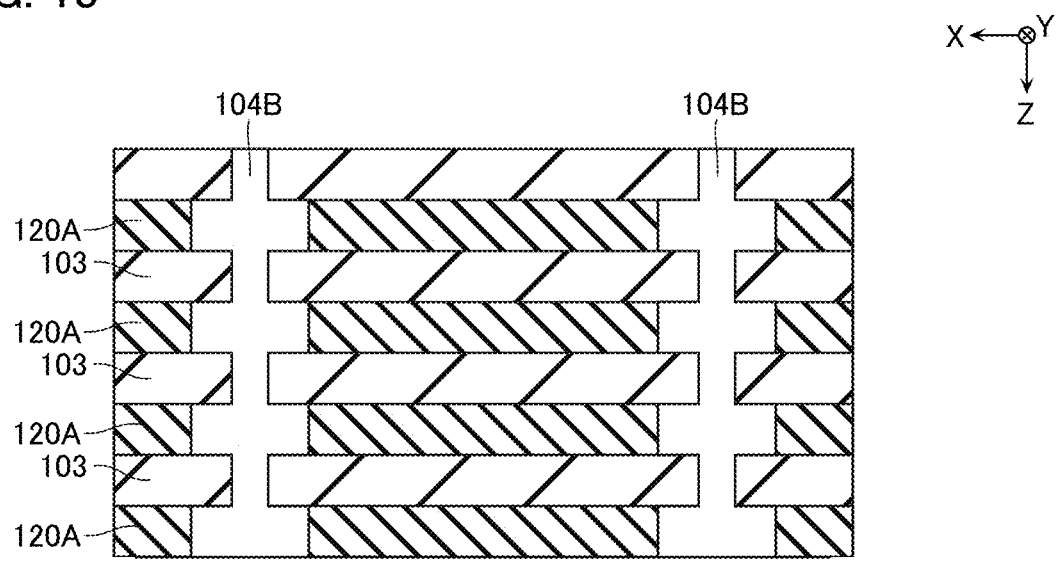
FIG. 18 is a schematic cross-sectional view for explaining the same method of manufacturing.

Next, as shown in FIG. 18, for example, a sacrifice layer 104B is formed inside the openings 104A, 112A. The sacrifice layer 104B includes the likes of silicon (Si), for example. This step is performed by the likes of CVD, for example.

Figure 19:
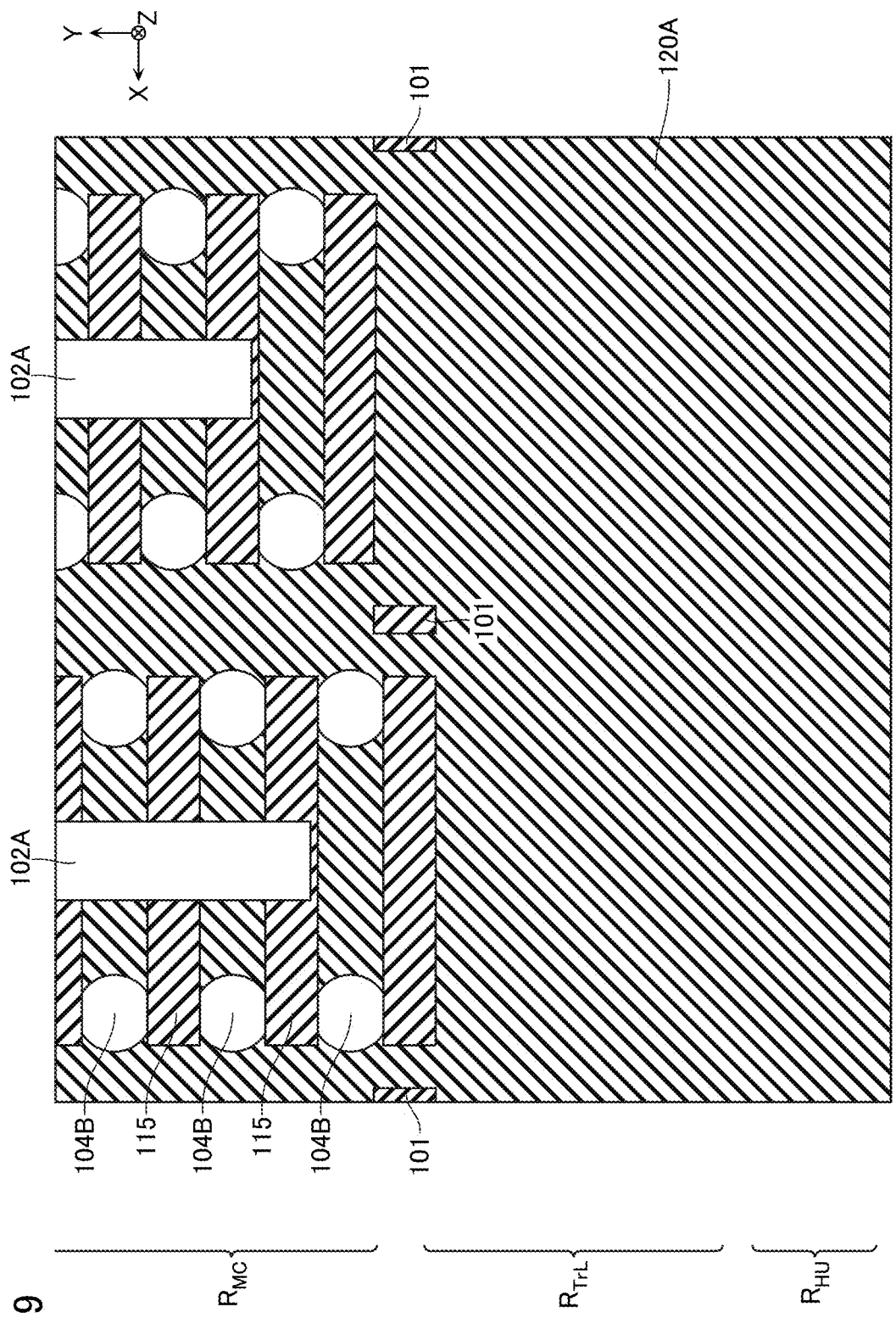
FIG. 19 is a schematic cross-sectional view for explaining the same method of manufacturing.
Figure 20:
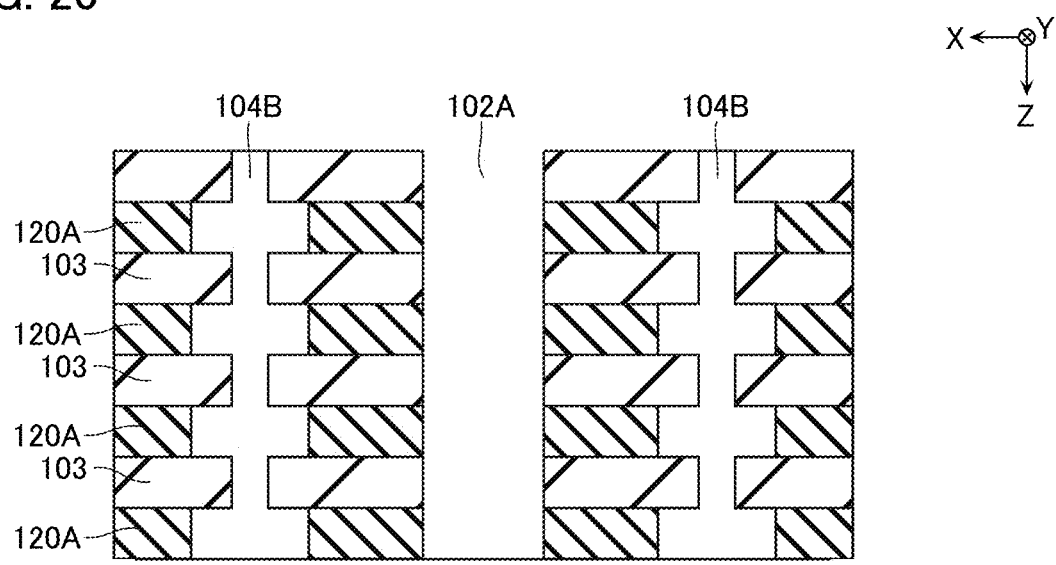
FIG. 20 is a schematic cross-sectional view for explaining the same method of manufacturing.

Next, as shown in FIGS. 19 and 20, for example, an opening 102A is formed at a position corresponding to the conductive layer 102. The opening 102A extends in the Z-direction and penetrates the plurality of insulating layers 103 and the plurality of sacrifice layers 120A arranged in the Z-direction, to divide these configurations in the X-direction, as shown in FIG. 20. This step is performed by the likes of RIE, for example.

Figure 21:
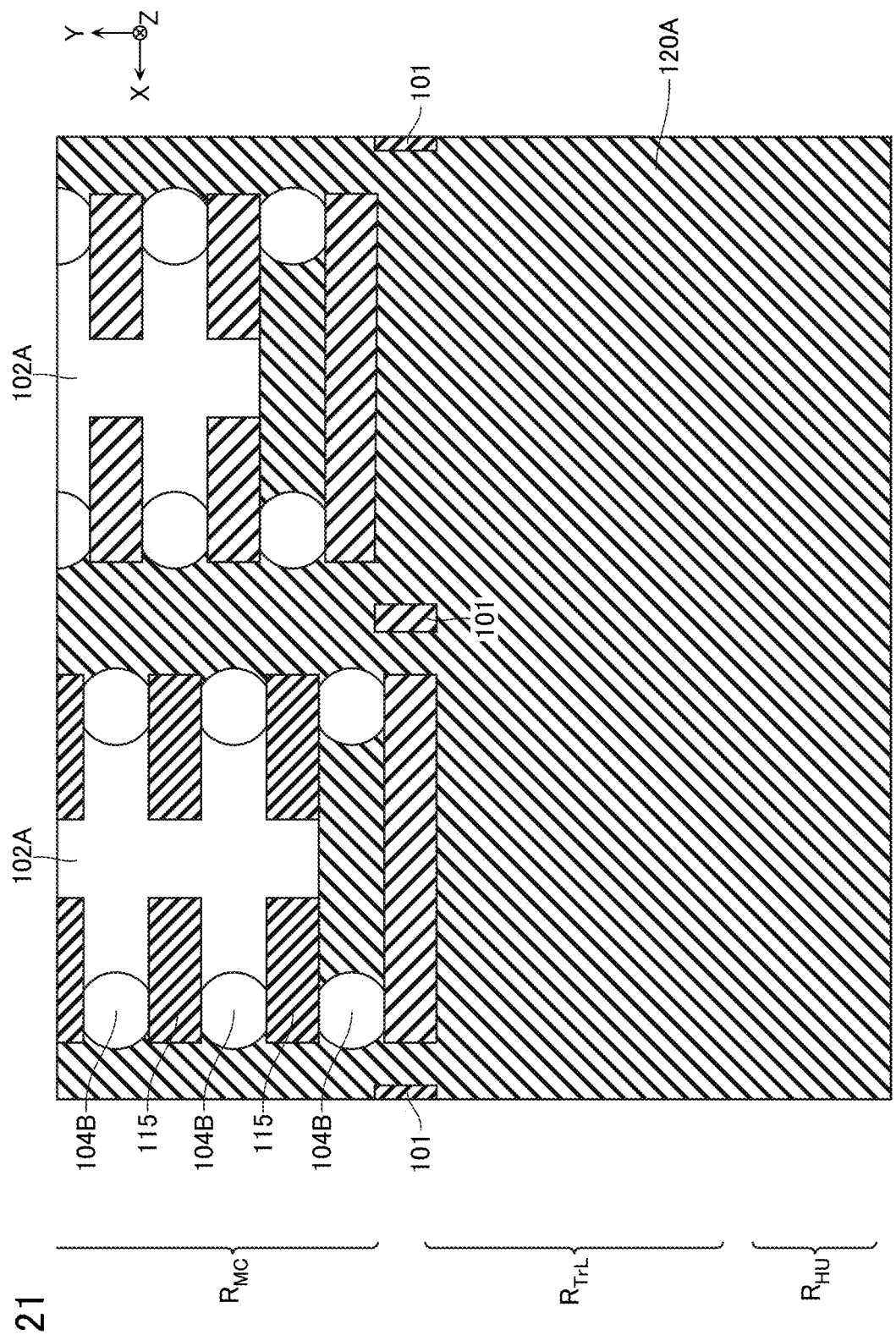
FIG. 21 is a schematic cross-sectional view for explaining the same method of manufacturing.
Figure 22:
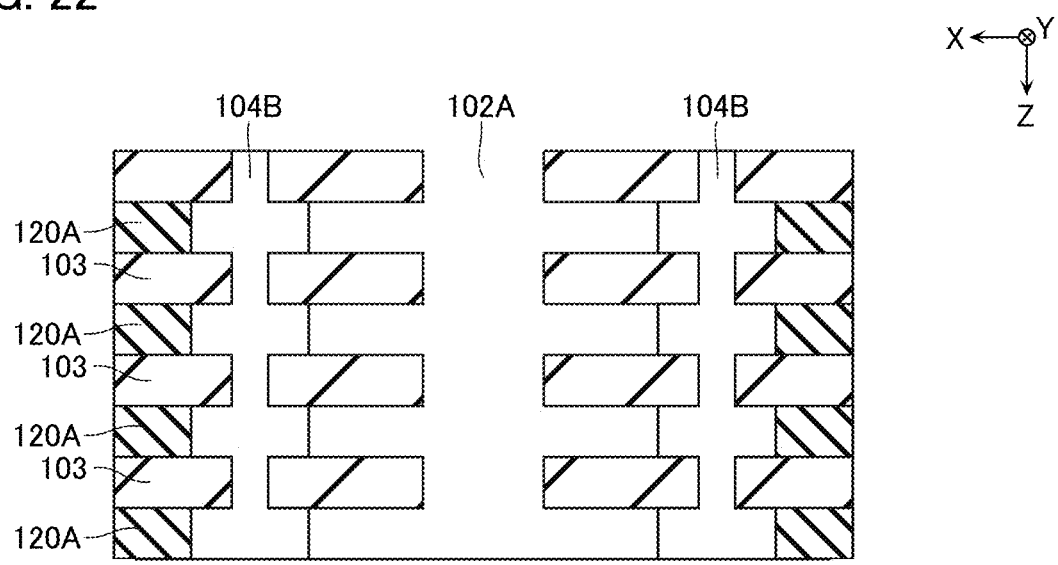
FIG. 22 is a schematic cross-sectional view for explaining the same method of manufacturing.

Next, as shown in FIGS. 21 and 22, for example, a part of the sacrifice layer 120A is selectively removed via the opening 102A. In this step, a side surface in the X-direction of the sacrifice layer 104B is exposed inside the opening 102A. This step is performed by the likes of wet etching, for example.

Figure 23:
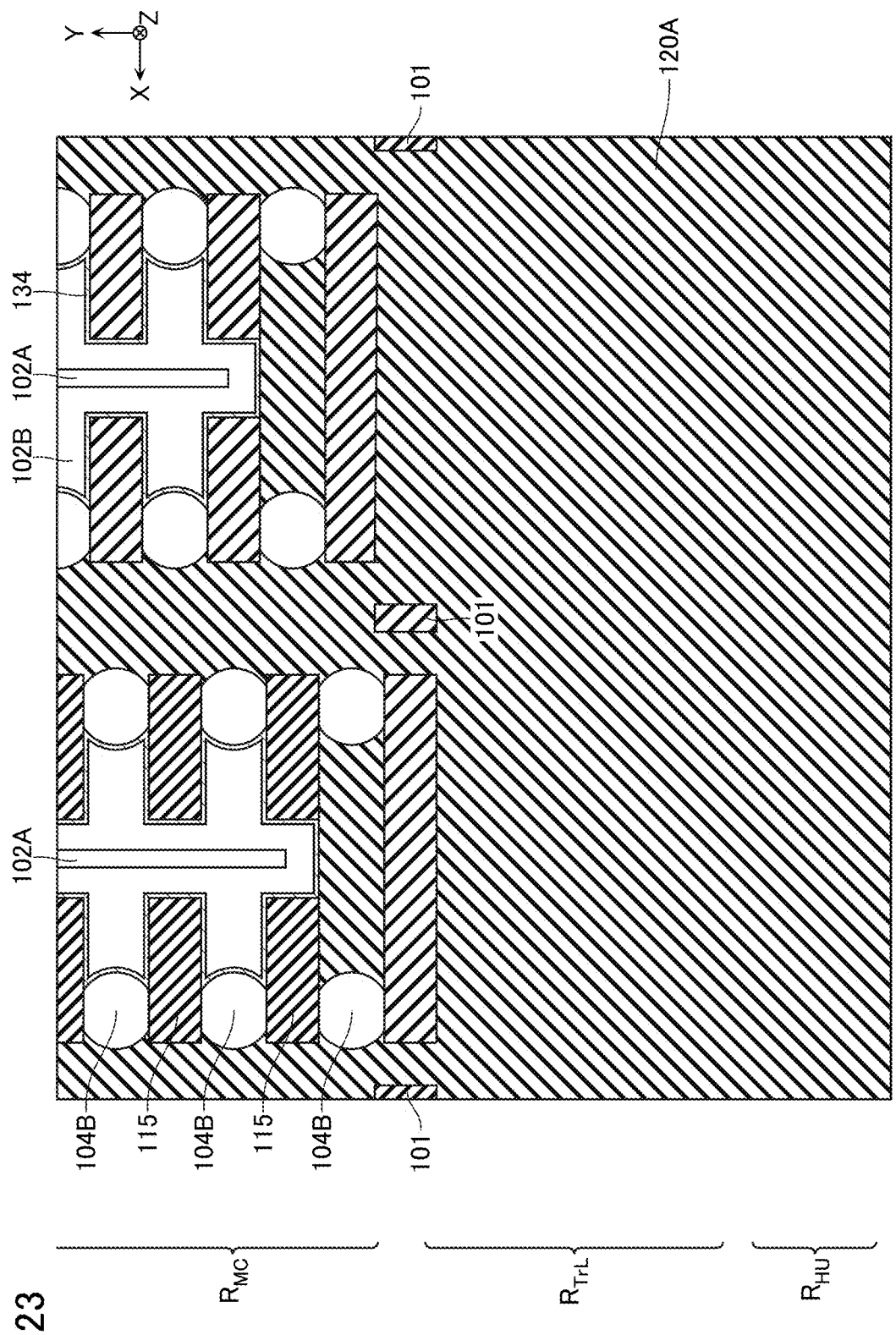
FIG. 23 is a schematic cross-sectional view for explaining the same method of manufacturing.
Figure 24:
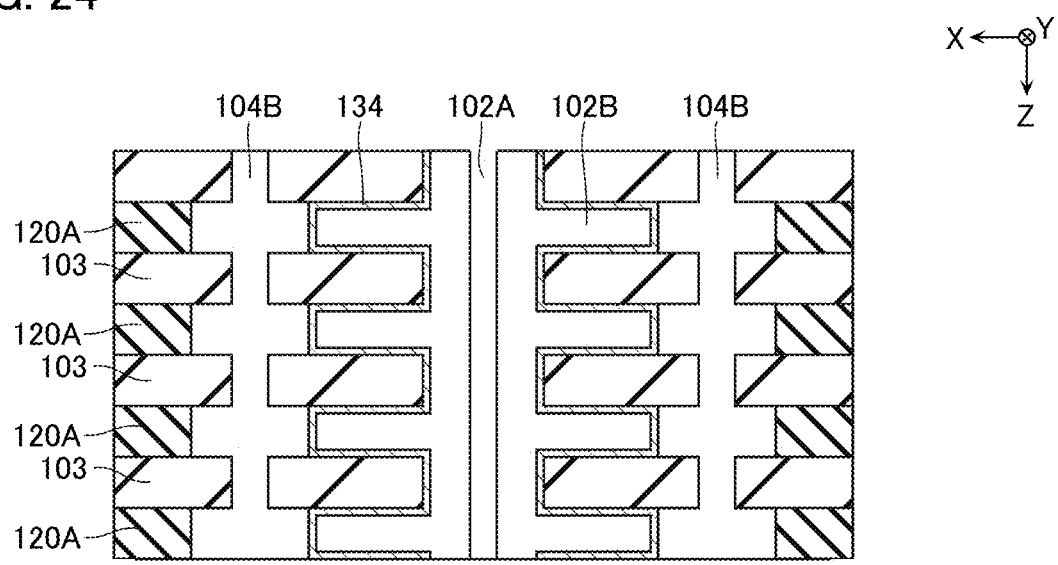
FIG. 24 is a schematic cross-sectional view for explaining the same method of manufacturing.

Next, as shown in FIGS. 23 and 24, for example, the conductive layer 134 is formed on a side surface on one side (an opening 102A side) in the X-direction of the sacrifice layer 104B, a side surface on one side (the opening 102A side) in the X-direction and both side surfaces in the Y-direction of the insulating layer 115, and an upper surface, a lower surface, and a side surface on one side (the opening 102A side) in the X-direction of the insulating layer 103 (FIG. 24), via the opening 102A. In addition, a sacrifice layer 102B is formed inside the opening 102A. The sacrifice layer 102B includes the likes of silicon (Si), for example. In this step, as shown in FIG. 24, for example, a region between two insulating layers 103 adjacent in the Z-direction is filled in by the sacrifice layer 102B. On the other hand, a region between two insulating layers 103 adjacent in the X-direction is not filled in by the sacrifice layer 102B. This step is performed by the likes of ALD (Atomic Layer Deposition) and CVD, for example.

Figure 25:
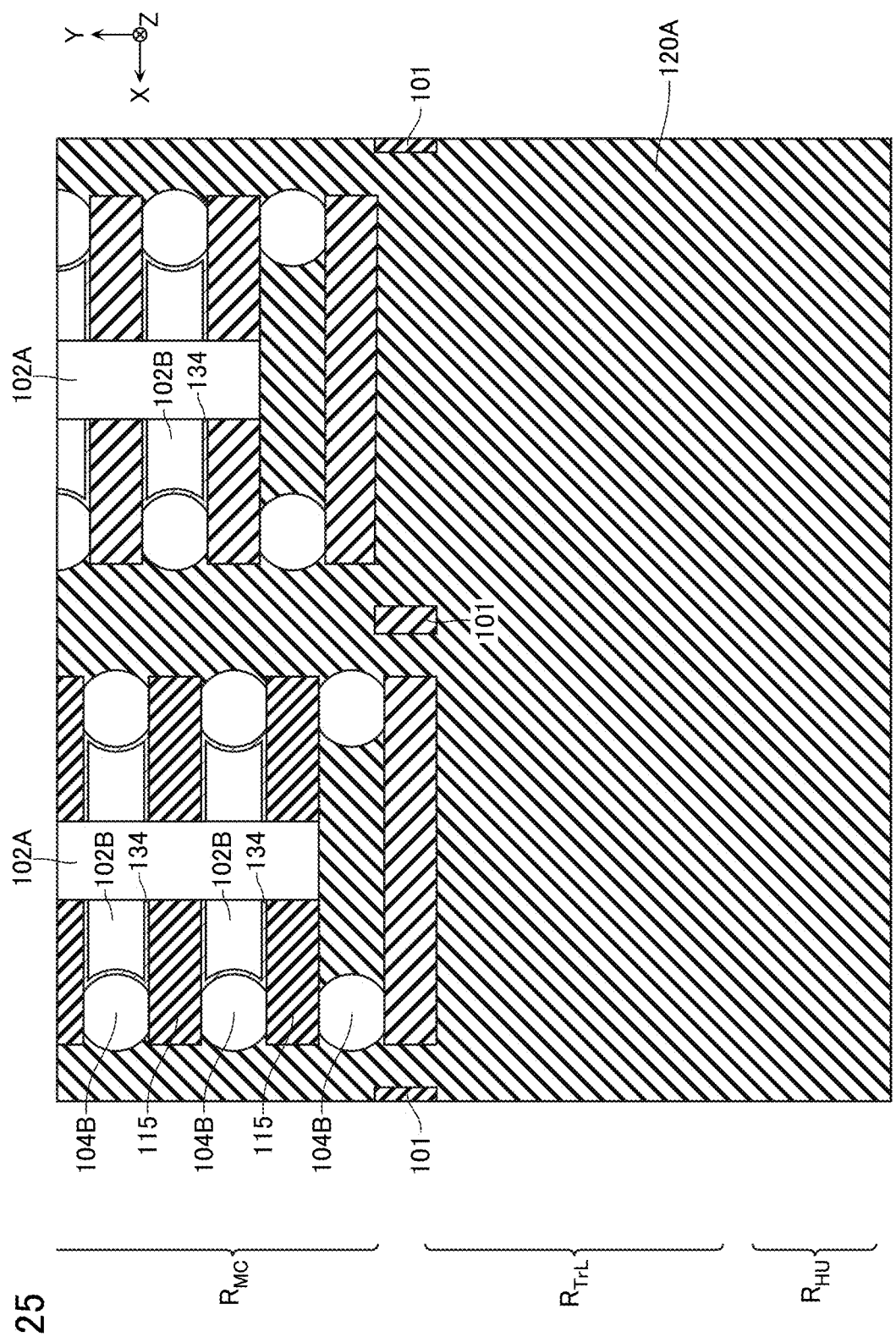
FIG. 25 is a schematic cross-sectional view for explaining the same method of manufacturing.
Figure 26:
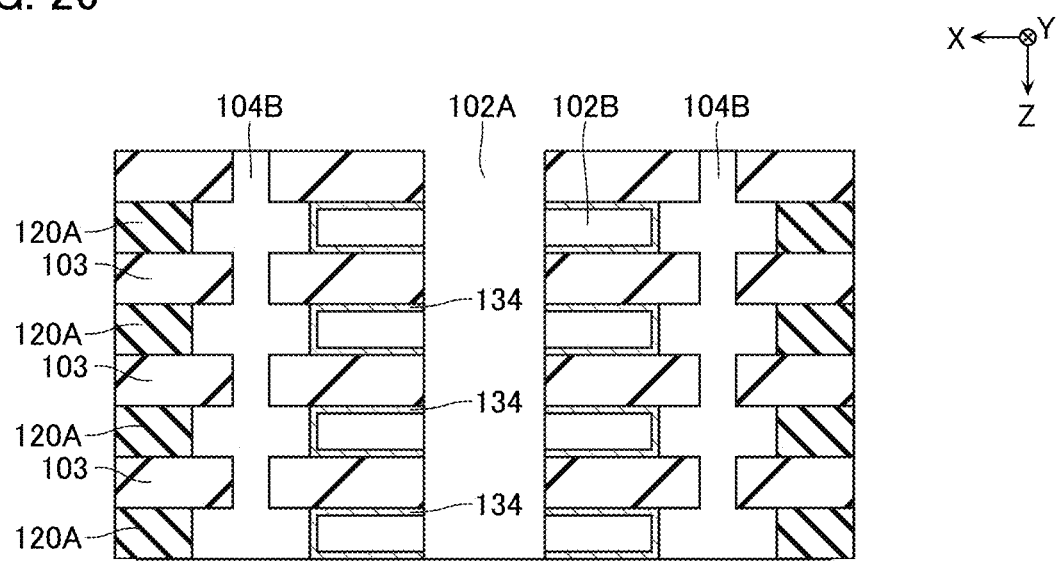
FIG. 26 is a schematic cross-sectional view for explaining the same method of manufacturing.

Next, as shown in FIGS. 25 and 26, for example, parts of the sacrifice layer 102B and the conductive layer 134 are removed via the opening 102A. In this step, for example, a part of the sacrifice layer 102B is removed, whereby a portion provided on side surfaces in the X-direction of the insulating layer 115 (FIG. 25) and the insulating layer 103 (FIG. 26), of the conductive layer 134, is exposed, and this portion is removed. This step is performed by the likes of wet etching, for example.

Figure 27:
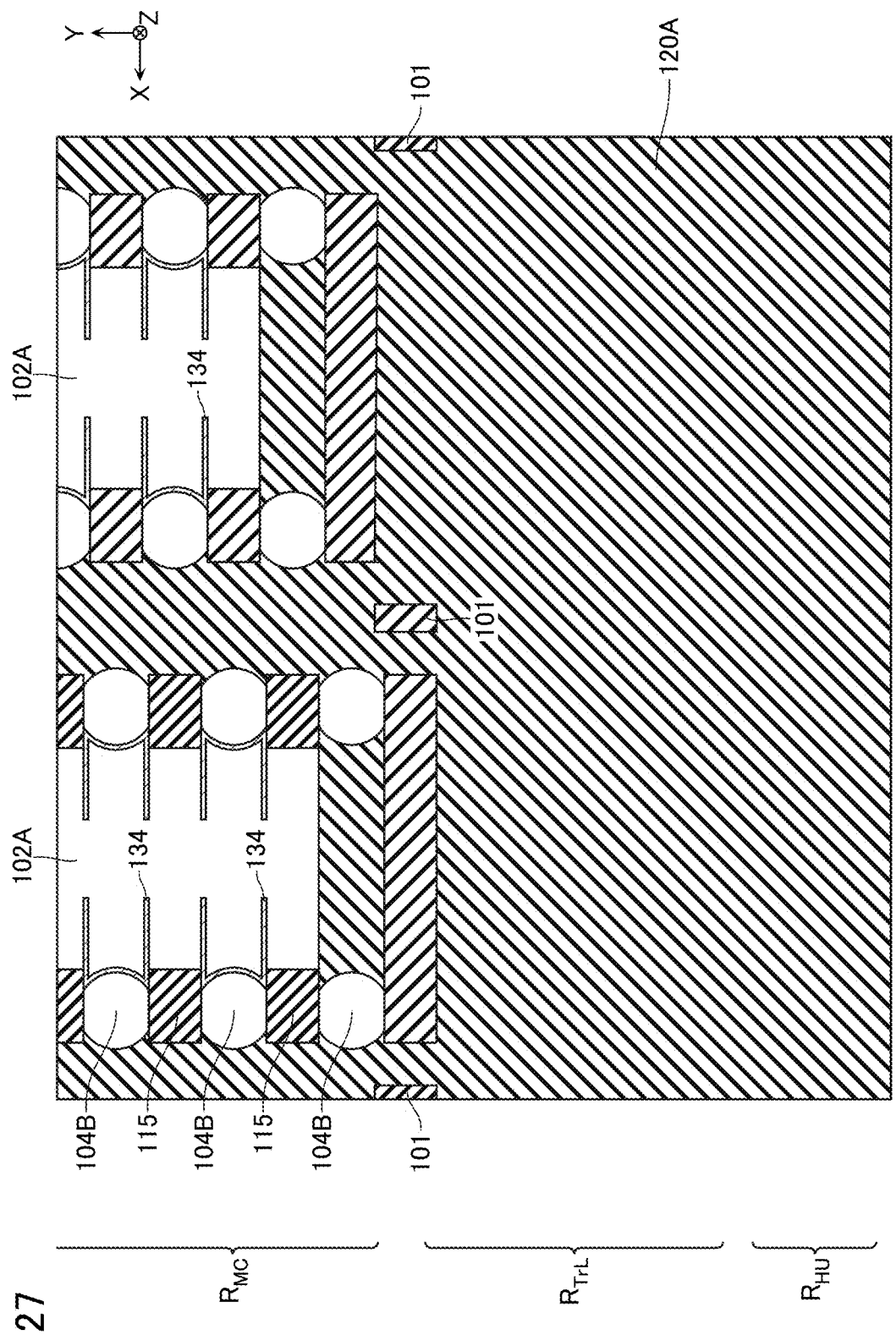
FIG. 27 is a schematic cross-sectional view for explaining the same method of manufacturing.
Figure 28:
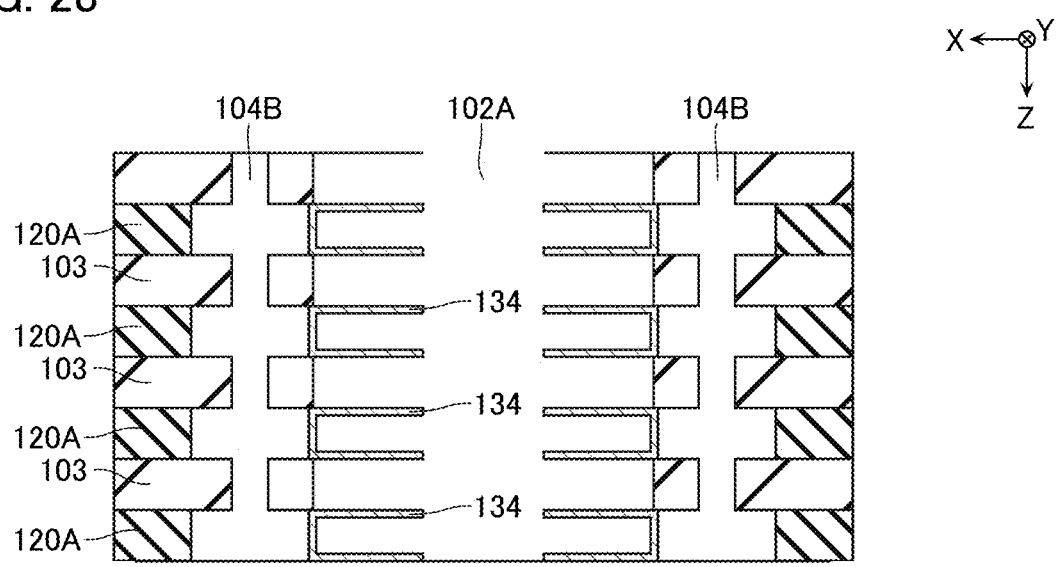
FIG. 28 is a schematic cross-sectional view for explaining the same method of manufacturing.

Next, as shown in FIGS. 27 and 28, for example, the sacrifice layer 102B, a part of the insulating layer 115 (FIG. 27), and a part of the insulating layer 103 (FIG. 28) are removed via the opening 102A. In this step, the sacrifice layer 102B is completely removed. Moreover, the insulating layer 115 (FIG. 27) and the insulating layer 103 (FIG. 28) are removed in a range limited enough to prevent the sacrifice layer 104B from being exposed in the opening 102A. This step is performed by the likes of wet etching, for example.

Figure 29:
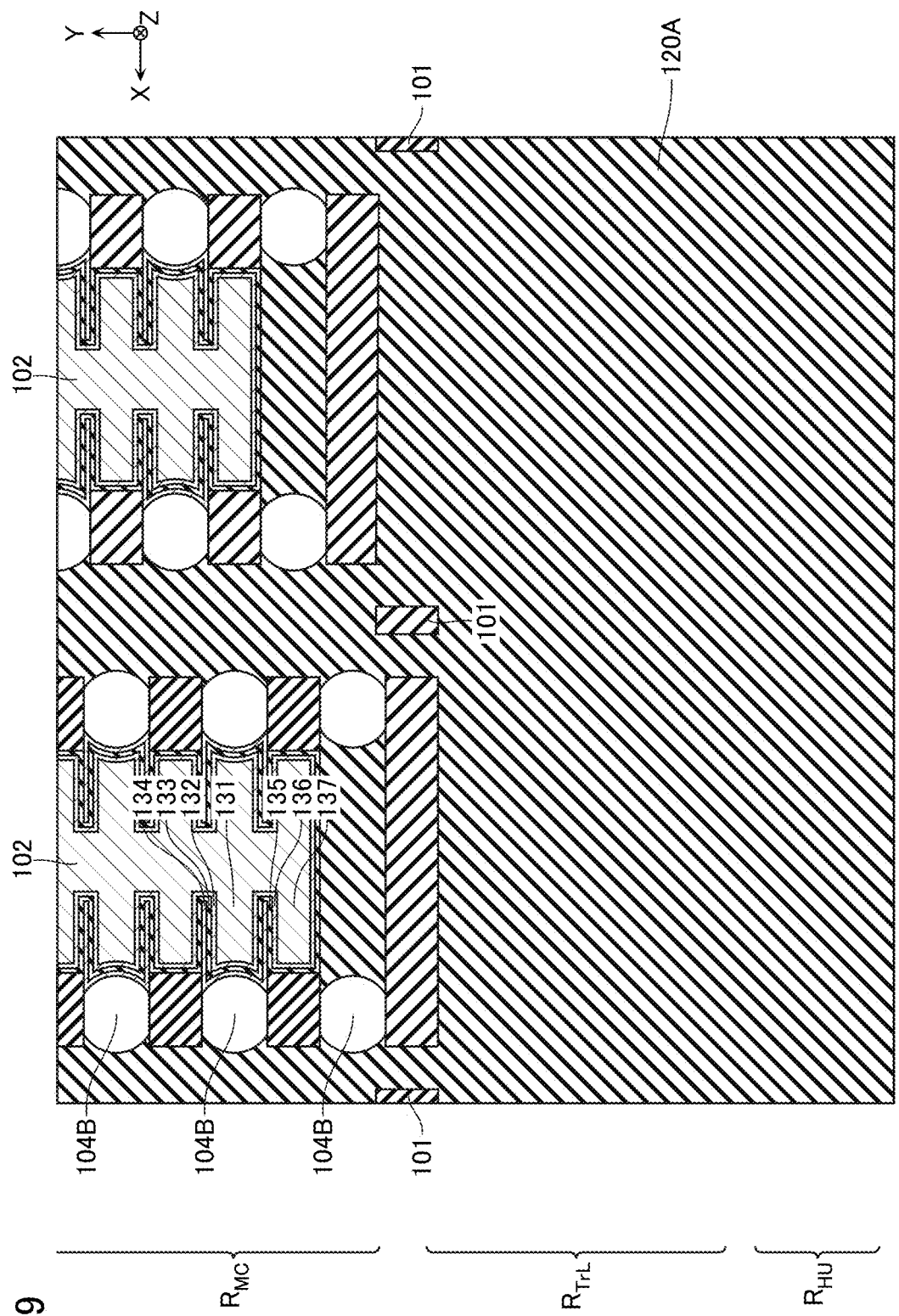
FIG. 29 is a schematic cross-sectional view for explaining the same method of manufacturing.
Figure 30:
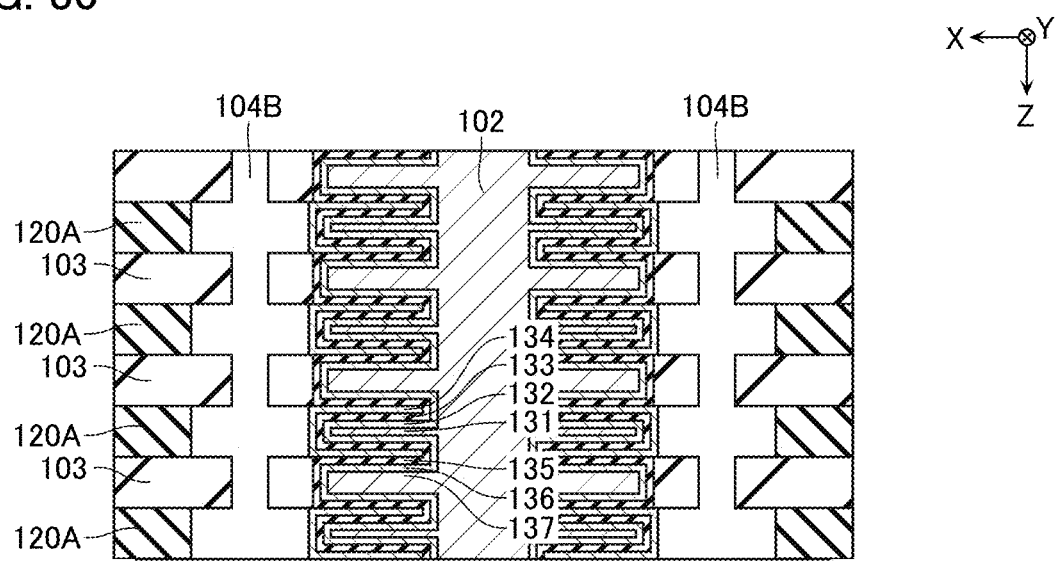
FIG. 30 is a schematic cross-sectional view for explaining the same method of manufacturing.

Next, as shown in FIGS. 29 and 30, for example, the insulating layers 133, 135, the conductive layers 132, 136, and the conductive layers 131, 137, 102 are formed on an upper surface, a lower surface, a side surface on one side (the opening 102A side) in the X-direction, and both side surfaces in the Y-direction of the conductive layer 134, via the opening 102A. This step is performed by the likes of CVD, for example.

Figure 31:
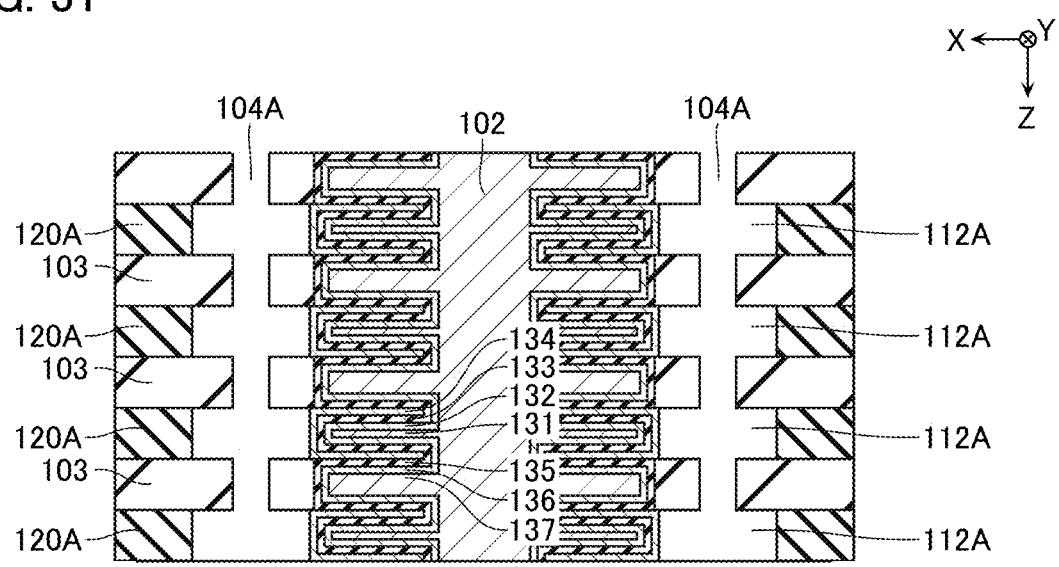
FIG. 31 is a schematic cross-sectional view for explaining the same method of manufacturing.

Next, as shown in FIG. 31, for example, the sacrifice layer 104B is removed. This step is performed by the likes of wet etching, for example.

Figure 32:
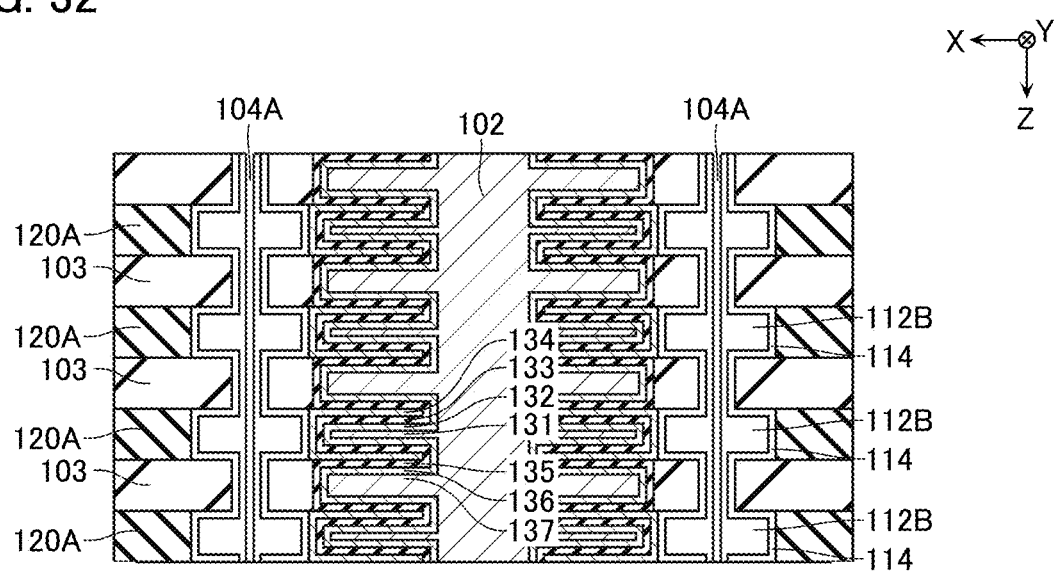
FIG. 32 is a schematic cross-sectional view for explaining the same method of manufacturing.

Next, as shown in FIG. 32, for example, the semiconductor layer 114 is formed on side surfaces in the X-direction of the sacrifice layer 120A and the conductive layer 134, side surfaces in the Y-direction of the insulating layer 115, and an upper surface and a lower surface of the insulating layer 103, via the opening 104A. In addition, a sacrifice layer 112B is formed in the opening 112A. In this step, the opening 112A is filled in by the sacrifice layer 112B. On the other hand, the opening 104A is not filled in by the sacrifice layer 112B. This step is performed by the likes of ALD and CVD, for example.

Figure 33:
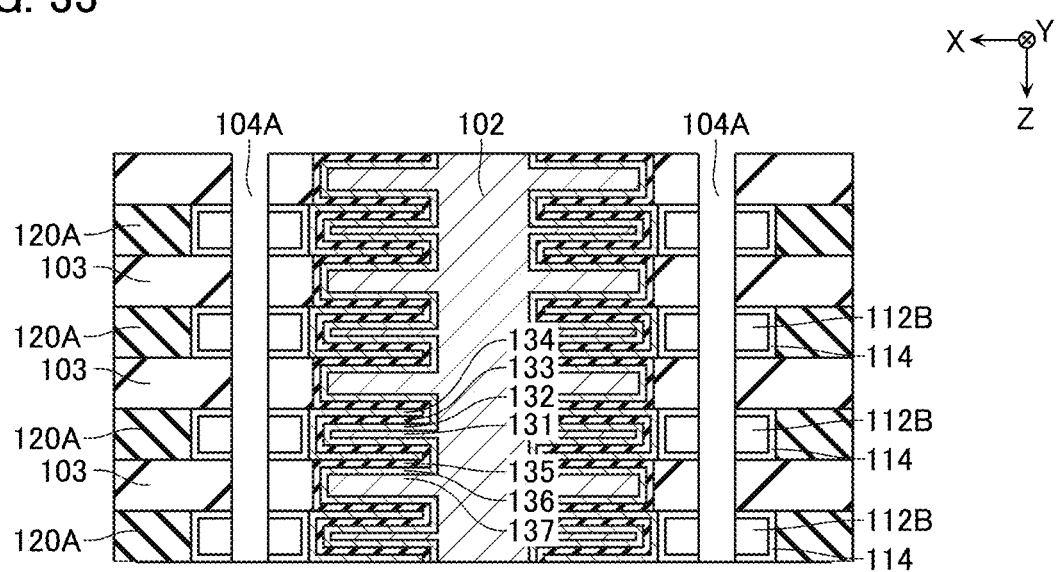
FIG. 33 is a schematic cross-sectional view for explaining the same method of manufacturing.

Next, as shown in FIG. 33, for example, parts of the sacrifice layer 112B and the semiconductor layer 114 are removed via the opening 104A. In this step, for example, a part of the sacrifice layer 112B is removed, whereby a portion provided on an inner peripheral surface of the insulating layer 103, of the semiconductor layer 114 is exposed, and this portion is removed. This step is performed by the likes of wet etching, for example.

Figure 34:
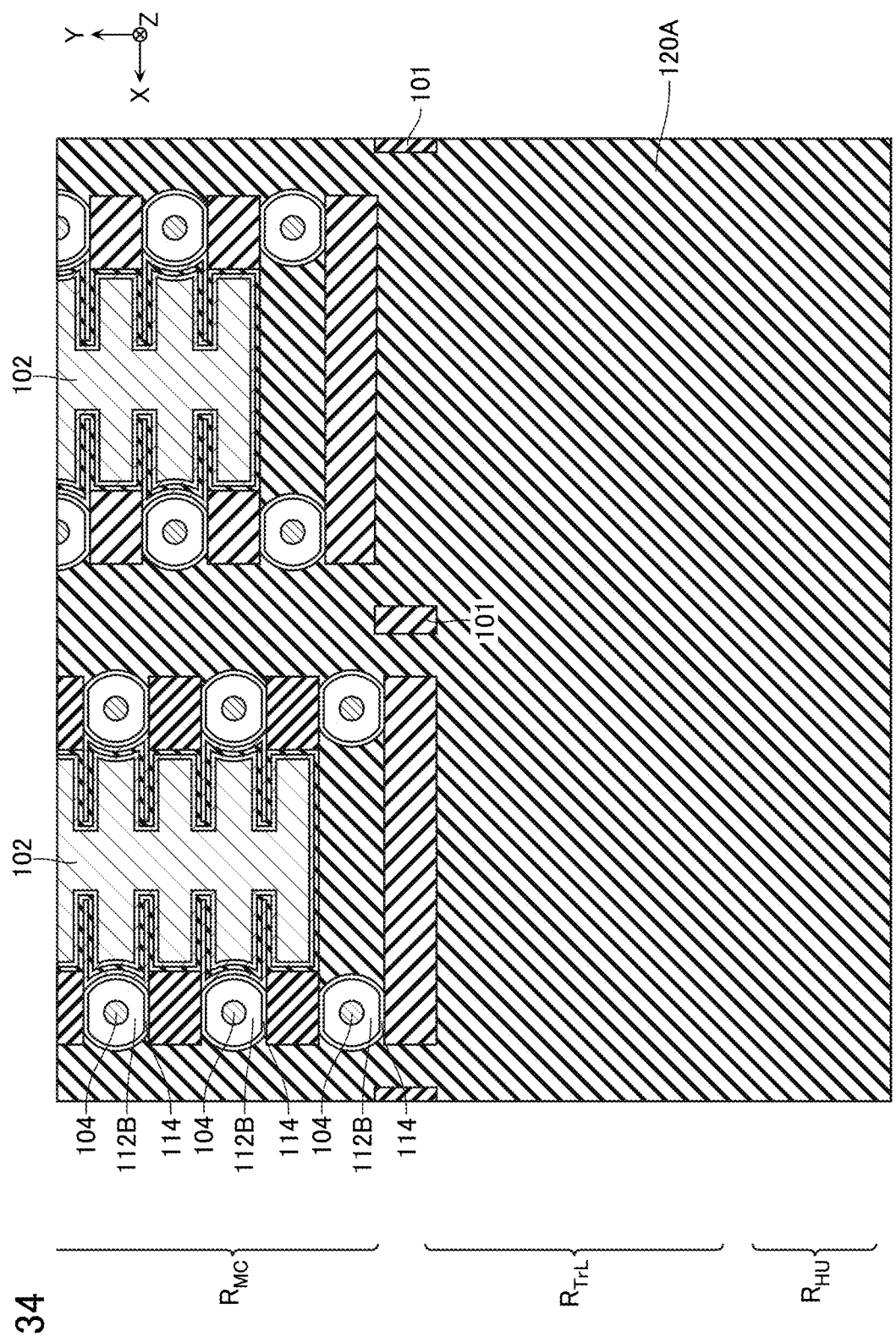
FIG. 34 is a schematic cross-sectional view for explaining the same method of manufacturing.
Figure 35:
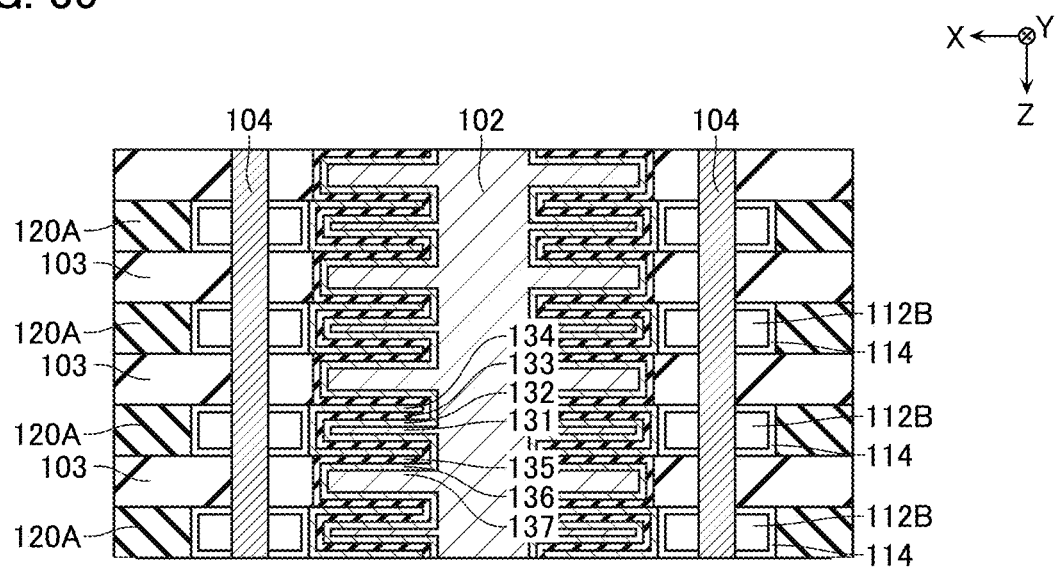
FIG. 35 is a schematic cross-sectional view for explaining the same method of manufacturing.

Next, as shown in FIGS. 34 and 35, for example, the via wiring 104 is formed inside the opening 104A. This step is performed by the likes of ALD and CVD, for example.

Figure 36:
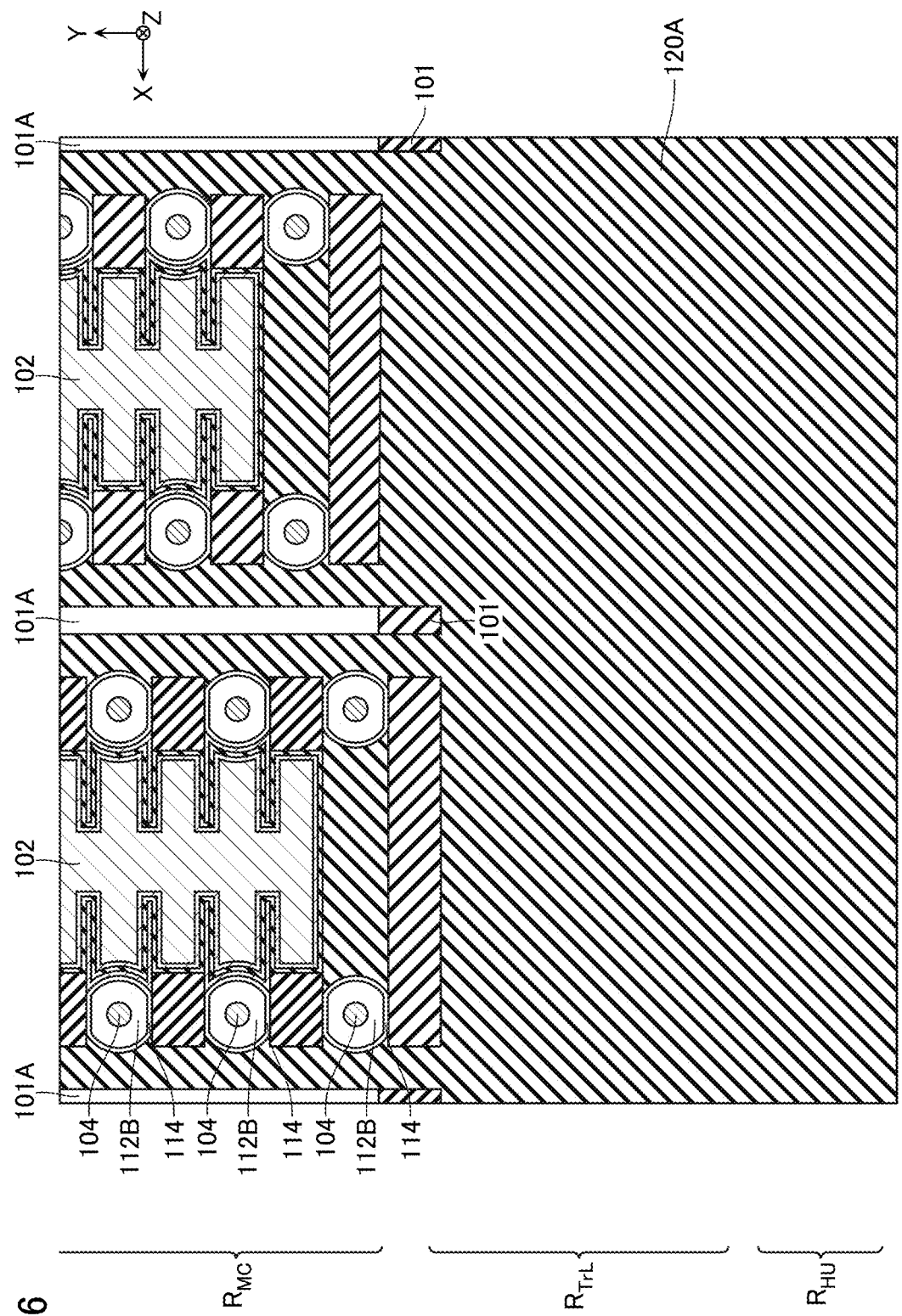
FIG. 36 is a schematic cross-sectional view for explaining the same method of manufacturing.
Figure 37:
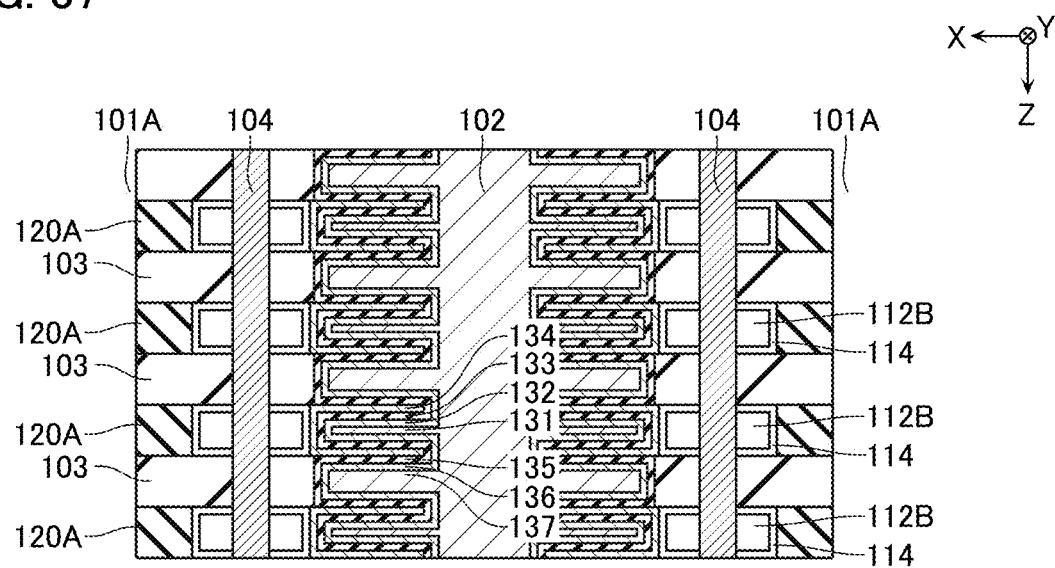
FIG. 37 is a schematic cross-sectional view for explaining the same method of manufacturing.

Next, as shown in FIGS. 36 and 37, for example, an opening 101A is formed in a region within the memory cell region $R_{MC}$, of the position corresponding to the insulating layer 101. The opening 101A extends in the Z-direction and penetrates the plurality of insulating layers 103 and the plurality of sacrifice layers 120A arranged in the Z-direction, to divide these configurations in the X-direction, as shown in FIG. 37. This step is performed by the likes of RIE, for example.

Figure 38:
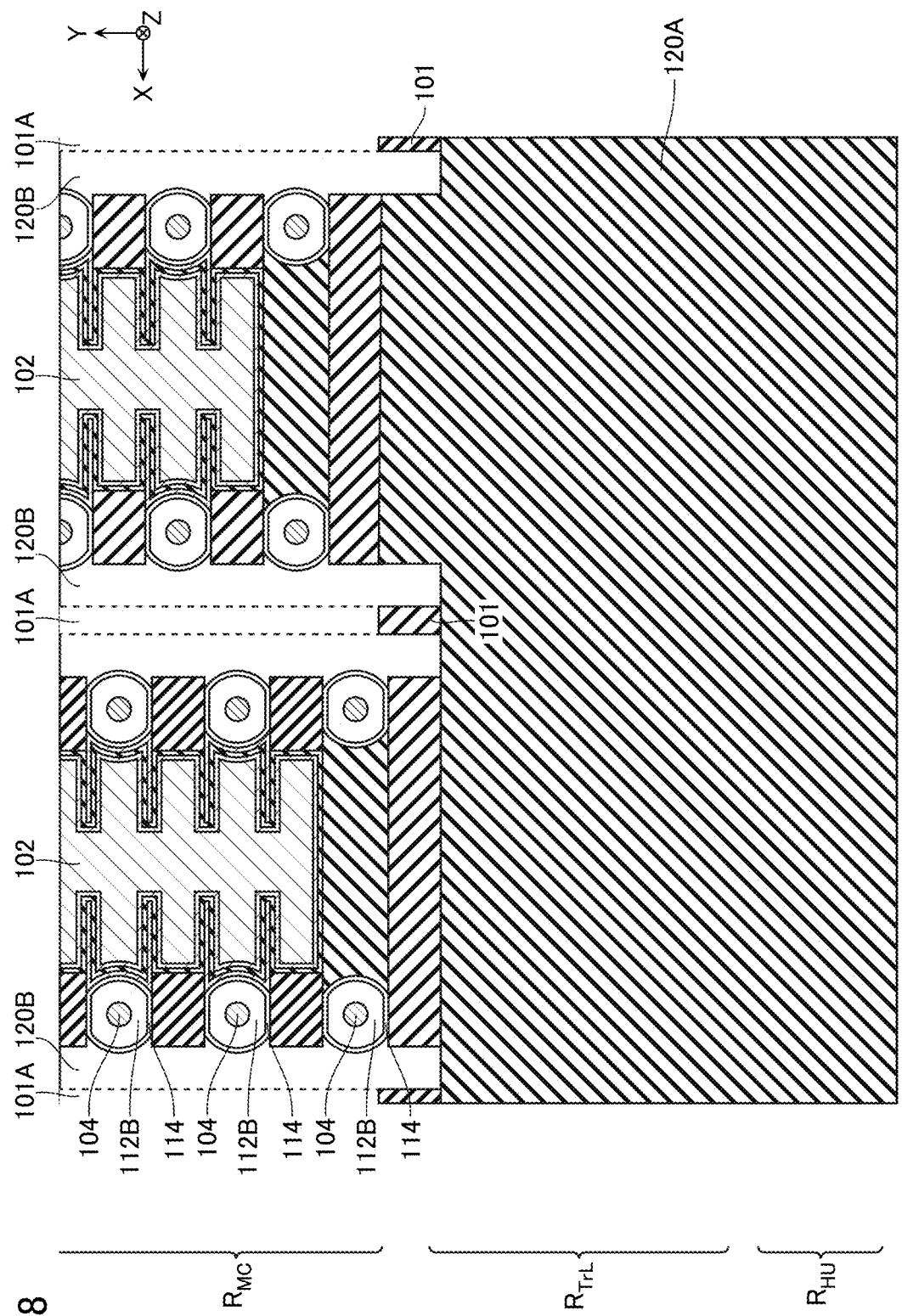
FIG. 38 is a schematic cross-sectional view for explaining the same method of manufacturing.
Figure 39:
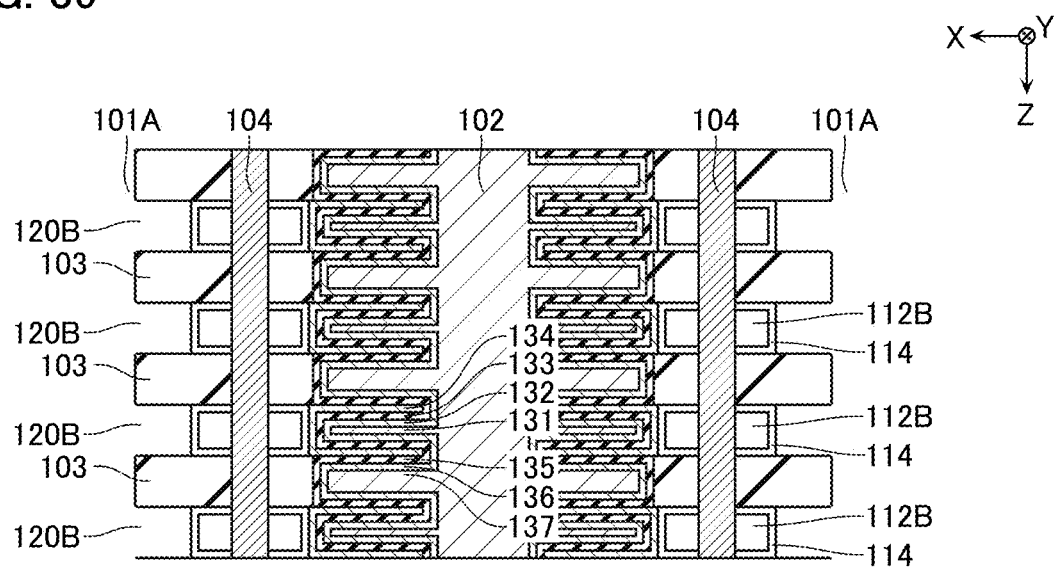
FIG. 39 is a schematic cross-sectional view for explaining the same method of manufacturing.

Next, as shown in FIGS. 38 and 39, for example, the sacrifice layer 120A within the memory cell region $R_{MC}$ is removed via the opening 101A. This step is performed by the likes of wet etching, for example. Note that in the drawings, an opening formed in a portion where the sacrifice layer 120A is provided, is indicated as an opening 120B.

Figure 40:
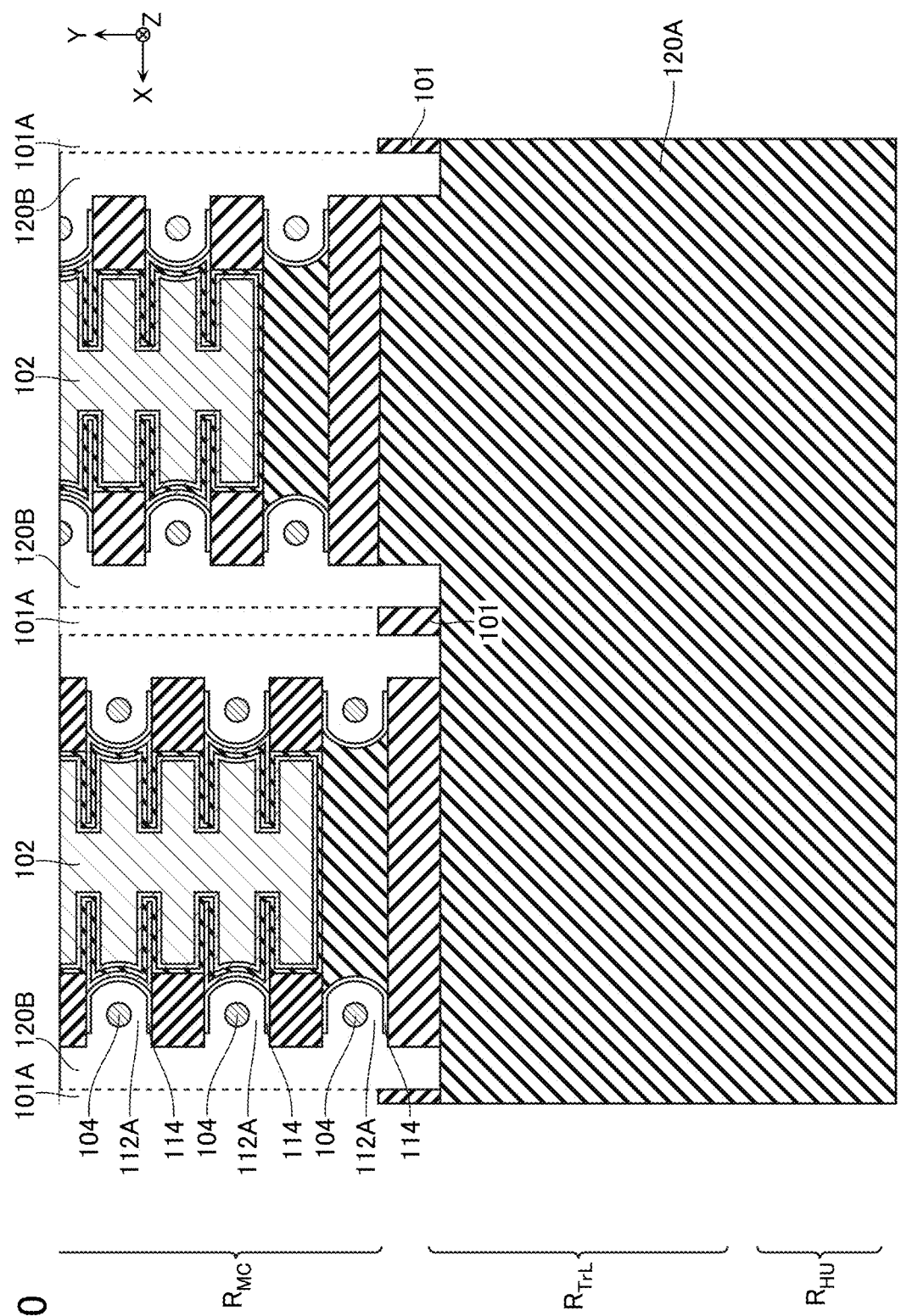
FIG. 40 is a schematic cross-sectional view for explaining the same method of manufacturing.
Figure 41:
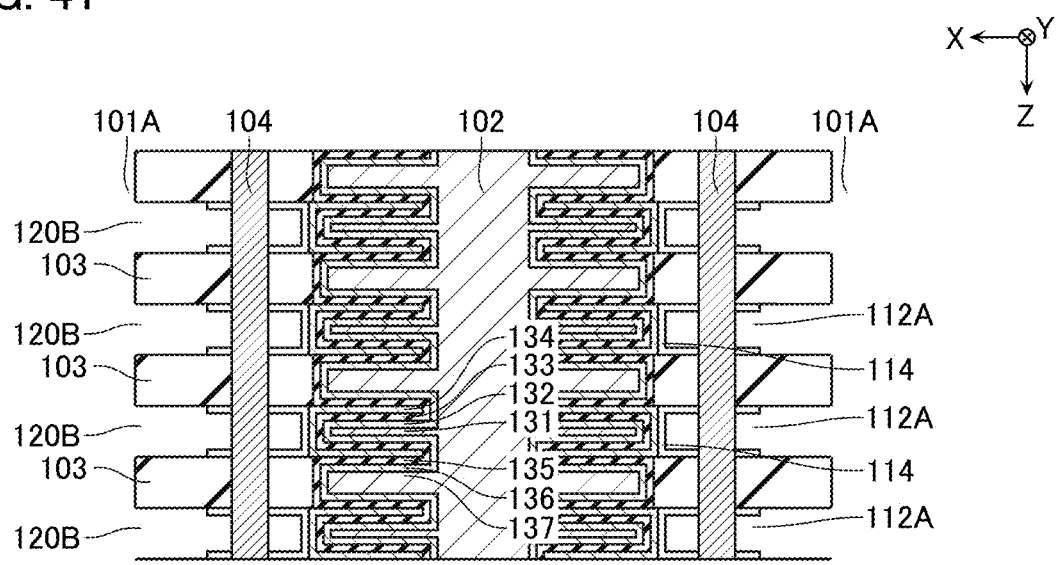
FIG. 41 is a schematic cross-sectional view for explaining the same method of manufacturing.

Next, as shown in FIGS. 40 and 41, for example, a part of the semiconductor layer 114 is removed, and a part of the sacrifice layer 112B is exposed, via the openings 101A, 120B. In addition, the sacrifice layer 112B is removed, and an outer peripheral surface of the via wiring 104 is exposed, via the openings 101A, 120B. This step is performed by the likes of wet etching, for example.

Figure 42:
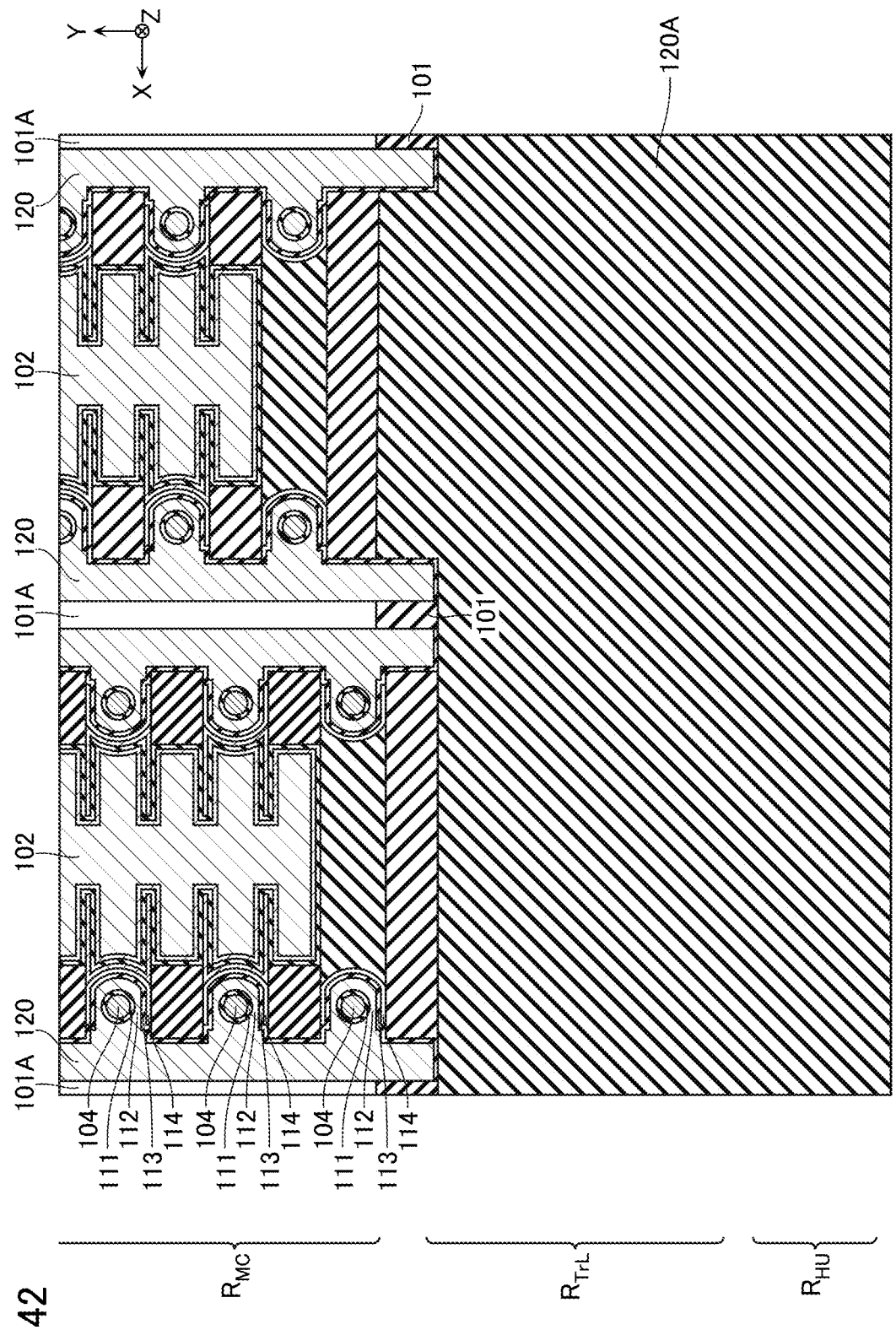
FIG. 42 is a schematic cross-sectional view for explaining the same method of manufacturing.
Figure 43:
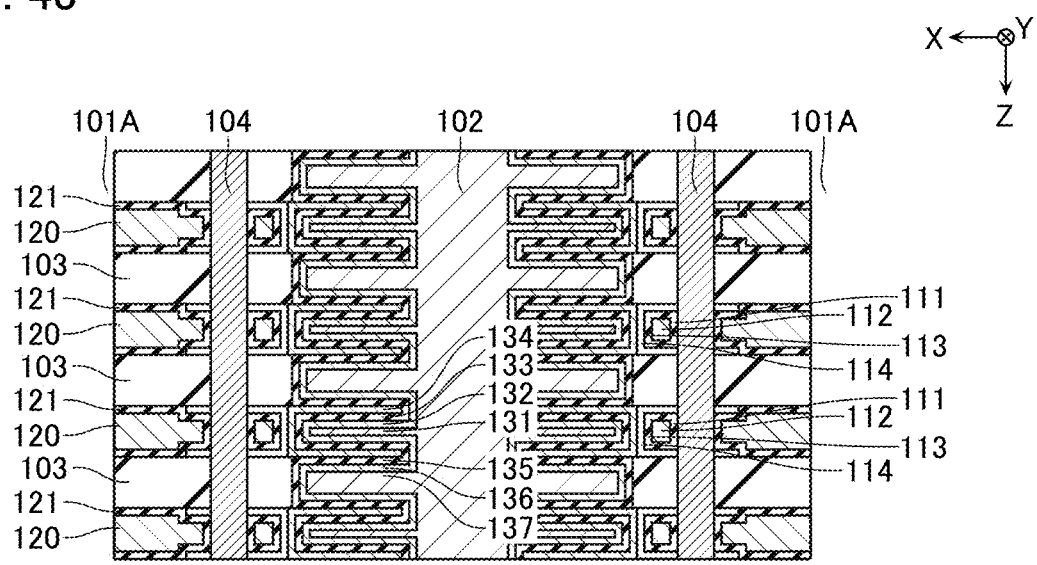
FIG. 43 is a schematic cross-sectional view for explaining the same method of manufacturing.

Next, as shown in FIGS. 42 and 43, for example, the insulating layers 111, 113, 121 are formed, and the conductive layers 112, 120 are formed, inside the opening 120B. In this step, insulating layers and conductive layers are formed in the openings 101A, 120B by the likes of CVD, for example. At this time, the opening 120B is filled in by the conductive layers. On the other hand, the opening 101A is not filled in by the conductive layers. Next, portions provided on a side surface in the X-direction of the insulating layer 103 and a side surface in the Y-direction of the insulating layer 101, of these insulating layers and conductive layers, are removed by the likes of wet etching, for example.

Figure 44:
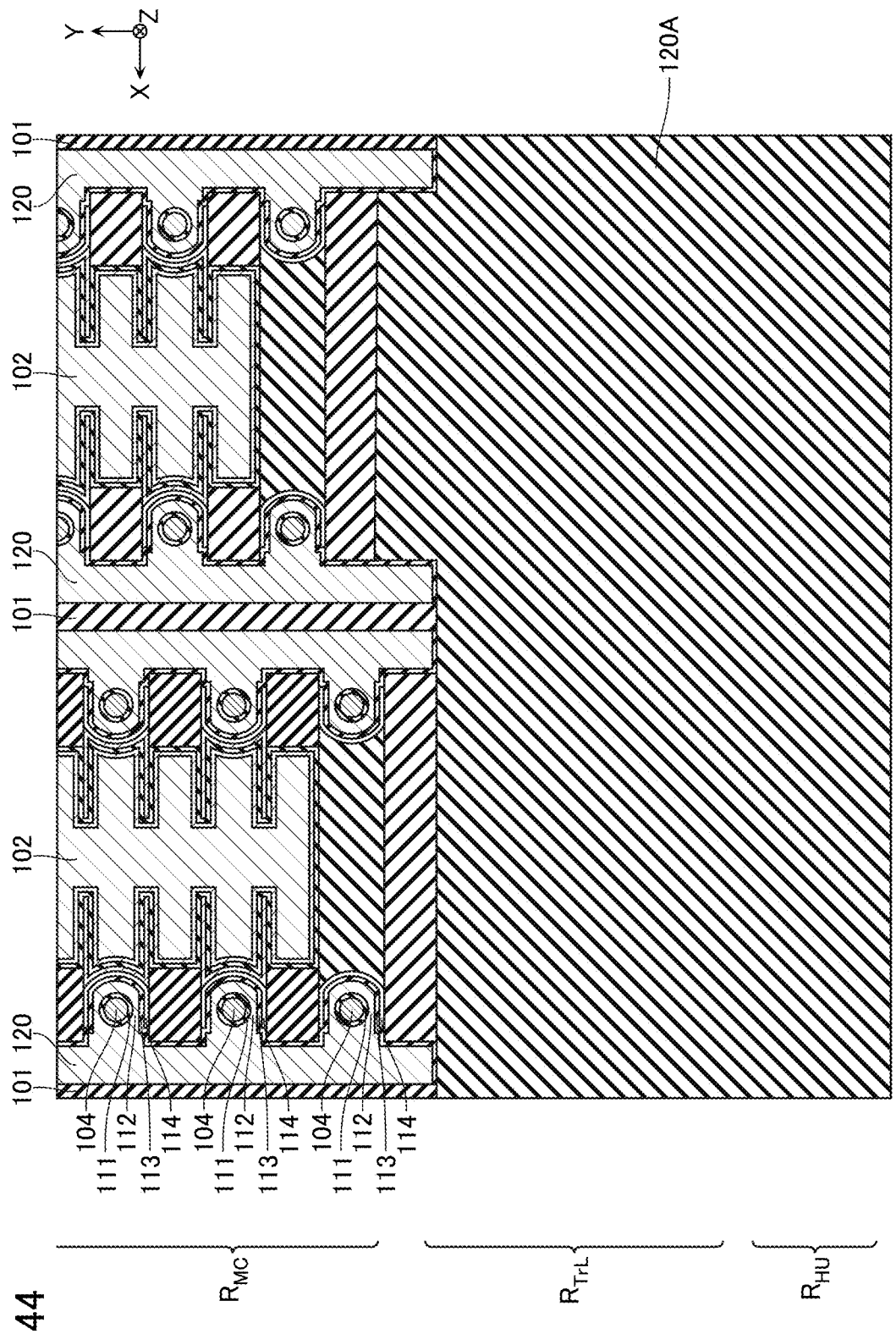
FIG. 44 is a schematic cross-sectional view for explaining the same method of manufacturing.

Next, as shown in FIG. 44, for example, a part of the insulating layer 101 is formed. This step is performed by the likes of CVD, for example.

Next, an unillustrated opening is formed at a position on an opposite side to the memory cell region $R_{MC}$, of the hook-up region $R_{HU}$. This opening extends in the Z-direction and the X-direction, and penetrates the plurality of insulating layers 103 and the plurality of sacrifice layers 120A arranged in the Z-direction. This step is performed by the likes of RIE, for example.

Figure 45:
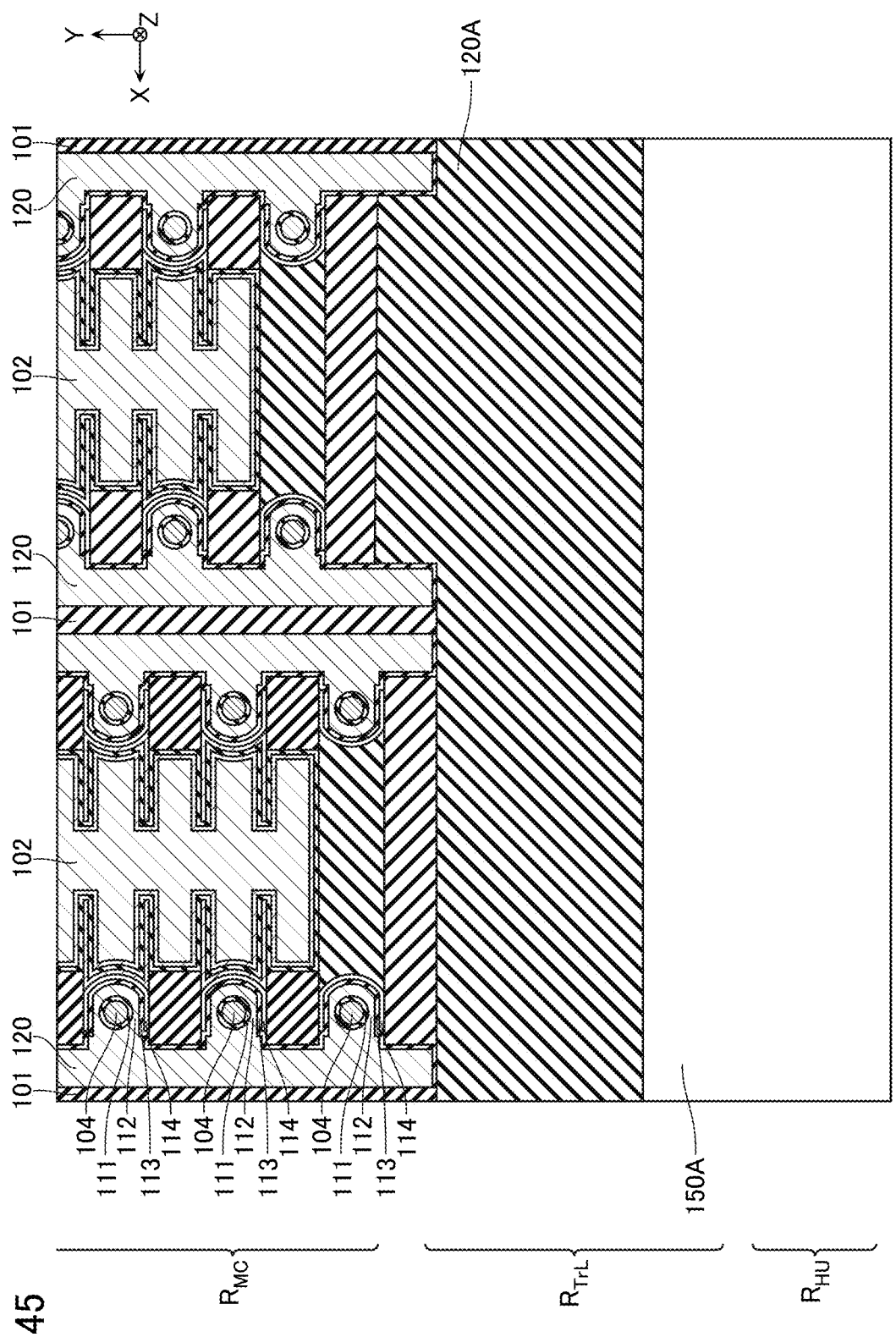
FIG. 45 is a schematic cross-sectional view for explaining the same method of manufacturing.
Figure 46:
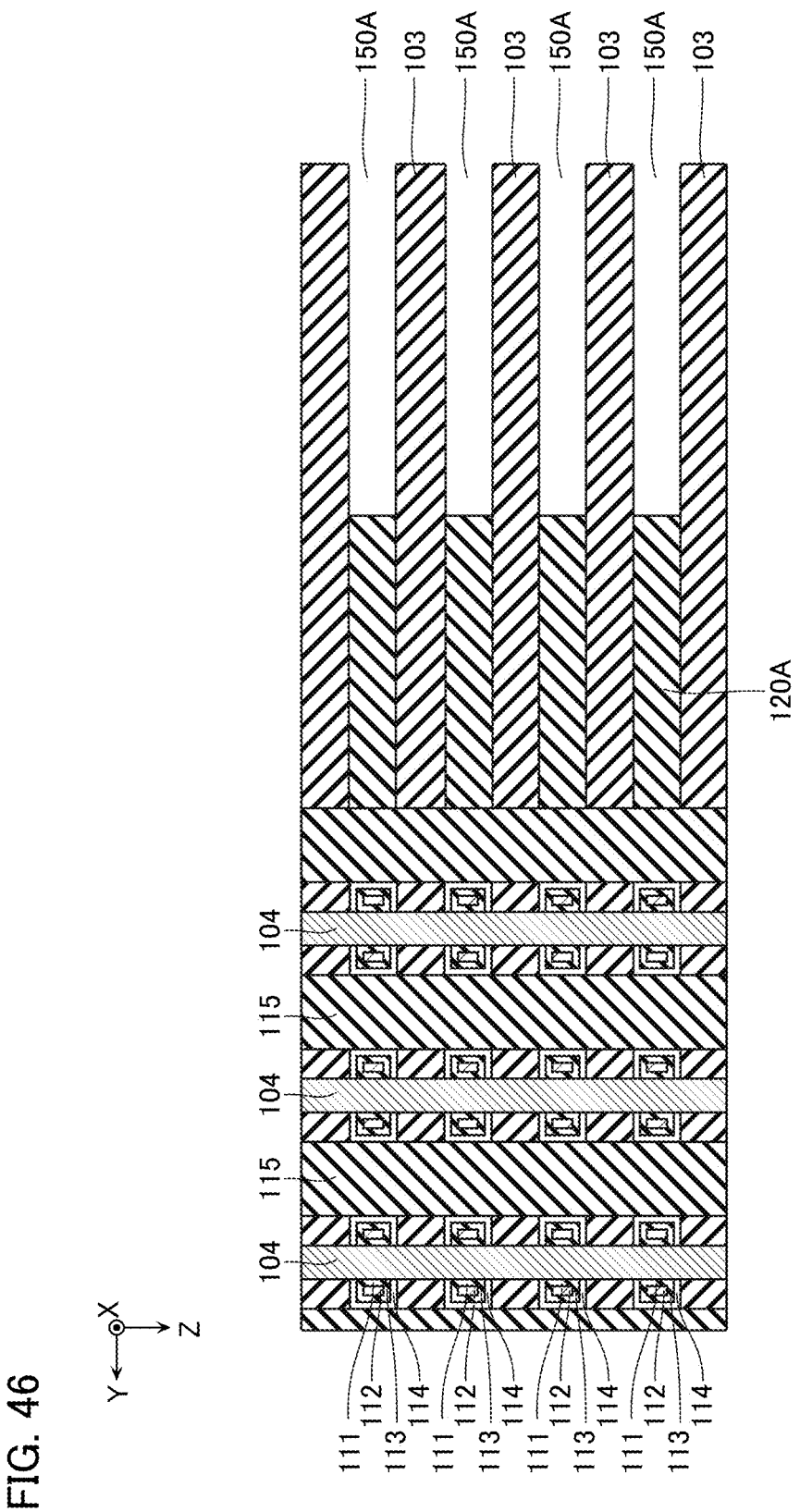
FIG. 46 is a schematic cross-sectional view for explaining the same method of manufacturing.

Next, as shown in FIGS. 45 and 46, for example, a part of the sacrifice layer 120A is selectively removed via the unillustrated opening. In this step, a portion provided within the hook-up region $R_{HU}$ and a portion corresponding to the conductive layer 150, of the sacrifice layer 120A, are removed. This step is performed by the likes of wet etching, for example. Note that in the drawings, an opening formed in a portion where the sacrifice layer 120A is provided, is indicated as an opening 150A.

Figure 47:
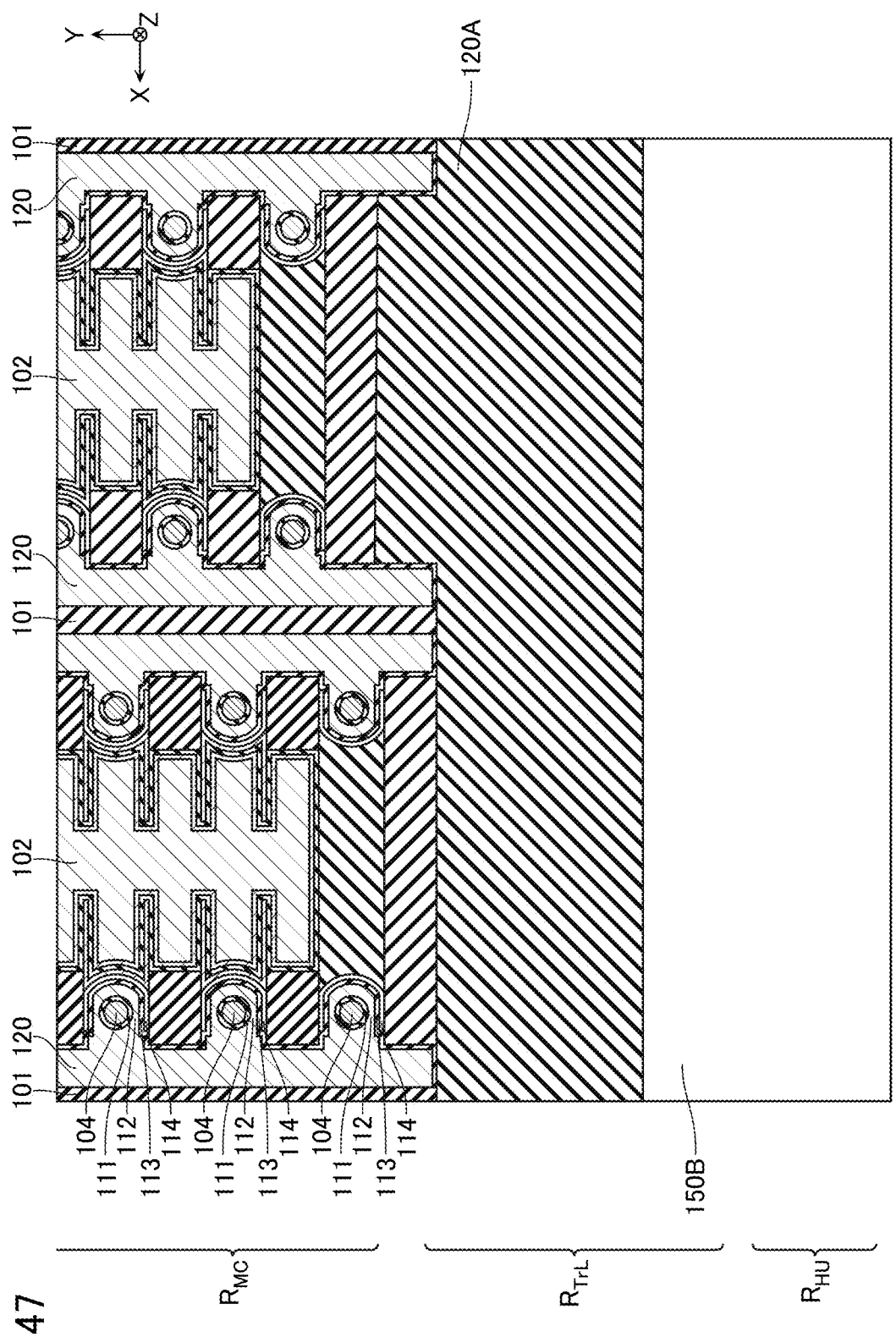
FIG. 47 is a schematic cross-sectional view for explaining the same method of manufacturing.
Figure 48:
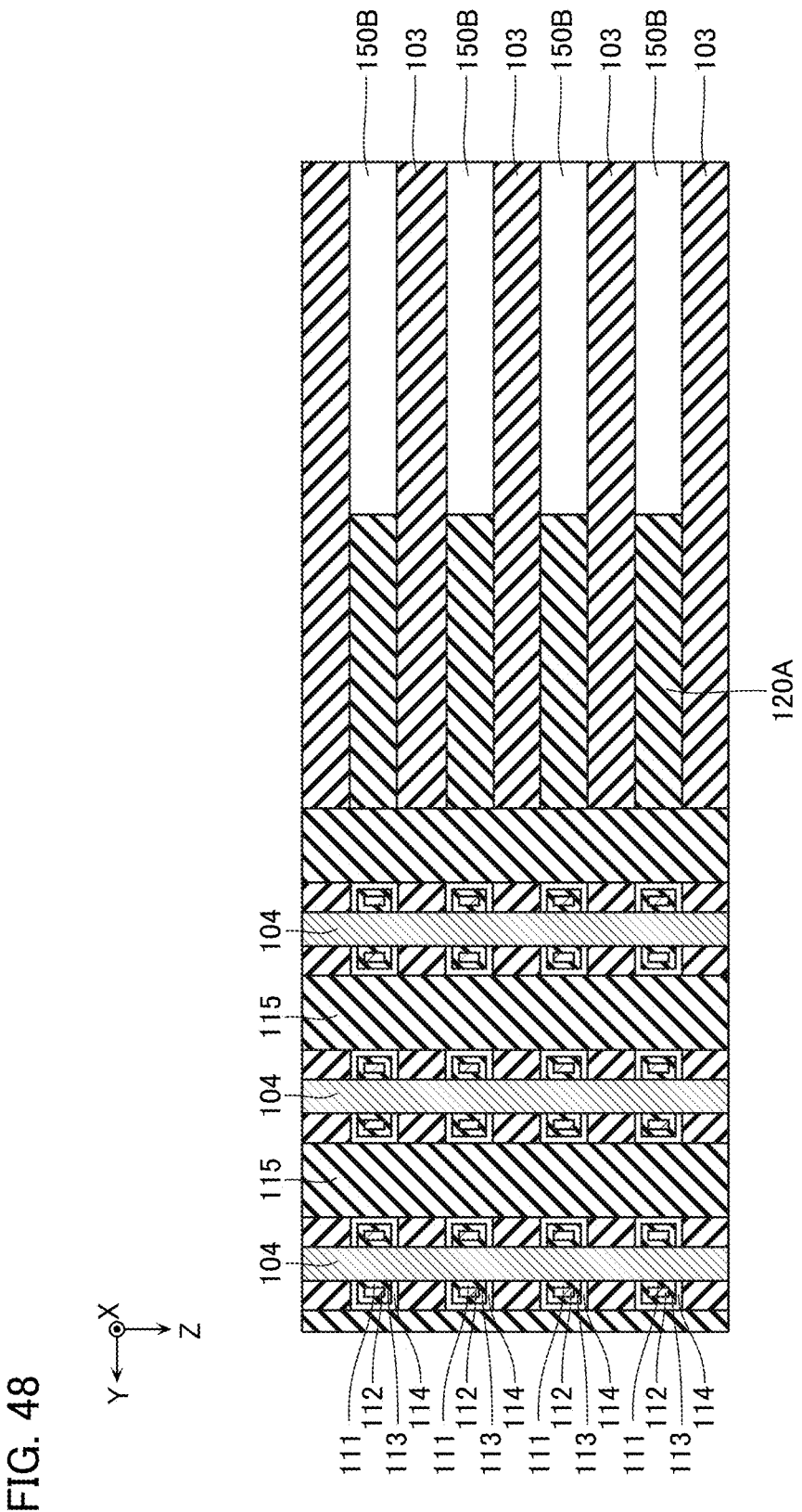
FIG. 48 is a schematic cross-sectional view for explaining the same method of manufacturing.

Next, as shown in FIGS. 47 and 48, for example, a sacrifice layer 150B is formed inside the opening 150A. The sacrifice layer 150B includes the likes of silicon (Si), for example. This step is performed by the likes of CVD, for example.

Figure 49:
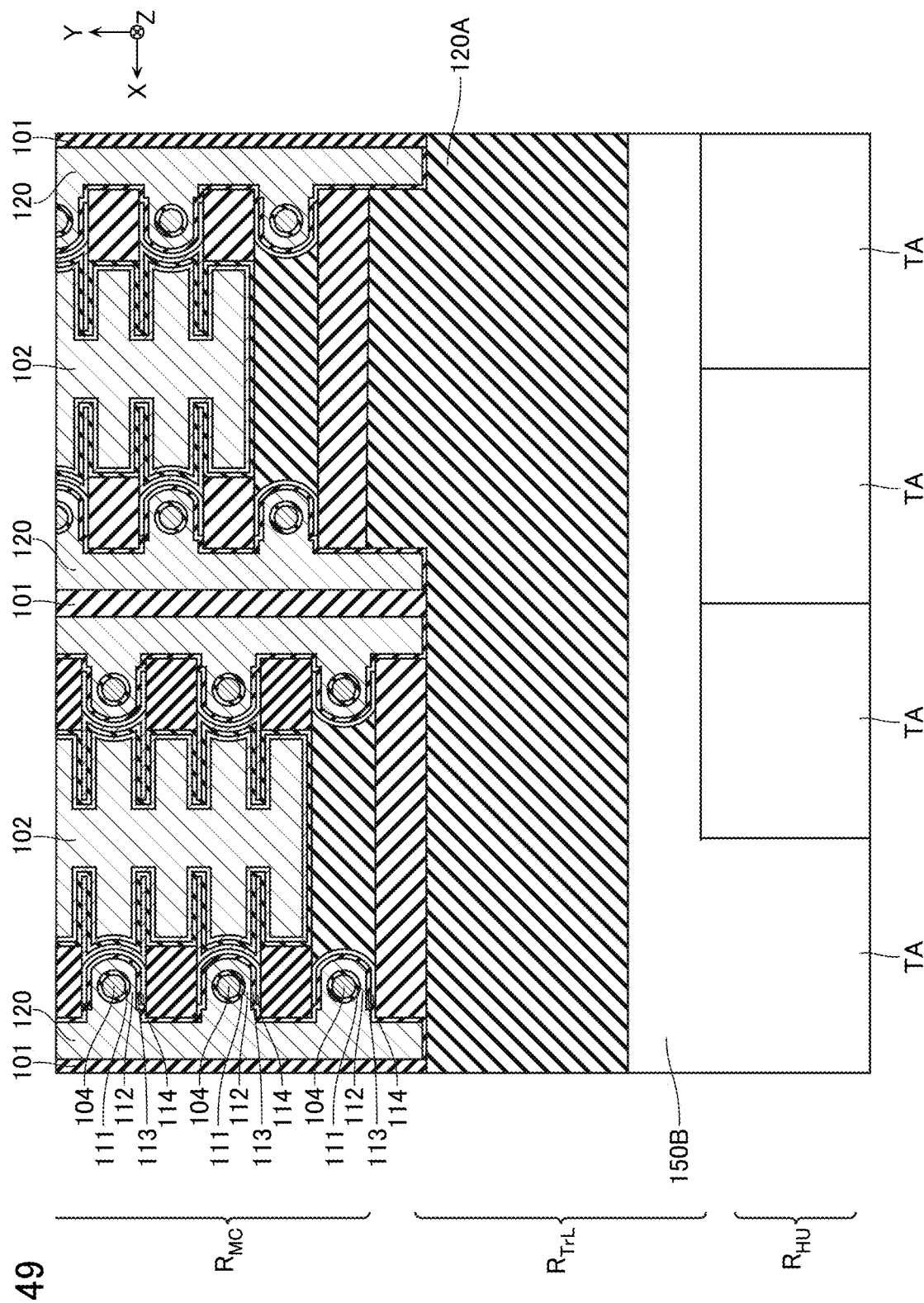
FIG. 49 is a schematic cross-sectional view for explaining the same method of manufacturing.
Figure 50:
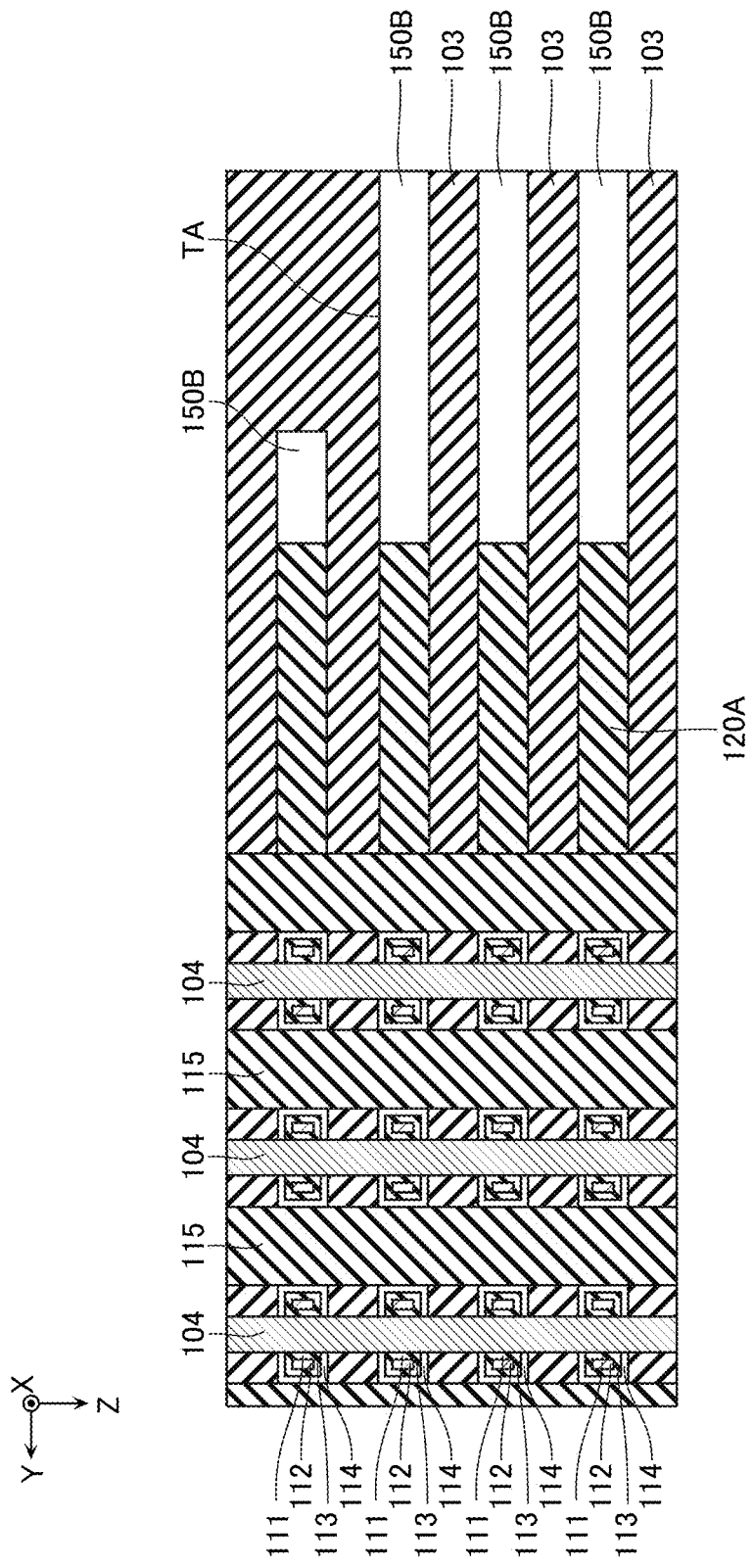
FIG. 50 is a schematic cross-sectional view for explaining the same method of manufacturing.

Next, as shown in FIGS. 49 and 50, for example, parts of the plurality of insulating layers 103 and the plurality of sacrifice layers 150B are removed in the hook-up region $R_{HU}$, to comprise a plurality of terrace portions TA corresponding to the plurality of sacrifice layers 150B. The terrace portion TA is a region of an upper surface of the sacrifice layer 150B that, viewing from below, does not overlap another sacrifice layer 150B.

In this step, for example, a resist exposing a part of the hook-up region $R_{HU}$ is formed above a structure of the kind shown in FIGS. 47 and 48. Next, the sacrifice layer 150B is selectively removed by a method such as RIE (Reactive Ion Etching). Next, the insulating layer 103 is selectively removed by a method such as RIE. As a result, a part of an upper surface of the second sacrifice layer 150B counting from above, is exposed.

Next, a part of the resist is removed by a method such as wet etching. Next, the sacrifice layer 150B is selectively removed by a method such as RIE. Next, the insulating layer 103 is selectively removed by a method such as RIE. As a result, parts of upper surfaces of the second and third sacrifice layers 150B counting from above, are exposed.

Removal of a part of the resist, selective removal of the sacrifice layer 150B, and selective removal of the insulating layer 103 are likewise repeatedly performed thereafter. As a result, parts of upper surfaces of all of the sacrifice layers 150B are exposed, and the plurality of terrace portions TA are formed. Note that after formation of the plurality of terrace portions TA, insulating layers of the likes of silicon oxide (SiO$_2$) are formed in a region above the plurality of terrace portions TA, as shown in FIG. 50.

Figure 51:
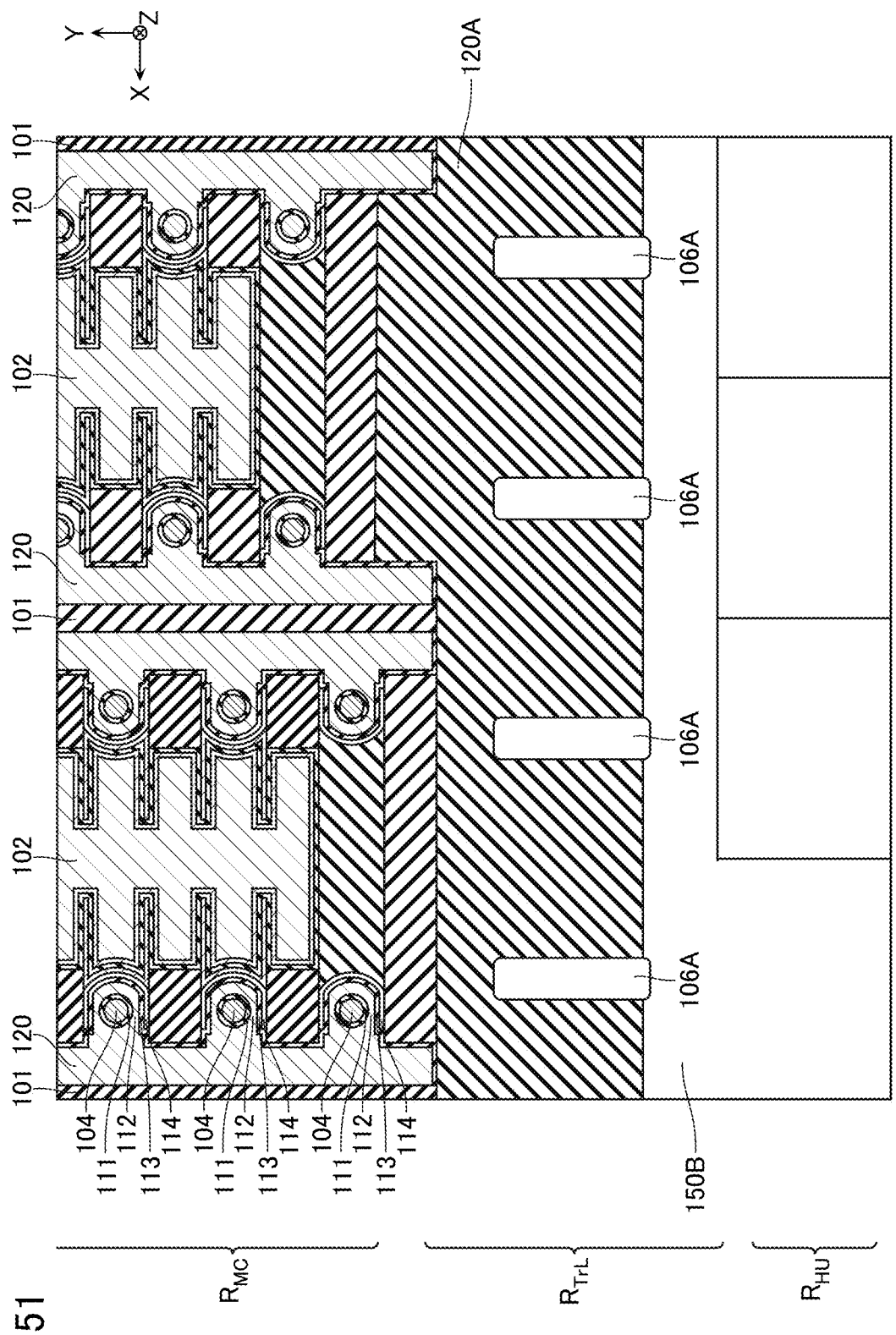
FIG. 51 is a schematic cross-sectional view for explaining the same method of manufacturing.
Figure 52:
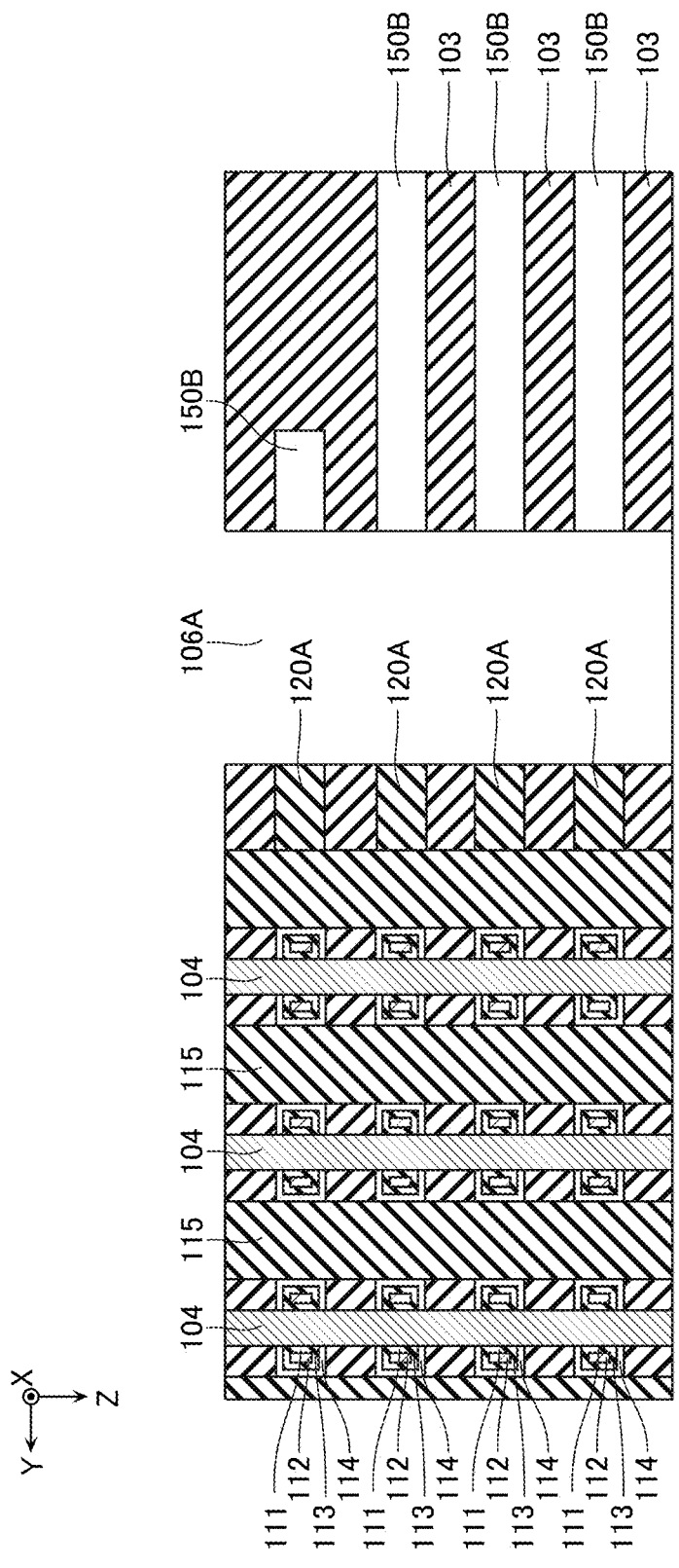
FIG. 52 is a schematic cross-sectional view for explaining the same method of manufacturing.

Next, as shown in FIGS. 51 and 52, for example, an opening 106A is formed at a position corresponding to the via wiring 106. The opening 106A extends in the Z-direction and penetrates the plurality of insulating layers 103 and the plurality of sacrifice layers 120A arranged in the Z-direction, as shown in FIG. 52. This step is performed by the likes of RIE, for example.

Figure 53:
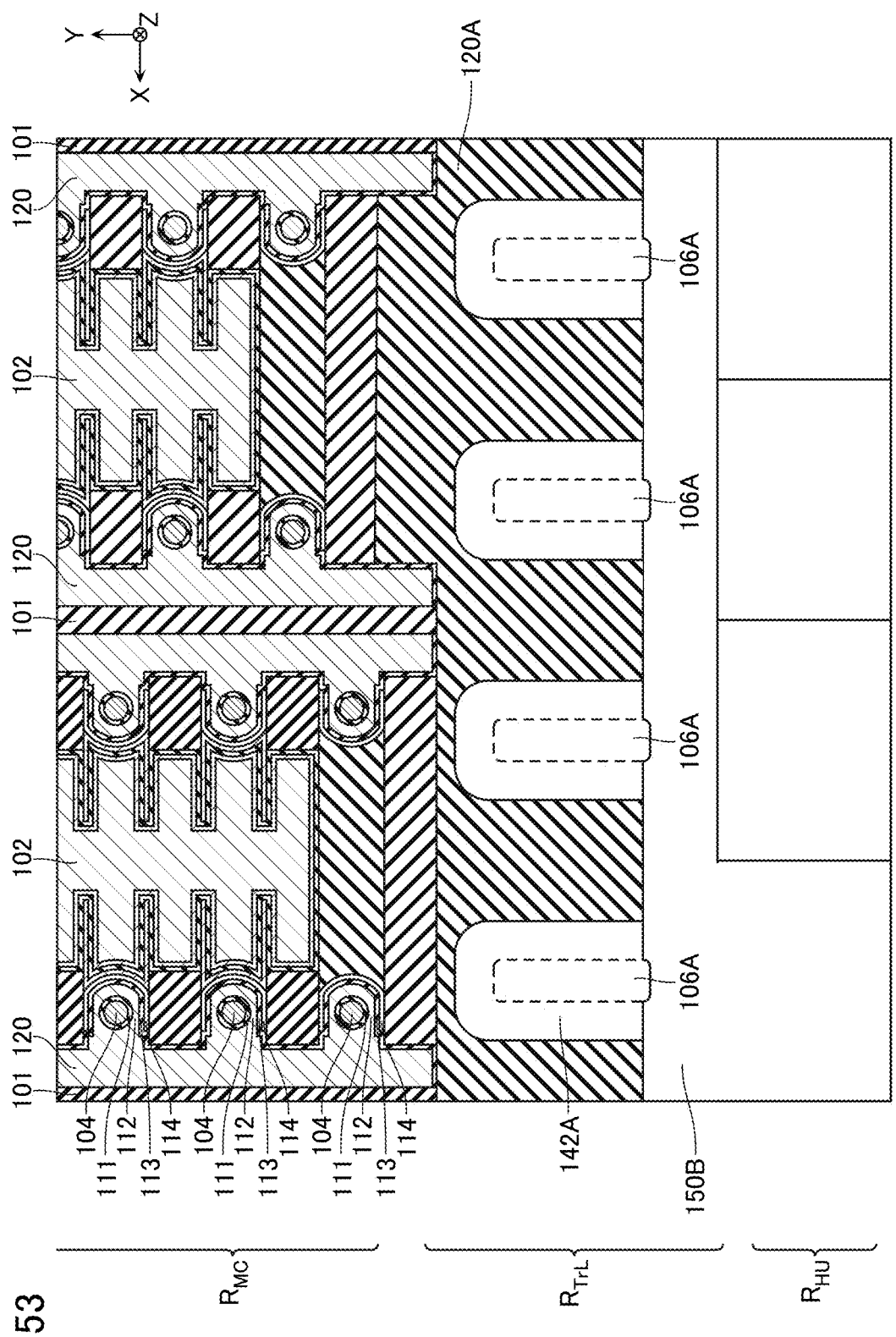
FIG. 53 is a schematic cross-sectional view for explaining the same method of manufacturing.
Figure 54:
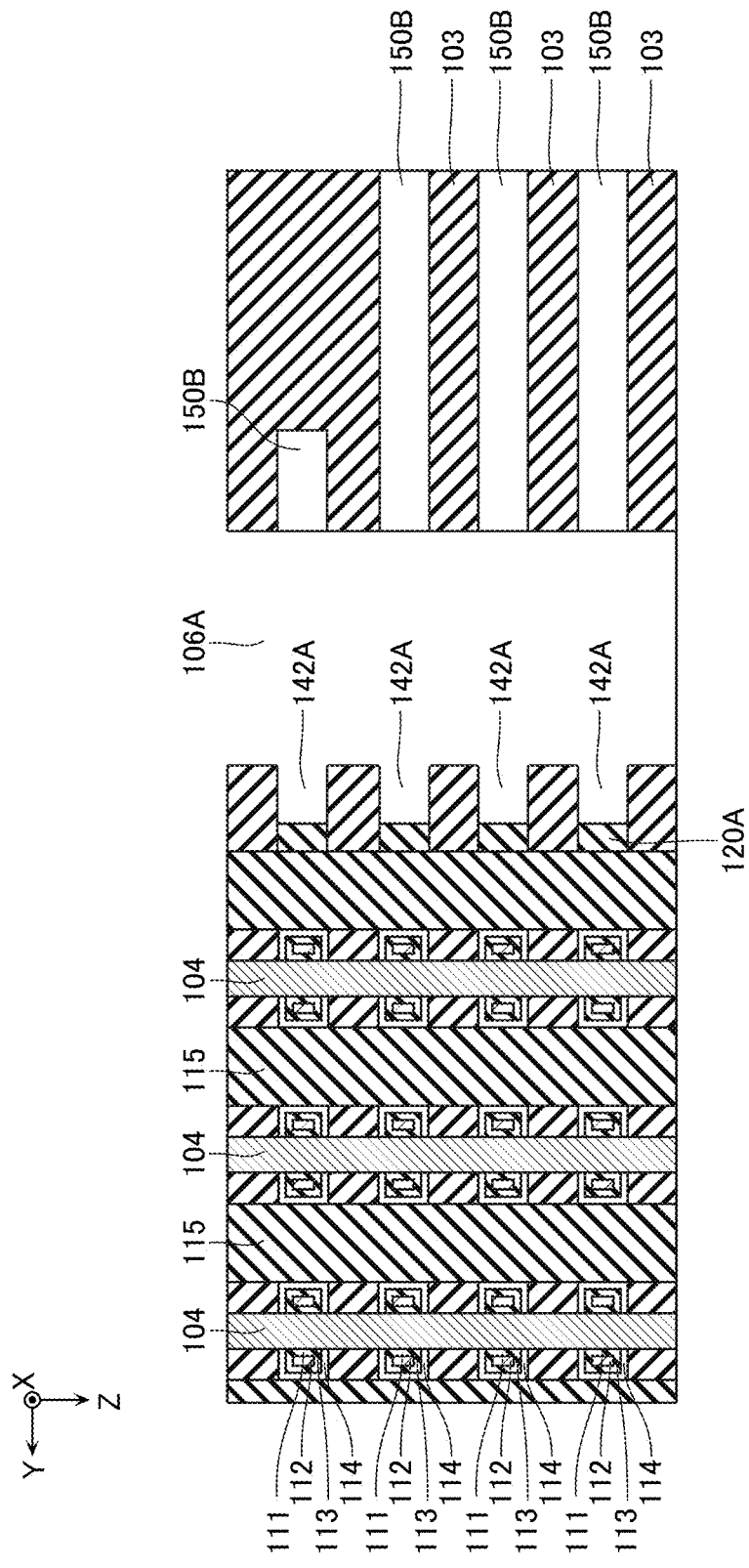
FIG. 54 is a schematic cross-sectional view for explaining the same method of manufacturing.

Next, as shown in FIGS. 53 and 54, for example, a part of the sacrifice layer 120A is selectively removed via the opening 106A. This step is performed by the likes of wet etching, for example. Note that in the drawings, an opening formed in a portion where the sacrifice layer 120A is provided, is indicated as an opening 142A.

Figure 55:
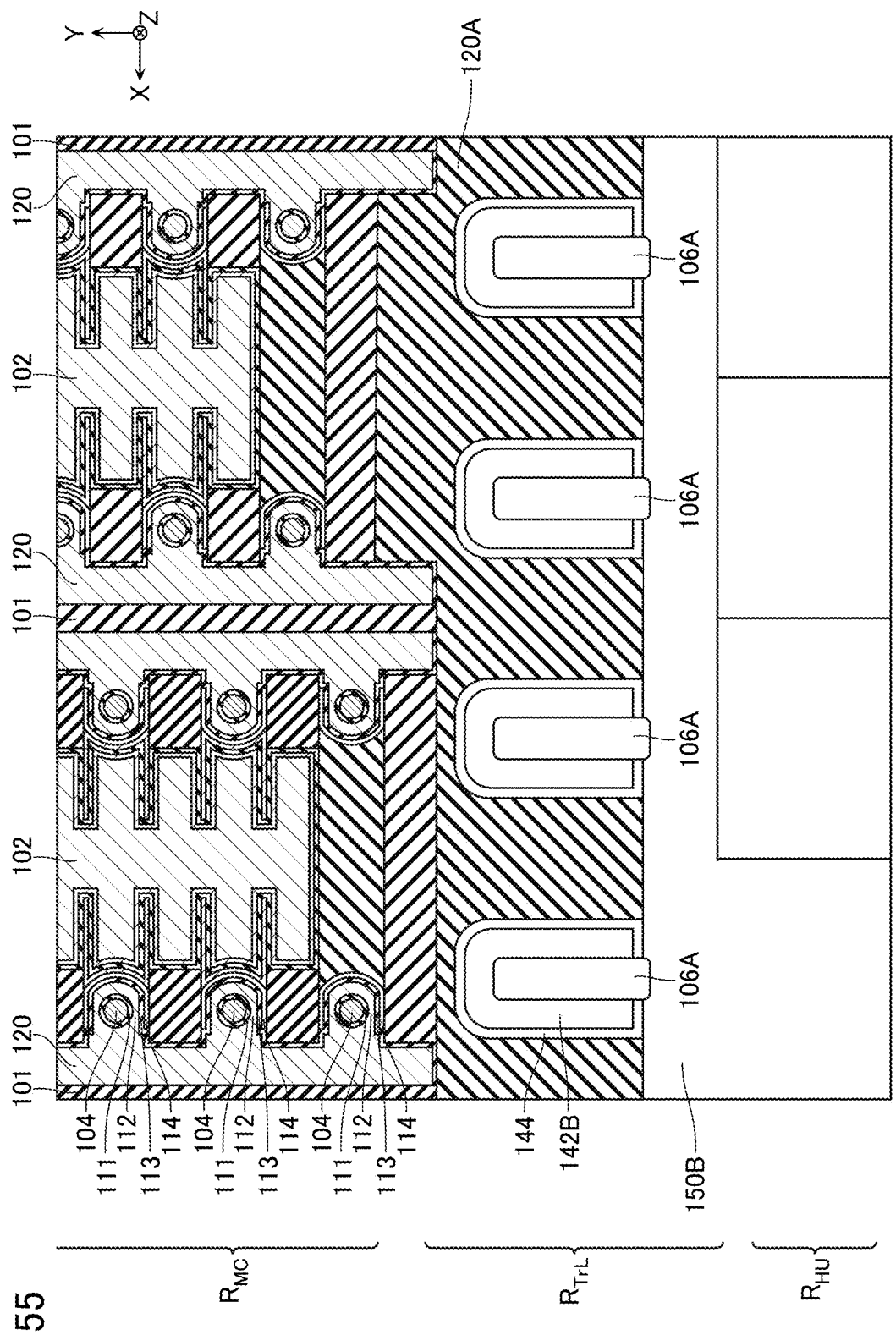
FIG. 55 is a schematic cross-sectional view for explaining the same method of manufacturing.
Figure 56:
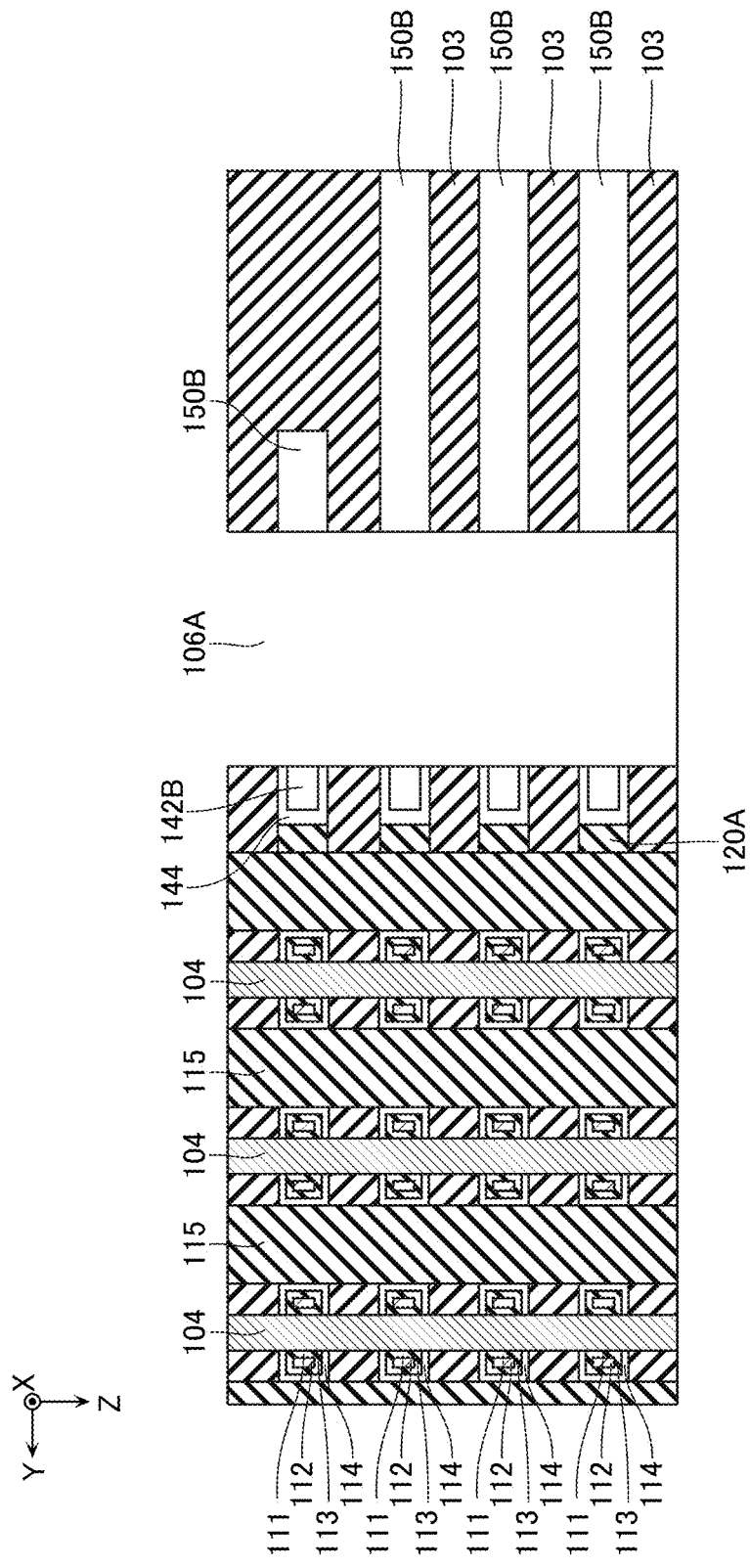
FIG. 56 is a schematic cross-sectional view for explaining the same method of manufacturing.

Next, as shown in FIGS. 55 and 56, for example, the semiconductor layer 144 and a sacrifice layer 142B are formed inside the opening 142A.

In this step, the semiconductor layer 144 is formed on side surfaces in the X-direction and the Y-direction of the sacrifice layer 120A, a side surface in the Y-direction of the sacrifice layer 150B, and an upper surface, a lower surface, and a side surface of the insulating layer 103, via the openings 106A, 142A. In addition, the sacrifice layer 142B is formed in the opening 142A. In this step, the opening 142A is filled in by the sacrifice layer 142B. On the other hand, the opening 106A is not filled in by the sacrifice layer 142B. This step is performed by the likes of ALD and CVD, for example.

Moreover, in this step, a part of the sacrifice layer 142B is removed via the opening 106A, a portion provided on the side surface of the insulating layer 103, of the semiconductor layer 144 is exposed, and this portion is removed. This step is performed by the likes of wet etching, for example.

Figure 57:
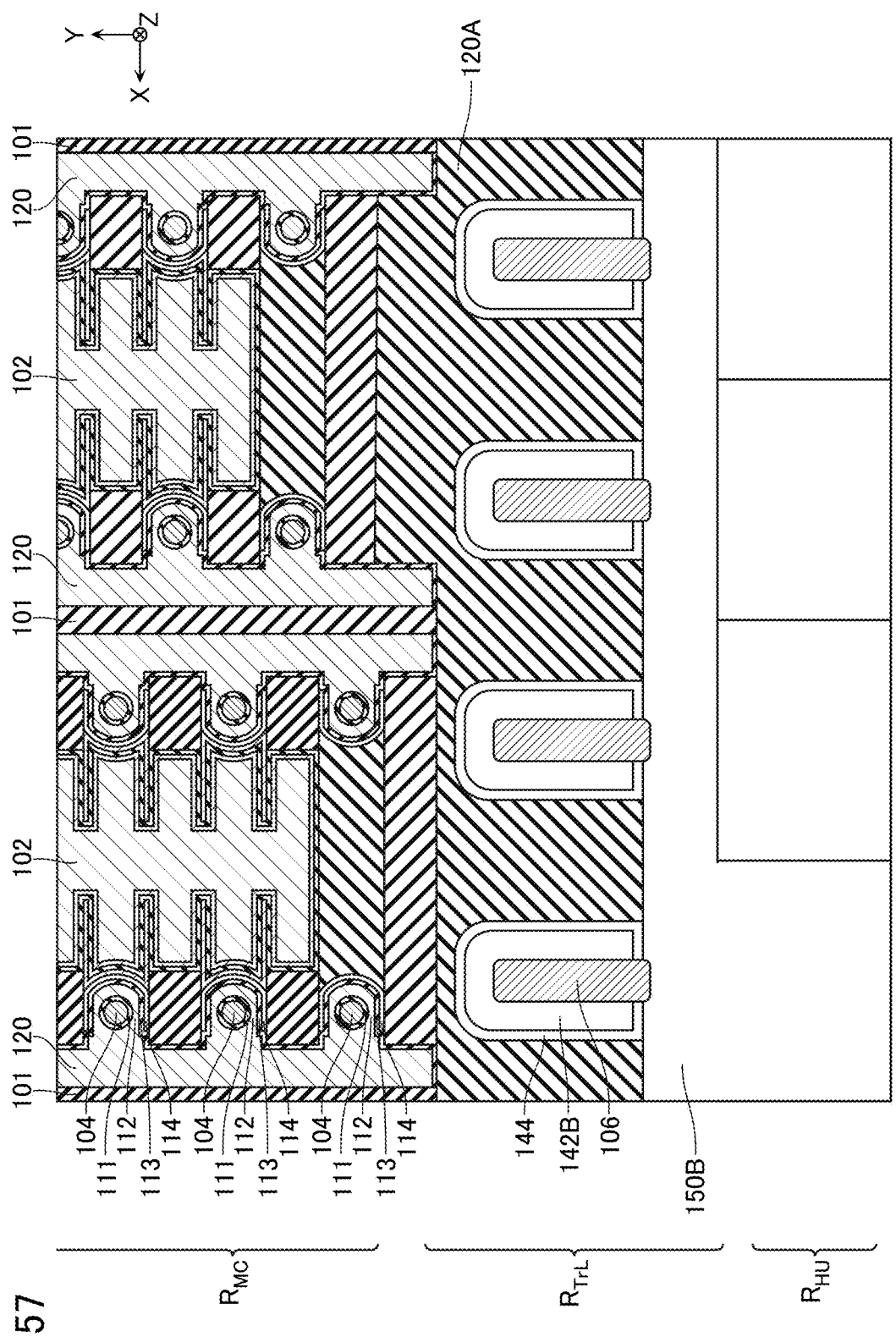
FIG. 57 is a schematic cross-sectional view for explaining the same method of manufacturing.
Figure 58:
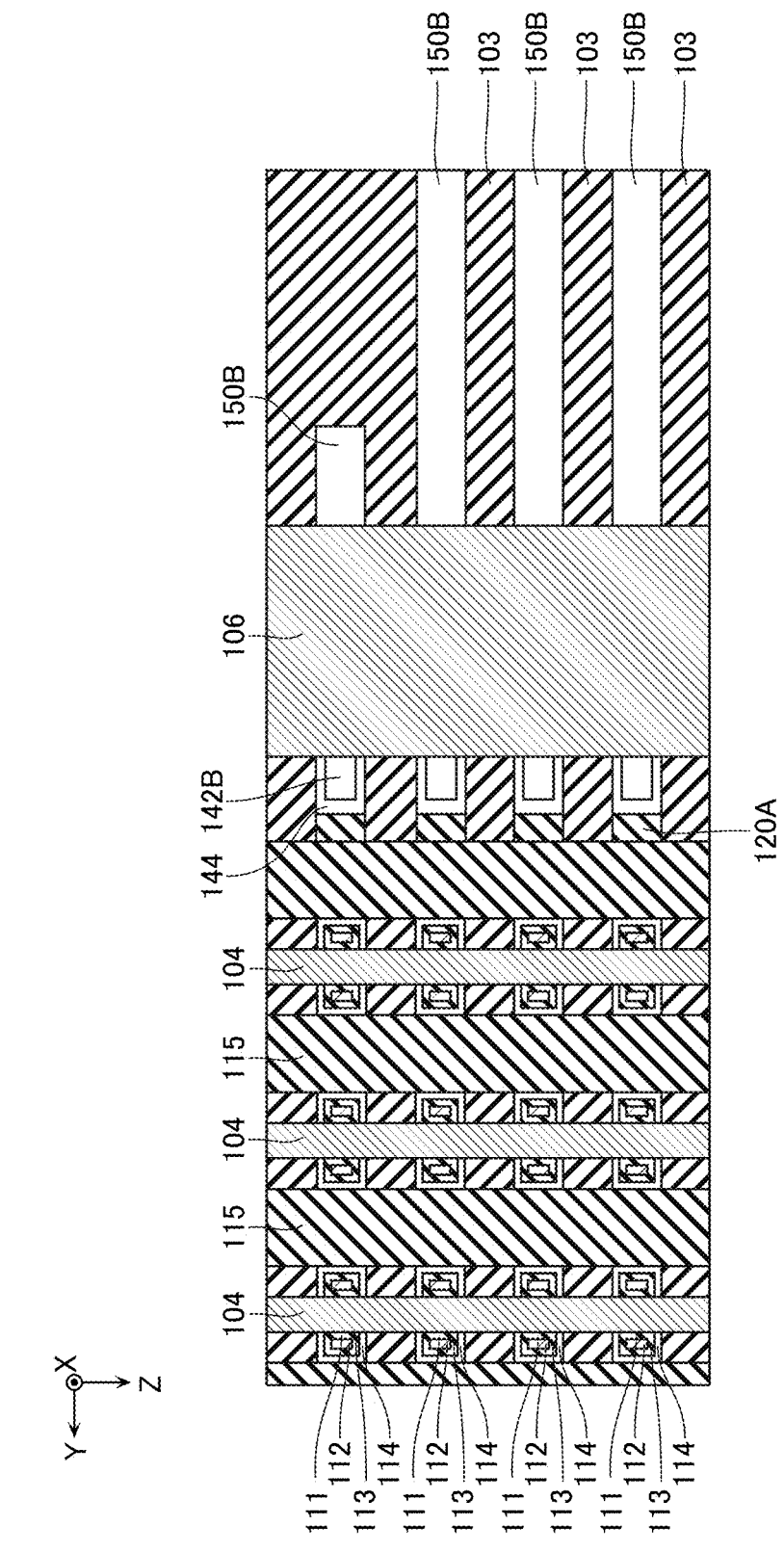
FIG. 58 is a schematic cross-sectional view for explaining the same method of manufacturing.

Next, as shown in FIGS. 57 and 58, for example, the via wiring 106 is formed inside the opening 106A. This step is performed by the likes of ALD and CVD, for example.

Figure 59:
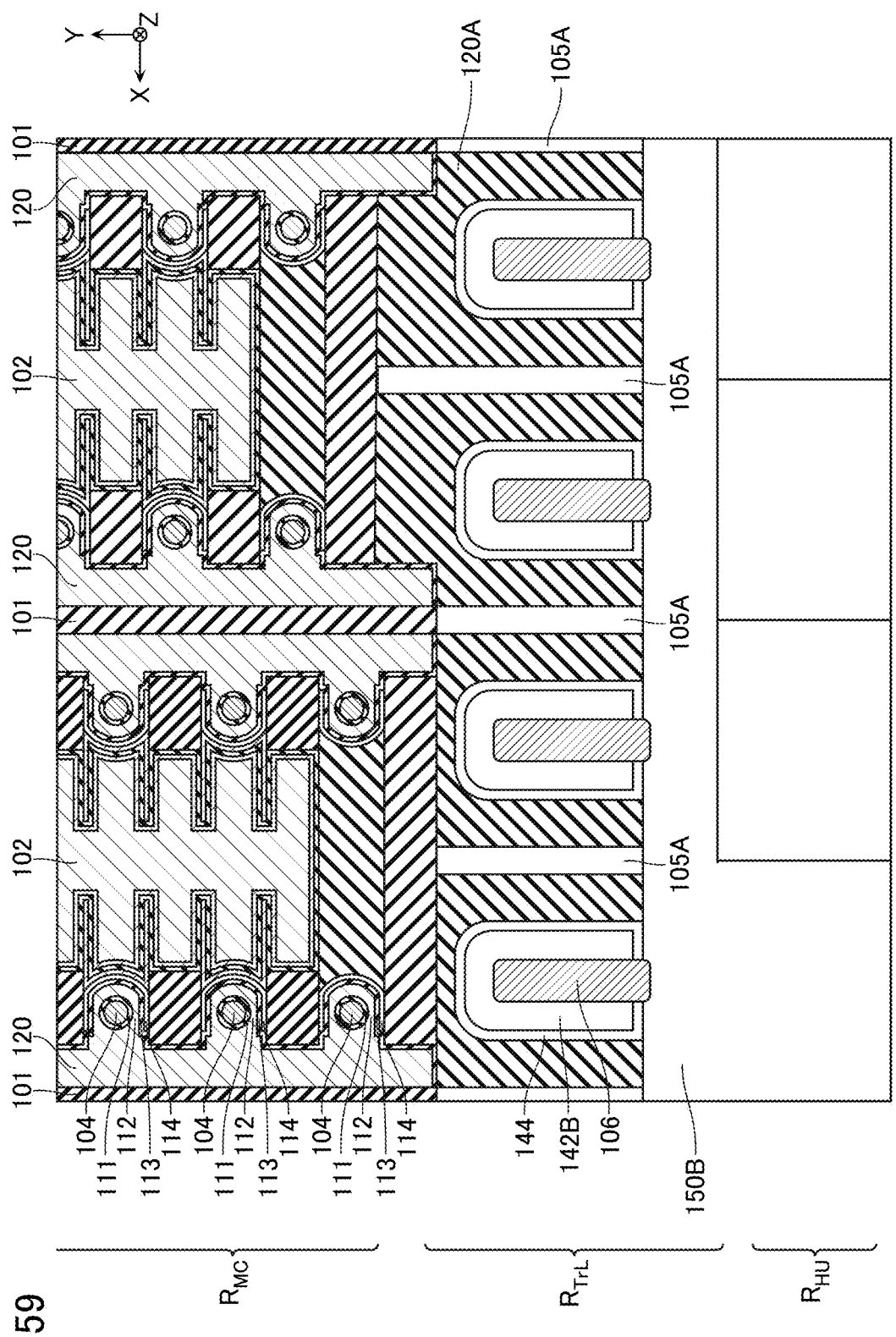
FIG. 59 is a schematic cross-sectional view for explaining the same method of manufacturing.

Next, as shown in FIG. 59, for example, an opening 105A is formed in a region within the transistor region $R_{T\prime L}$, of the position corresponding to the insulating layer 101, and at a position corresponding to the insulating layer 105. The opening 105A extends in the Z-direction and penetrates the plurality of insulating layers 103 and the plurality of sacrifice layers 120A arranged in the Z-direction, to divide these configurations in the X-direction. This step is performed by the likes of RIE, for example.

Figure 60:
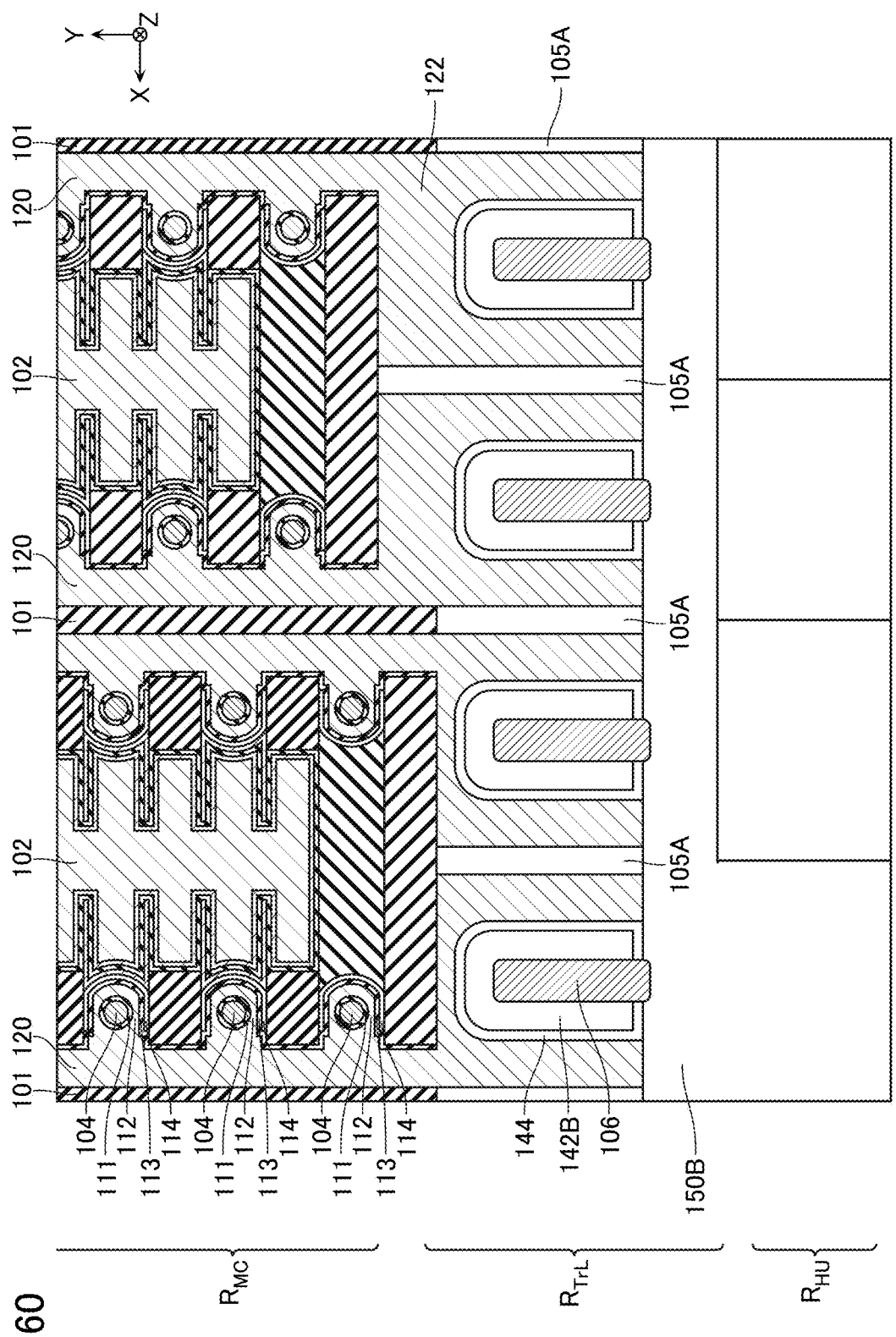
FIG. 60 is a schematic cross-sectional view for explaining the same method of manufacturing.
Figure 61:
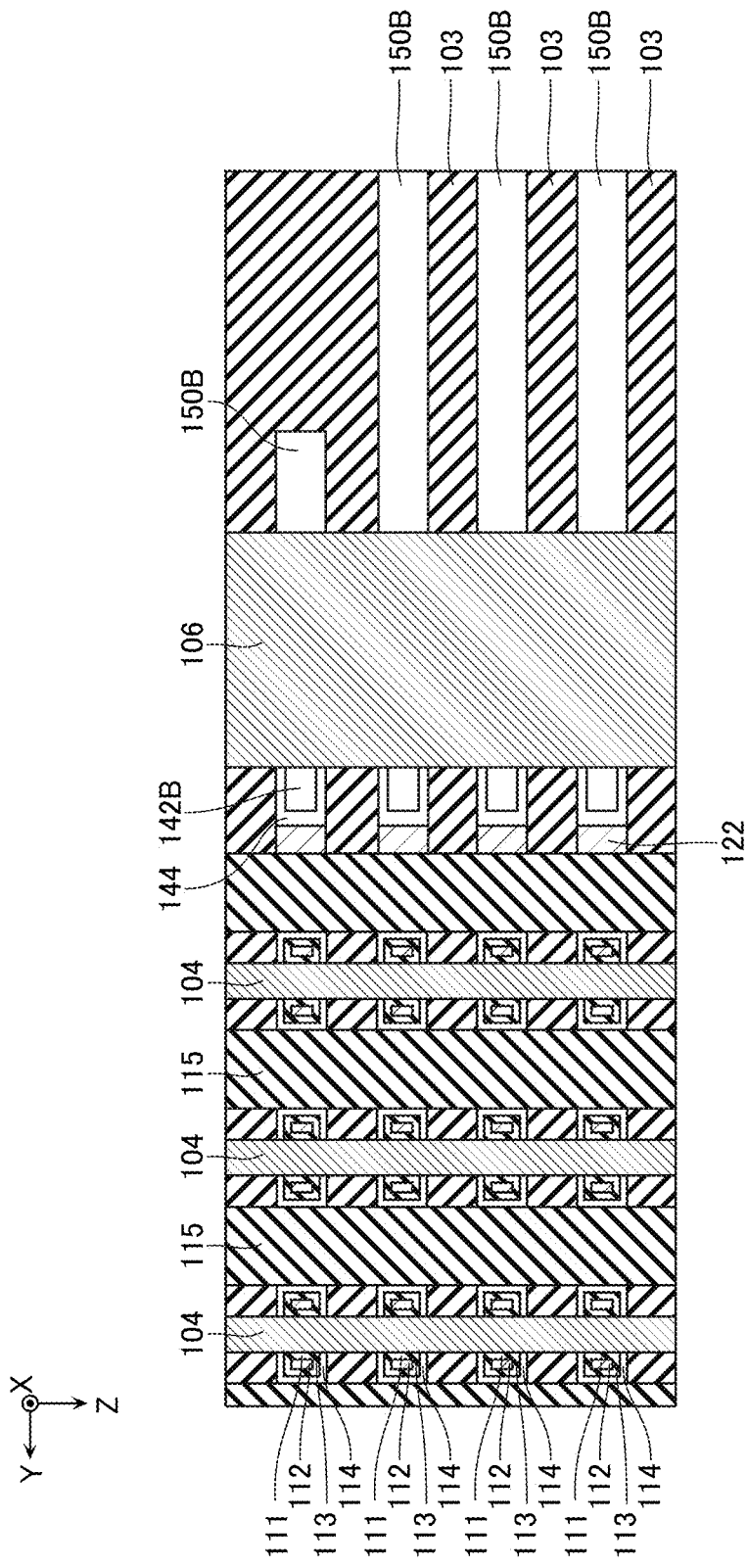
FIG. 61 is a schematic cross-sectional view for explaining the same method of manufacturing.

Next, as shown in FIGS. 60 and 61, for example, the conductive layer 122 is formed.

In this step, the sacrifice layer 120A within the transistor region $R_{T\prime L}$ is removed via the opening 105A. This step is performed by the likes of wet etching, for example. Now, in the case where there remains the insulating layer 121, this insulating layer 121 too is removed.

Moreover, in this step, the conductive layer 122 is formed, via the opening 105A, in a region where the sacrifice layer 120A is formed. This step is performed by the likes of CVD, for example.

Figure 62:
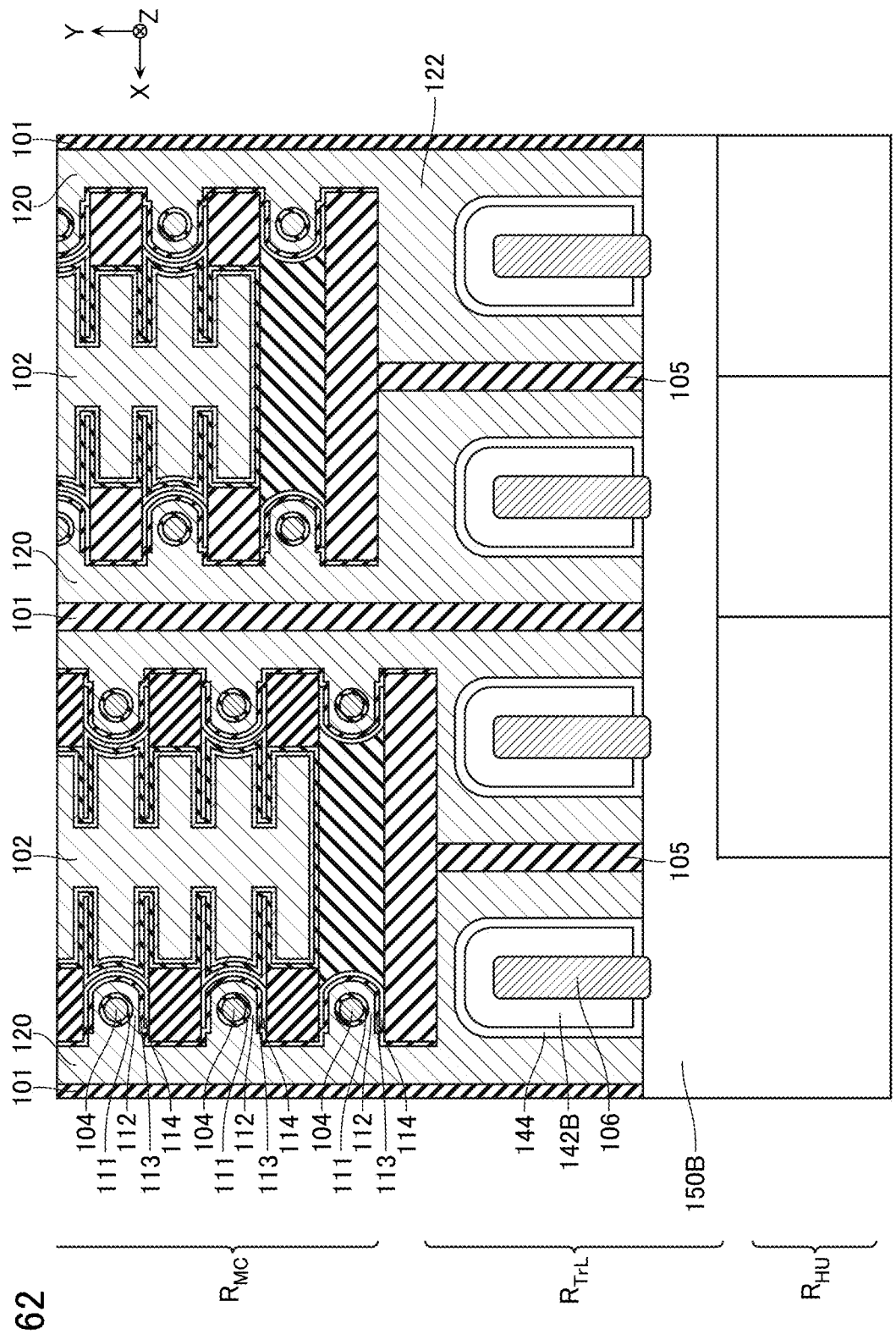
FIG. 62 is a schematic cross-sectional view for explaining the same method of manufacturing.

Next, as shown in FIG. 62, for example, the insulating layers 101, 105 are formed inside the opening 105A. This step is performed by the likes of CVD, for example.

Figure 63:
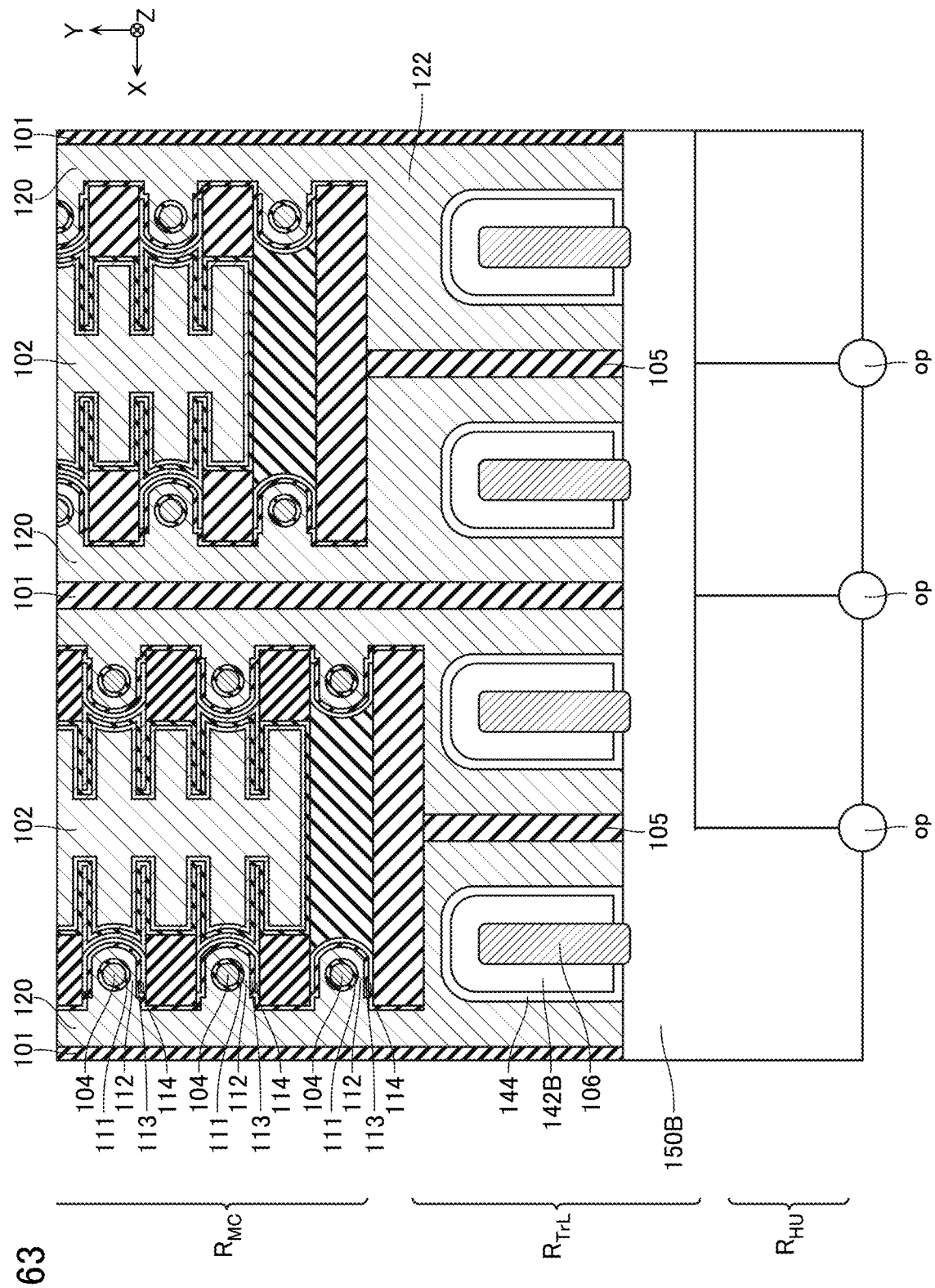
FIG. 63 is a schematic cross-sectional view for explaining the same method of manufacturing.

Next, as shown in FIG. 63, for example, a plurality of openings op arranged in the X-direction, are formed in the hook-up region $R_{HU}$. The opening op extends in the Z-direction and penetrates the plurality of insulating layers 103 and the plurality of sacrifice layers 150B arranged in the Z-direction. This step is performed by the likes of RIE, for example.

Figure 64:
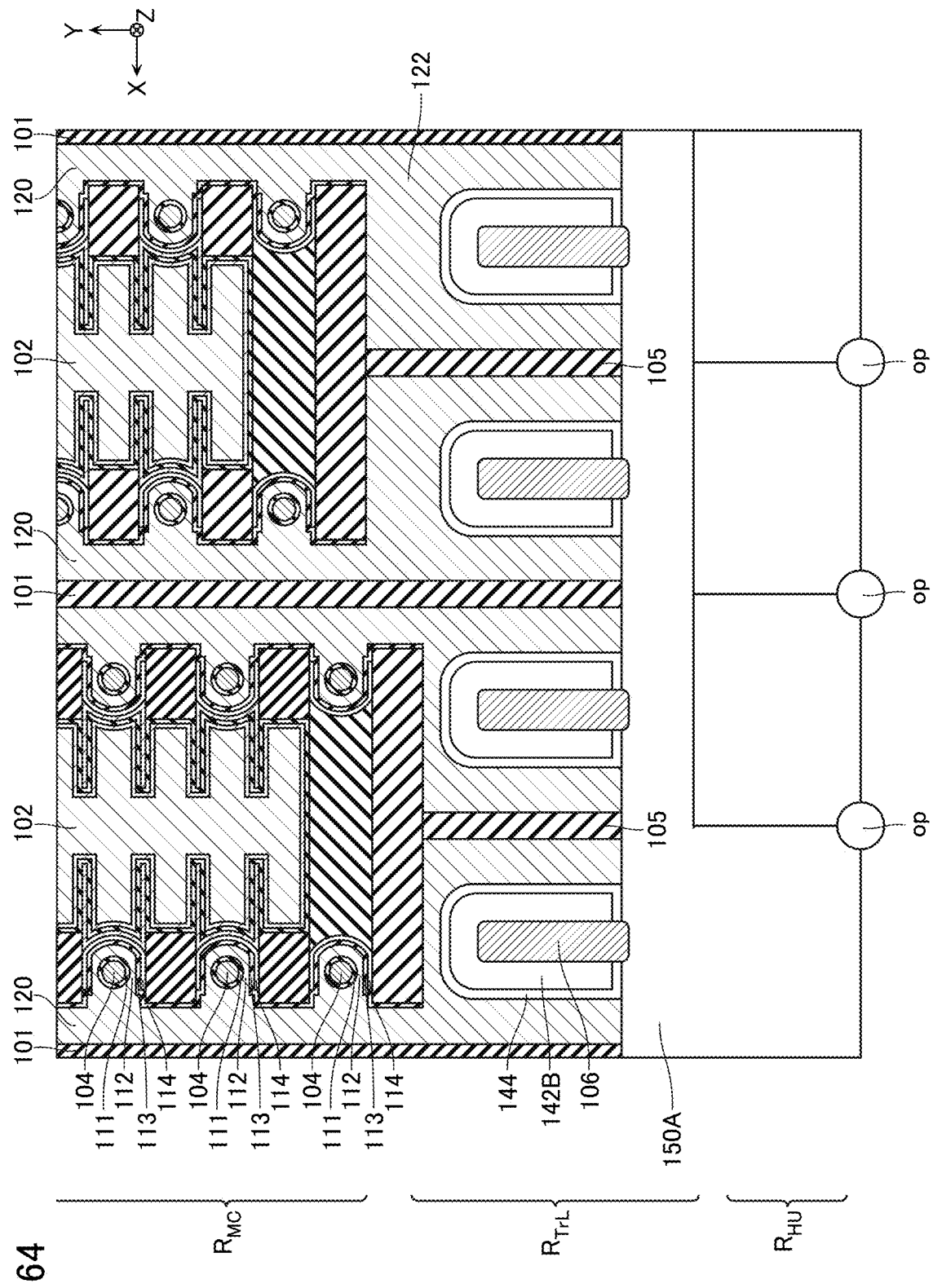
FIG. 64 is a schematic cross-sectional view for explaining the same method of manufacturing.
Figure 65:
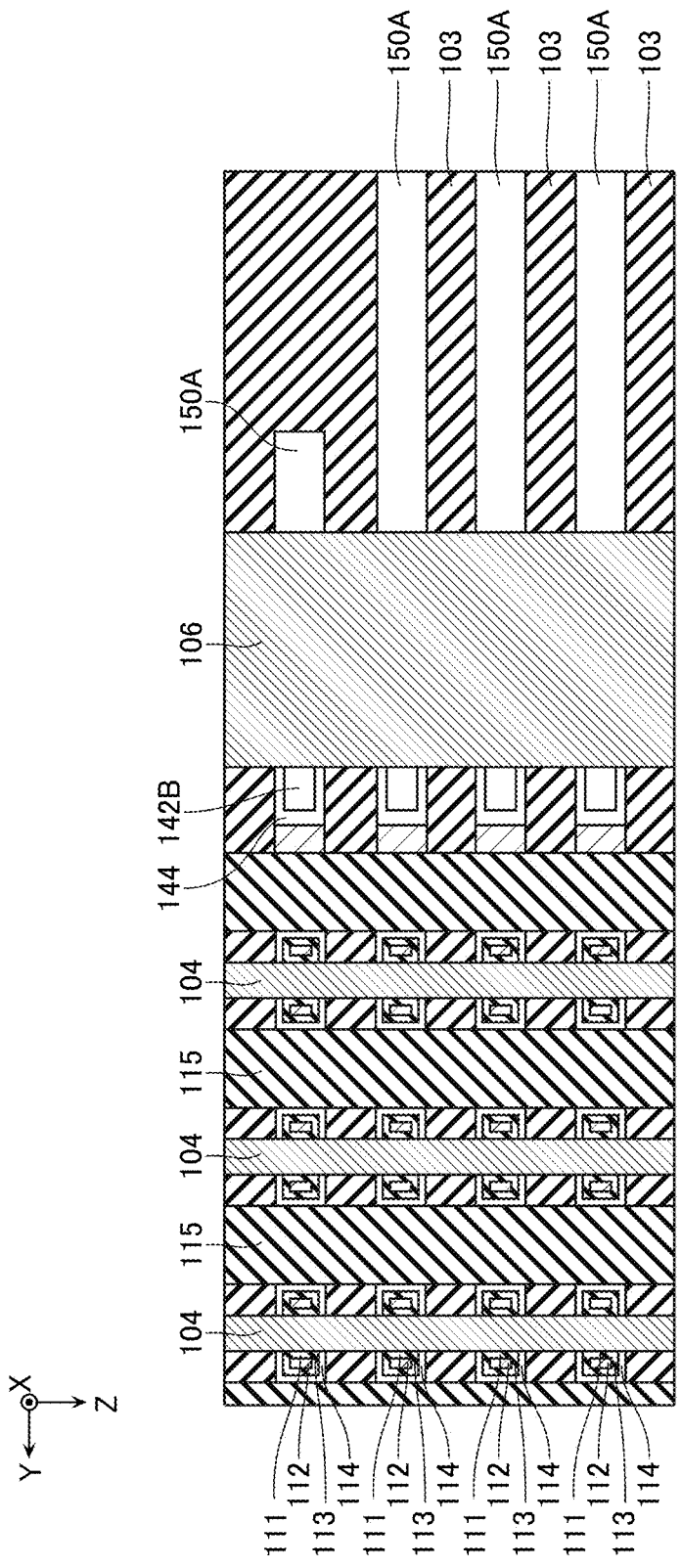
FIG. 65 is a schematic cross-sectional view for explaining the same method of manufacturing.

Next, as shown in FIGS. 64 and 65, for example, the sacrifice layer 150B is removed via the opening op. This step is performed by the likes of wet etching, for example.

Figure 66:
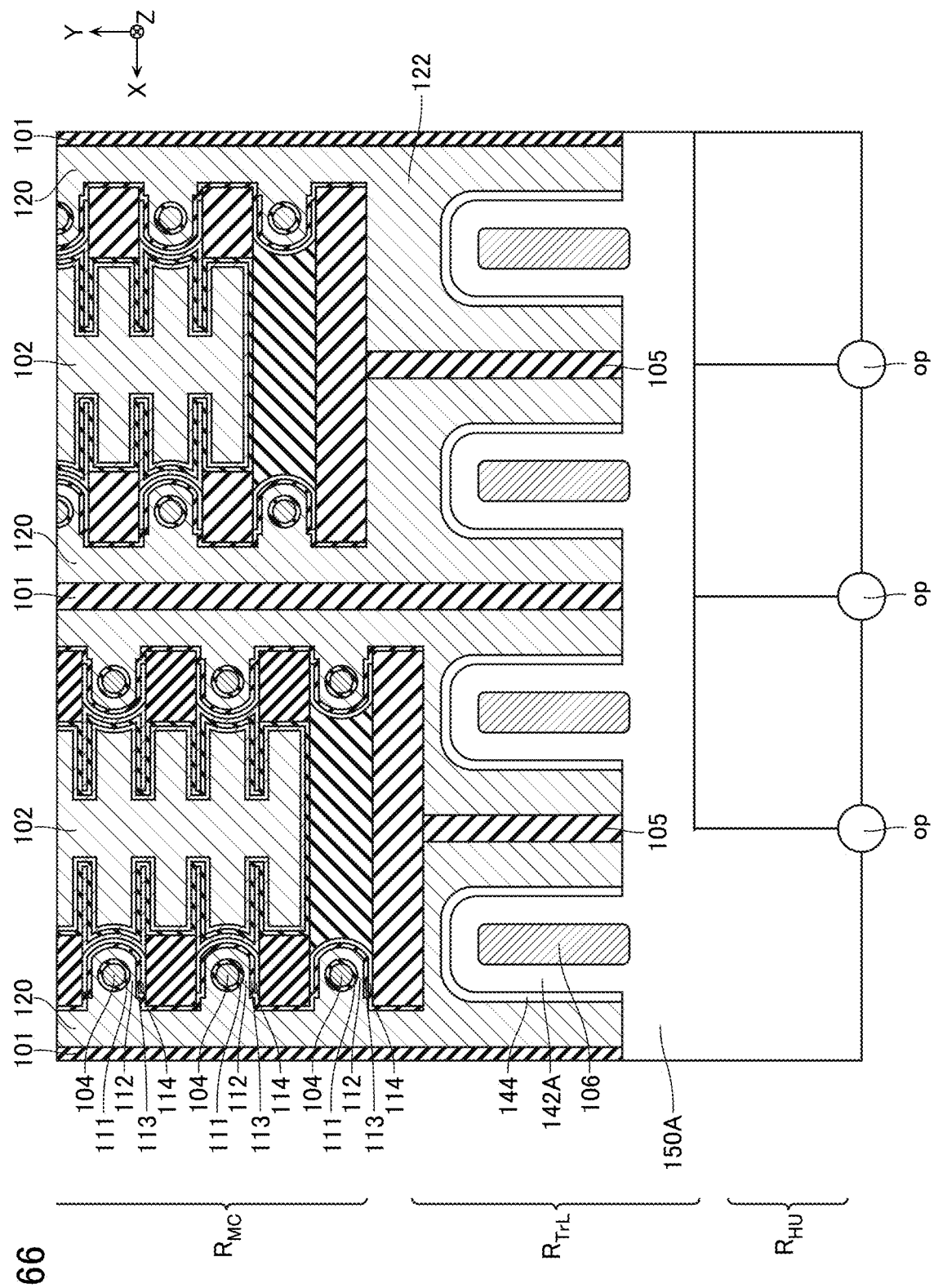
FIG. 66 is a schematic cross-sectional view for explaining the same method of manufacturing.
Figure 67:
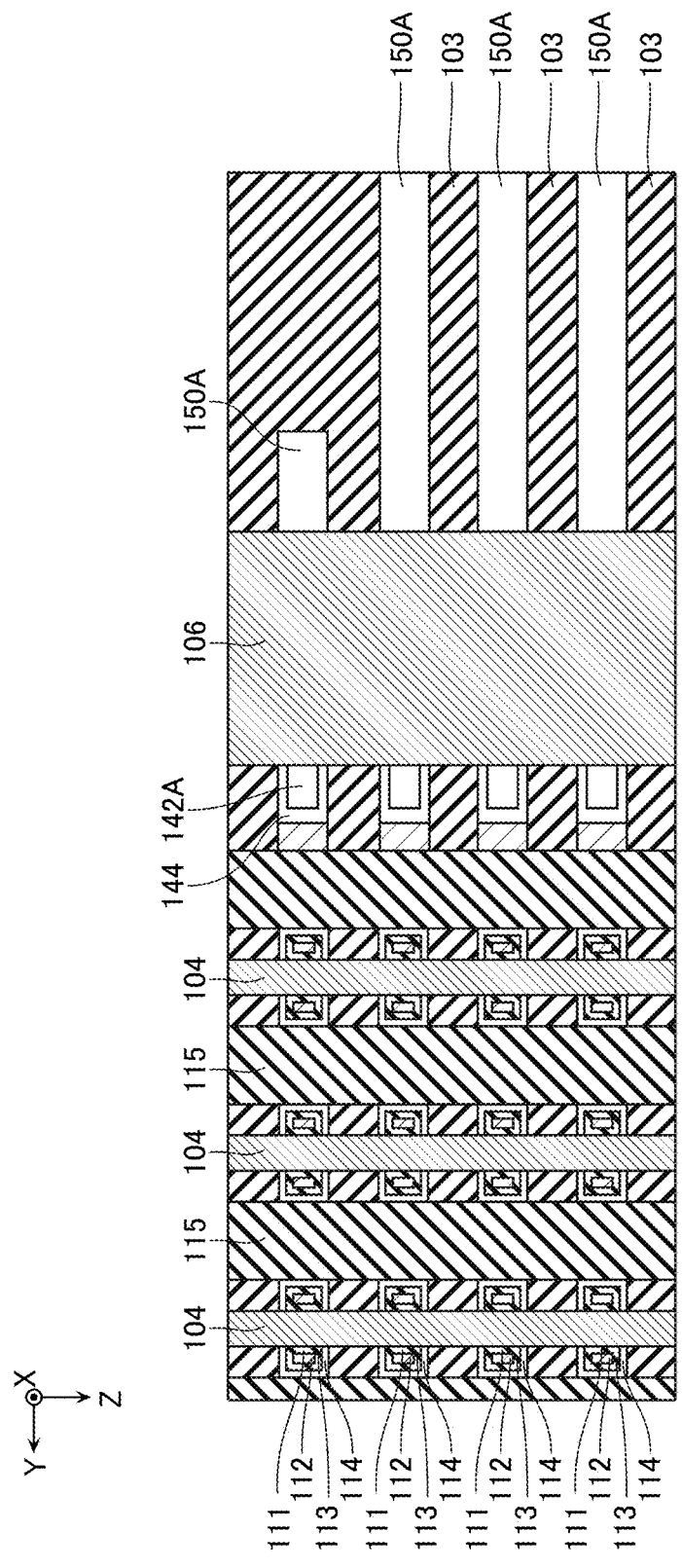
FIG. 67 is a schematic cross-sectional view for explaining the same method of manufacturing.

Next, as shown in FIGS. 66 and 67, for example, a part of the semiconductor layer 144 is removed, and a part of the sacrifice layer 142B is exposed, via the openings op, 150A. In addition, the sacrifice layer 142B is removed, and an outer peripheral surface of the via wiring 106 is exposed, via the openings op, 150A. This step is performed by the likes of wet etching, for example.

Next, as shown in FIGS. 68 and 69, for example, the insulating layers 141, 143, 151 are formed, and the conductive layers 142, 150 is formed, in the opening 150A. In this step, insulating layers and conductive layers are formed in the openings op, 150A by the likes of CVD, for example. At this time, the opening 150A is filled in by the conductive layers. On the other hand, the opening op is not filled in by the conductive layers. Next, portions provided on an inner peripheral surface of the insulating layer 103, of these insulating layers and conductive layers, are removed by the likes of wet etching, for example. Then, an insulating layer is formed inside the opening op.

Comparative Example

[Structure]

Figure 70:
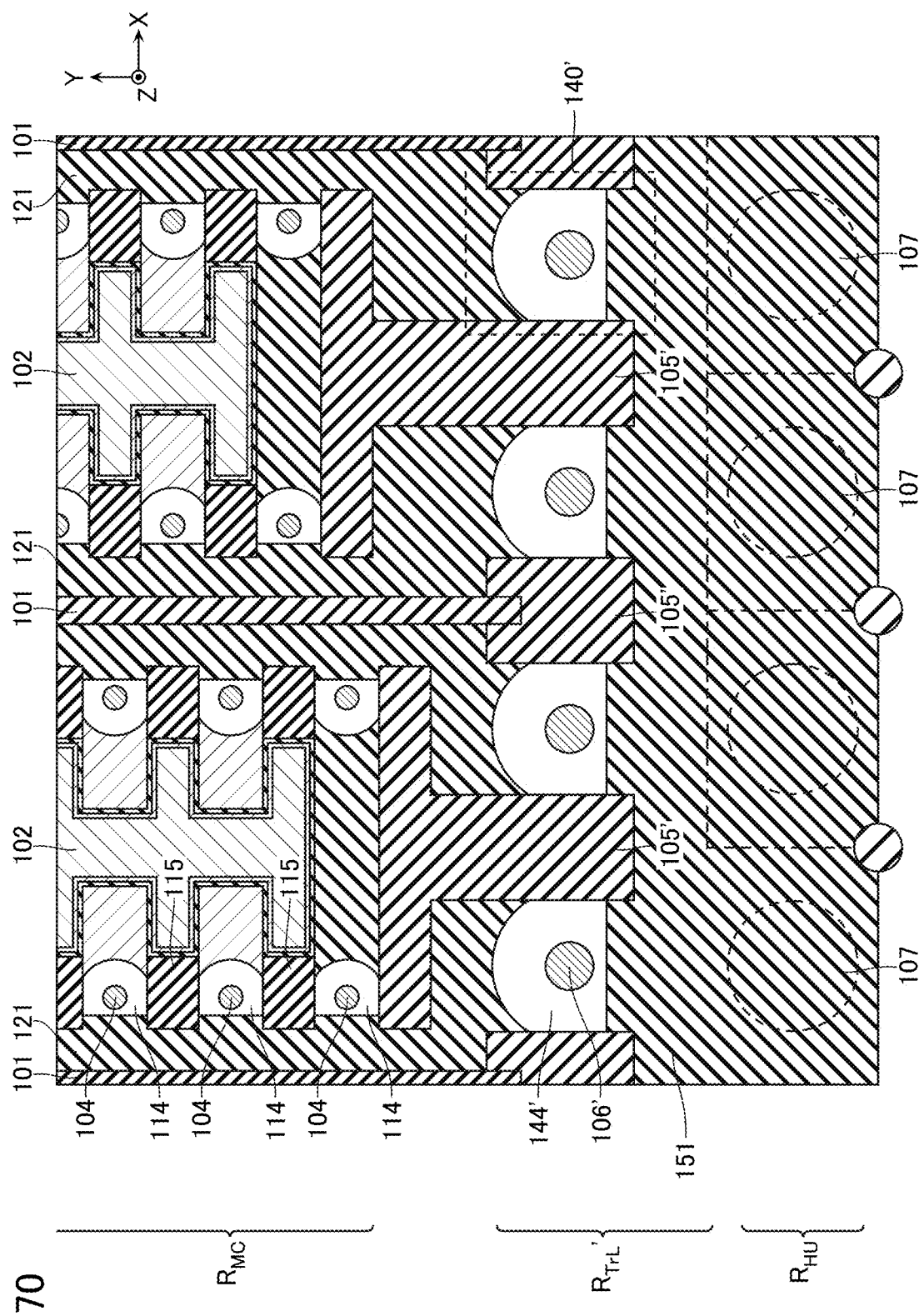
FIG. 70 is a schematic cross-sectional view showing configurations of a semiconductor memory device according to a comparative example.
Figure 71:
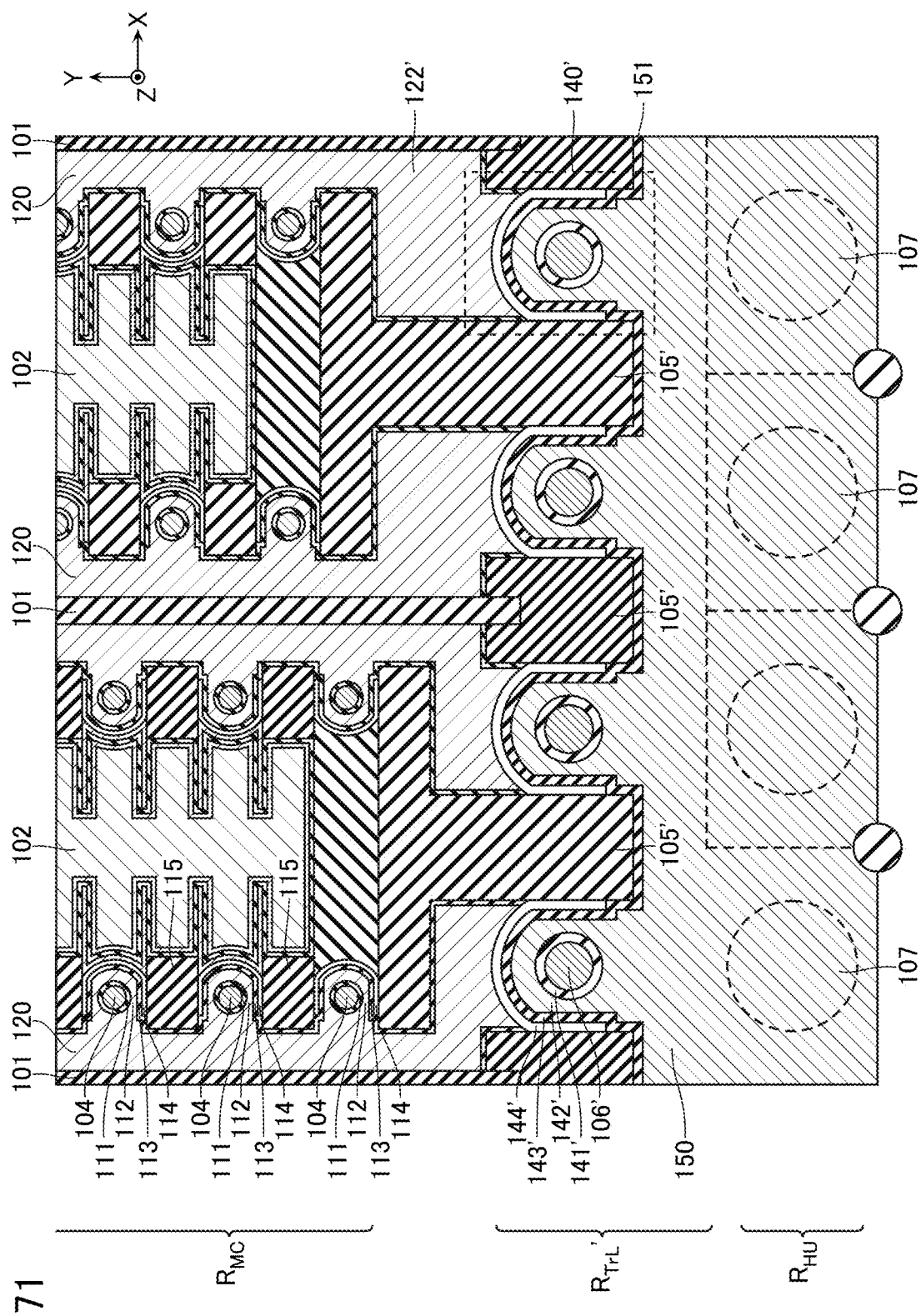
FIG. 71 is a schematic cross-sectional view showing configurations of the semiconductor memory device according to the comparative example.

FIGS. 70 and 71 are schematic XY cross-sectional views showing configurations of a semiconductor memory device according to a comparative example. Note that FIGS. 70 and 71 show XY cross sections at different height positions from each other.

The semiconductor memory device according to the comparative example does not comprise the transistor region $R_{TrL}$, but instead, comprises a transistor region $R_{TrL}'$.

The transistor region $R_{TrL}'$ is provided with a plurality of insulating layers 105' arranged in the X-direction.

In addition, the transistor region $R_{TrL}'$ is provided with a plurality of via wirings 106' which are provided between the insulating layers 105'. The via wiring 106' comprises a circular column-like shape extending in the Z-direction.

In the transistor region $R_{TrL}'$, as shown in FIG. 71, for example, the memory layers ML0 to ML3 comprise: a conductive layer 122' which is connected to an end portion in the Y-direction of the conductive layer 120; a plurality of transistor structures 140' which are provided correspondingly to the plurality of via wirings 106'; and the conductive layer 150 which extends in the X-direction along the plurality of transistor structures 140'.

The conductive layer 122' does not include a portion provided on a positive side in the X-direction of the transistor structure 140' and a portion provided on a negative side in the X-direction of the transistor structure 140'. The conductive layer 122' does not comprise a portion arranged in the X-direction with the via wiring 106' and the transistor structure 140'. A part of a side surface on one side in the Y-direction of the conductive layer 122' is connected to the conductive layer 120. A side surface on the other side in the Y-direction of the conductive layer 122' is connected, over its entire surface, to a later-mentioned semiconductor layer 144'. A side surface on one side in the Y-direction of the semiconductor layer 144' is formed along a circle centered on a central axis of the via wiring 106', and the side surface on the other side in the Y-direction of the conductive layer 122', too, is formed along this circle. The side surface on the other side in the Y-direction of the conductive layer 122' is separated from the insulating layer 151.

As shown in FIG. 71, for example, the transistor structure 140' comprises: an insulating layer 141' provided on an outer peripheral surface of the via wiring 106'; a conductive layer 142' provided on an outer peripheral surface of the insulating layer 141'; an insulating layer 143' provided on an upper surface, a lower surface, and side surfaces in the X-direction and the Y-direction of the conductive layer 142'; and the semiconductor layer 144' provided on an upper surface, a lower surface, and side surfaces in the X-direction and the Y-direction of the insulating layer 143'.

As shown in FIGS. 70 and 71, the conductive layer 122' is not connected to side surfaces in the X-direction of the semiconductor layer 144'. Both side surfaces in the X-direction of the semiconductor layer 144' are connected to the insulating layer 105'. The semiconductor layer 144' is connected to the outer peripheral surface of the via wiring 106' over its entire periphery.

[Method of Manufacturing]

During formation of the transistor structure 110 according to the first embodiment, as has been described with reference to FIG. 15, the opening 104A is formed at a position corresponding to the via wiring 104. Moreover, as has been described with reference to FIGS. 16 and 17, a part of the sacrifice layer 120A is selectively removed via this opening 104A, whereby the sacrifice layer 120A is divided in the X-direction. When the transistor structure 110 is formed by this kind of method, it will result in both side surfaces in the Y-direction of the semiconductor layer 114 being in contact with the insulating layer 115.

Similarly, during formation of the transistor structure 140' according to the comparative example, too, an opening is formed at a position corresponding to the via wiring 106'. Moreover, a part of the sacrifice layer 120A is selectively removed via this opening, whereby the sacrifice layer 120A is divided in the Y-direction. In the comparative example, due to the transistor structure 140' being formed by this kind of method, it will result in both side surfaces in the X-direction of the semiconductor layer 144' being in contact with the insulating layer 105'.

[Advantages]

The semiconductor layer 144' according to the comparative example has a side surface on one side (the memory cell region $R_{MC}$ side) in the Y-direction connected to the conductive layer 122', and does not have side surfaces in the X-direction connected to the conductive layer 122'. On the other hand, the semiconductor layer 144 according to the first embodiment has not only a side surface on one side (the memory cell region $R_{MC}$ side) in the Y-direction, but also both of side surfaces in the X-direction connected to the conductive layer 122. Hence, a contact area of the semiconductor layer 144 and the conductive layer 122 is larger than a contact area of the semiconductor layer 144' and the conductive layer 122'. This makes it possible for the transistor TrL according to the first embodiment to allow a larger current to flow, compared to the transistor TrL according to the comparative example.

Moreover, in the semiconductor memory device according to the comparative example, in the case of it being attempted to increase the contact area of the semiconductor layer 144' and the conductive layer 122' and a contact area of the semiconductor layer 144' and the via wiring 106', there is a need for a length in the X-direction of the transistor structure 140' to be made larger. However, depending on sizes of each of configurations in the memory cell region $R_{MC}$, it is sometimes not possible for the length in the X-direction of the transistor structure 140' to be made larger. On the other hand, the semiconductor memory device according to the first embodiment makes it possible for the contact area of the semiconductor layer 144 and the conductive layer 122 and a contact area of the semiconductor layer 144 and the via wiring 106 to be adjusted regardless of sizes of each of configurations in the memory cell region $R_{MC}$, by adjusting lengths in the Y-direction of the via wiring 106 and the semiconductor layer 144. As a result, the semiconductor memory device according to the first embodiment makes it possible to further increase the contact area of the via wiring 106 and the semiconductor layer 144 and the contact area of the semiconductor layer 144 and the conductive layer 122, and thereby provide a transistor TrL capable of allowing an even larger current to flow.

Second Embodiment

The transistor structure 140 according to the first embodiment is connected to one via wiring 106. However, such a configuration is merely an exemplification, and a transistor structure corresponding to the transistor TrL may be connected to a plurality of conductive layers corresponding to the word line select line LW. Such an example will be described below.

Figure 72:
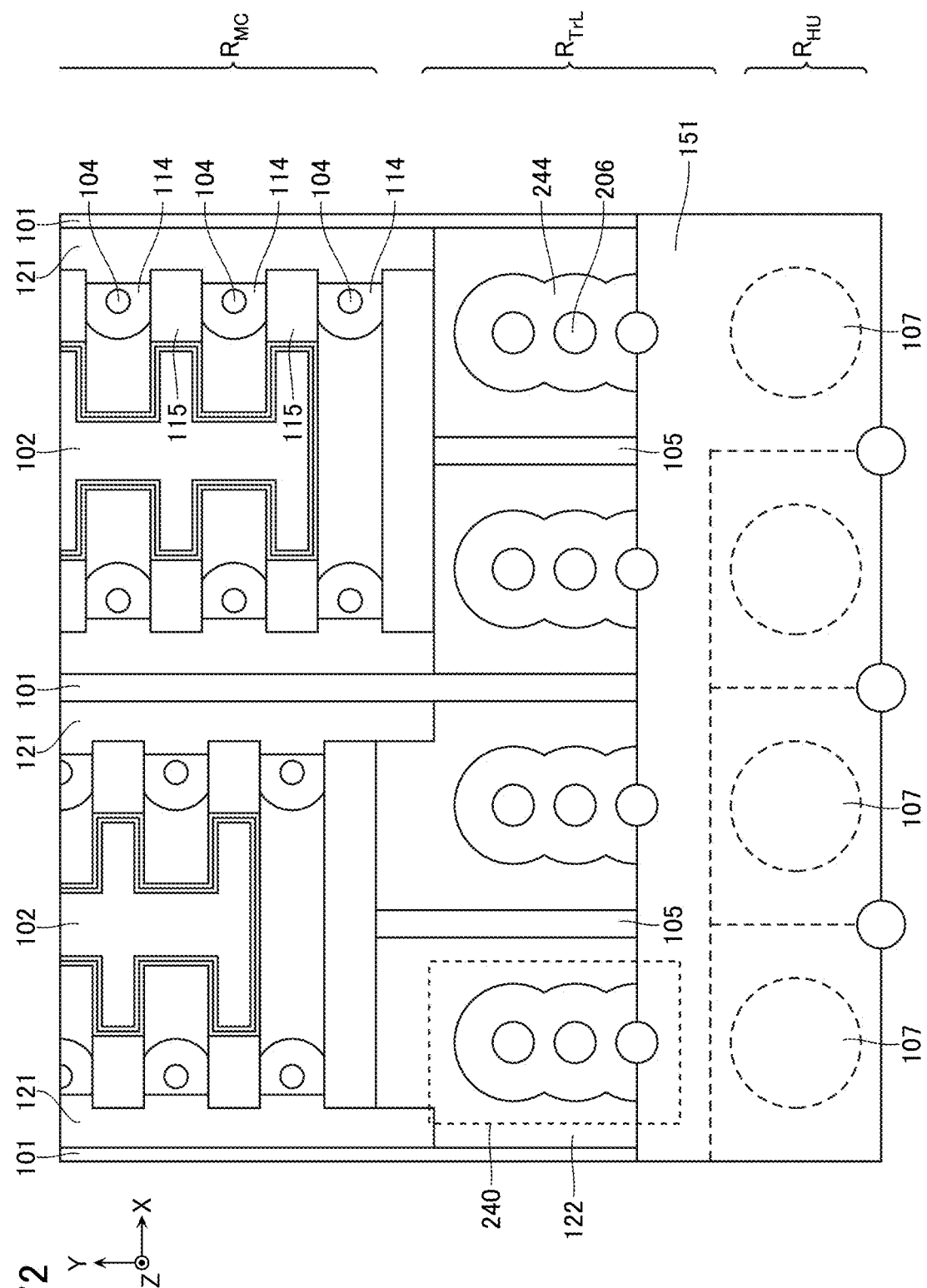
FIG. 72 is a schematic cross-sectional view showing configurations of a semiconductor memory device according to a second embodiment.
Figure 73:
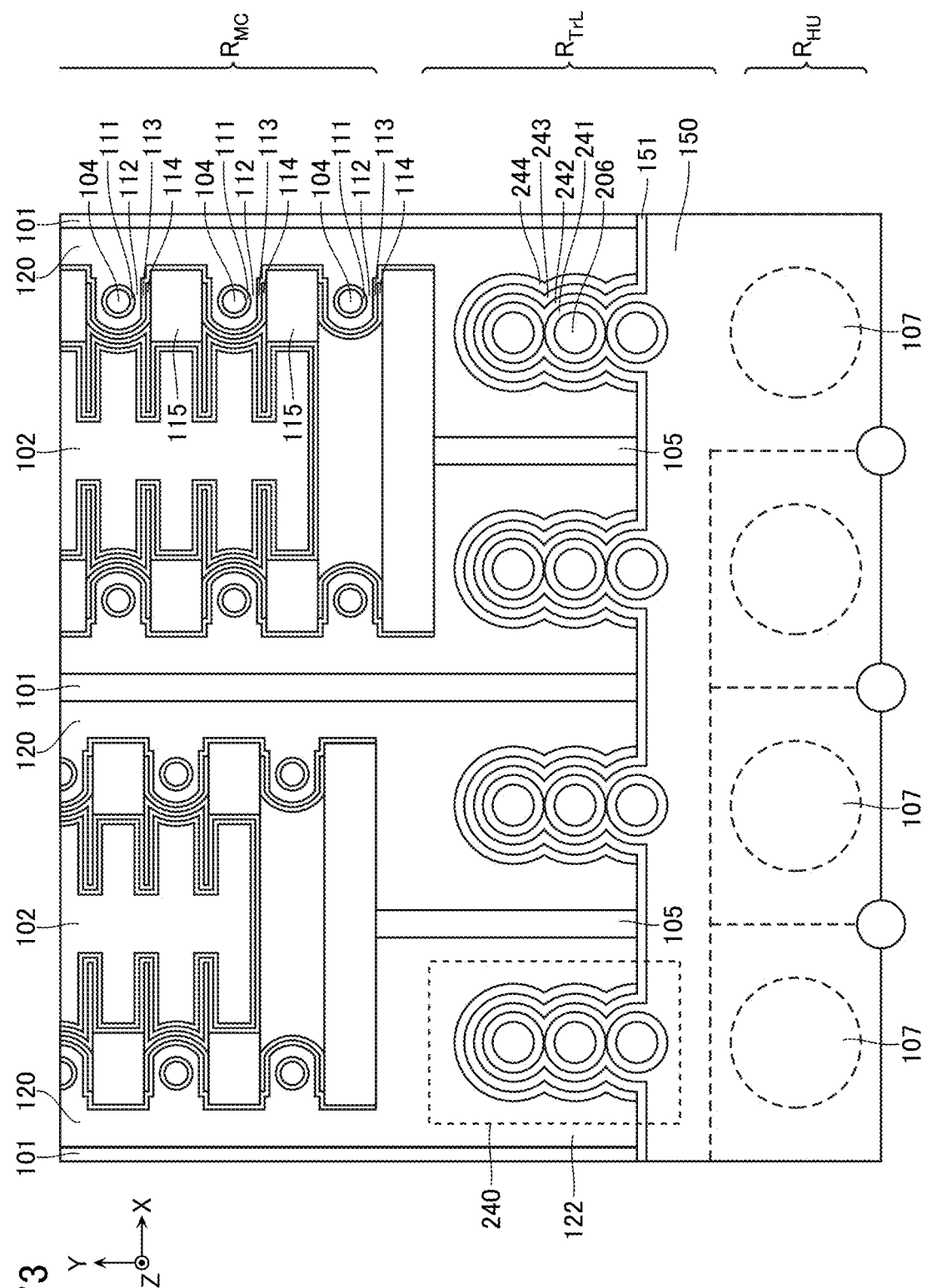
FIG. 73 is a schematic cross-sectional view showing configurations of the semiconductor memory device according to the second embodiment.

FIGS. 72 and 73 are schematic XY cross-sectional views showing configurations of a semiconductor memory device according to a second embodiment. Note that FIGS. 72 and 73 show XY cross sections at different height positions from each other. In the following description, configurations similar to in the first embodiment will be assigned with the same symbols as in the first embodiment, and descriptions thereof will be omitted.

The semiconductor memory device according to the second embodiment is basically configured similarly to the semiconductor memory device according to the first embodiment.

However, in the first embodiment, as has been described with reference to FIG. 5, and so on, each region between the insulating layer 101 and the insulating layer 105, of the transistor region $R_{TrL}$ is provided with one each of the via wirings 106 and the transistor structures 140. On the other hand, in the second embodiment, as shown in FIGS. 72 and 73, each region between the insulating layer 101 and the insulating layer 105, of the transistor region $R_{TrL}$ is provided with a plurality of via wirings 206 arranged in the Y-direction, and one transistor structure 240.

The via wiring 206 is basically configured similarly to the via wiring 106. However, the via wirings 206 each comprise a circular column-like shape. The plurality of via wirings 206 shared by one transistor structure 240 are all electrically common. Moreover, in the example illustrated, the plurality of via wirings 206 shared by one transistor structure 240 are separated from each other in the Y-direction.

The transistor structure 240 comprises an insulating layer 241, a conductive layer 242, an insulating layer 243, and a semiconductor layer 244, as shown in FIG. 73.

The insulating layer 241, the conductive layer 242, the insulating layer 243, and the semiconductor layer 244 are basically configured similarly to the insulating layer 141, the conductive layer 142, the insulating layer 143, and the semiconductor layer 144.

However, in an XY cross section of the kind exemplified in FIG. 73, the insulating layer 241 is formed with a constant thickness along outer peripheral surfaces of the plurality of via wirings 206 arranged in the Y-direction. The conductive layer 242, the insulating layer 243, and the semiconductor layer 244 are formed with constant thicknesses along pluralities of circles centered on each of center positions of the plurality of via wirings 206 arranged in the Y-direction, in a range more to a positive side in the Y-direction than a position in the Y-direction corresponding to an end portion on a negative side in the Y-direction of the conductive layer 122.

Moreover, in an XY cross section of the kind exemplified in FIG. 72, the semiconductor layer 244 is formed with a constant thickness along a plurality of circles centered on each of center positions of the plurality of via wirings 206 arranged in the Y-direction, in a range more to a positive side in the Y-direction than a position in the Y-direction corresponding to an end portion on a negative side in the Y-direction of the conductive layer 122. Moreover, the semiconductor layer 244 is connected to outer peripheral surfaces of the plurality of via wirings 206 arranged in the Y-direction.

Now, during formation of the transistor structure 110 according to the first embodiment, in the step described with reference to FIG. 51, a plurality of openings 106A corresponding to the plurality of via wirings 106, are formed. Similarly, during formation of the transistor structure 240 according to the second embodiment, too, a plurality of openings corresponding to the plurality of via wirings 206, are formed.

However, by, for example, adjusting a diameter of the opening 104A and a diameter of the opening corresponding to the via wiring 206 to comparable sizes, it is possible too for the opening corresponding to the via wiring 206 to be formed simultaneously with the opening 104A in the step described with reference to FIGS. 14 and 15. This enables a reduction in the number of steps.

Moreover, as has been described with reference to FIG. 72, contact surfaces between the plurality of via wirings 206 and the semiconductor layer 244 are formed along circles, so it will sometimes be possible for a contact area to be made larger, compared to with a contact surface between the via wiring 106 and the semiconductor layer 144 (FIG. 4). Similarly, a contact surface between the semiconductor layer 244 and the conductive layer 122, too, is formed along circles, so it will sometimes be possible for a contact area to be made larger, compared to with the contact surface between the via wiring 106 and the semiconductor layer 144 (FIG. 4). As a result, it will sometimes be possible to provide a transistor TrL capable of allowing an even larger current to flow.

Third Embodiment

The semiconductor layer 144 according to the first embodiment and the semiconductor layer 244 according to the second embodiment have lengths in the Y-direction that are larger than their lengths in the X-direction. However, such a configuration is merely an exemplification, and a semiconductor layer functioning as the channel region of the transistor TrL may have a length in the Y-direction that is smaller than its length in the X-direction. Such an example will be described below.

Figure 74:
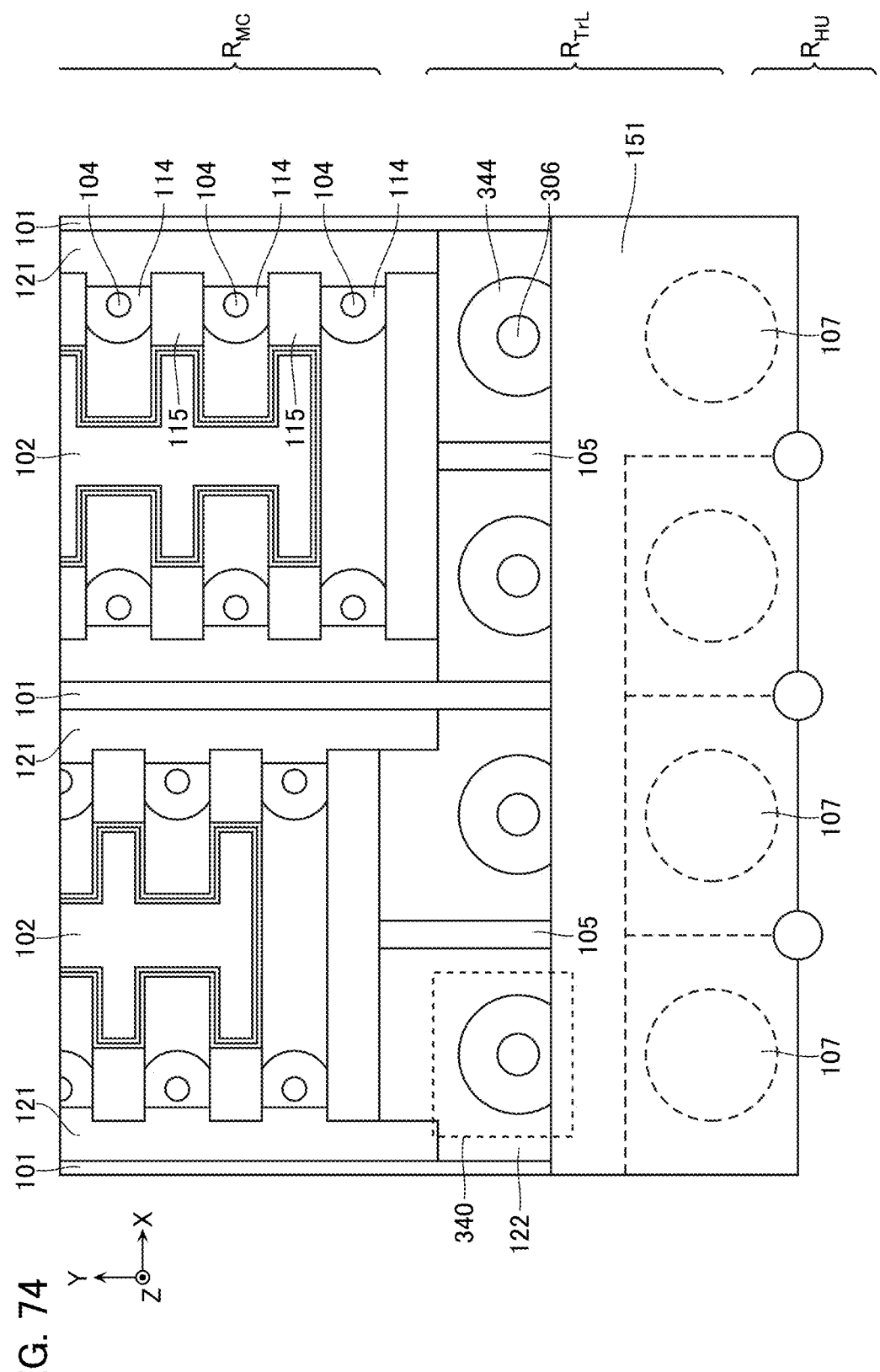
FIG. 74 is a schematic cross-sectional view showing configurations of a semiconductor memory device according to a third embodiment.
Figure 75:
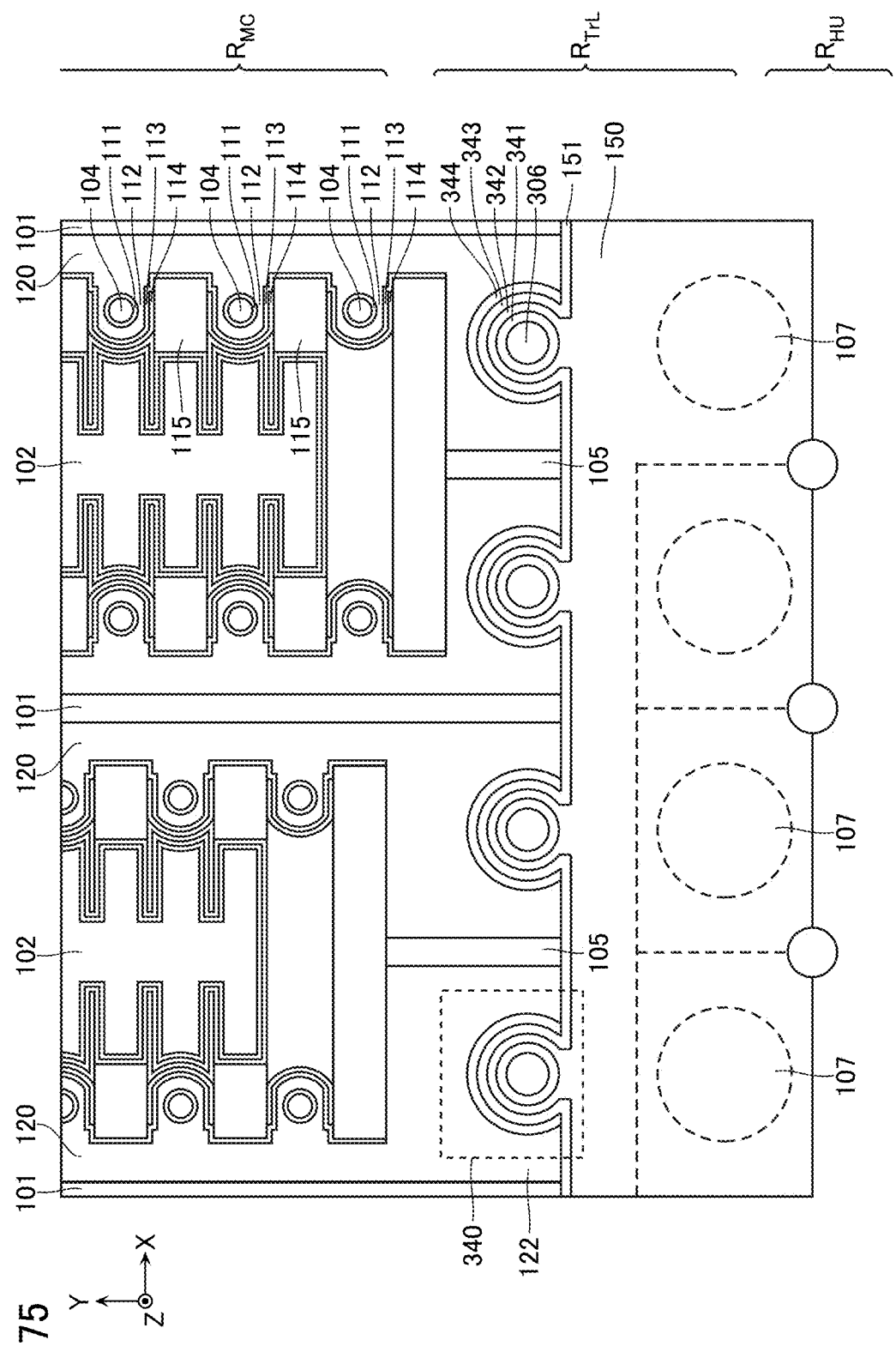
FIG. 75 is a schematic cross-sectional view showing configurations of the semiconductor memory device according to the third embodiment.

FIGS. 74 and 75 are schematic XY cross-sectional views showing configurations of a semiconductor memory device according to a third embodiment. Note that FIGS. 74 and 75 show XY cross sections at different height positions from each other. In the following description, configurations similar to in the first embodiment will be assigned with the same symbols as in the first embodiment, and descriptions thereof will be omitted.

The semiconductor memory device according to the third embodiment is basically configured similarly to the semiconductor memory device according to the first embodiment.

However, the semiconductor memory device according to the third embodiment comprises a via wiring 306 and a transistor structure 340, instead of the via wiring 106 and the transistor structure 140.

The via wiring 306 is basically configured similarly to the via wiring 106. However, the via wiring 306 comprises a circular column-like shape. Note that in the example illustrated, a position in the Y-direction of an end portion on a negative side in the Y-direction of the via wiring 306 does not reach a position in the Y-direction of an end portion on a negative side in the Y-direction of a later-mentioned semiconductor layer 344.

The transistor structure 340 comprises an insulating layer 341, a conductive layer 342, an insulating layer 343, and the semiconductor layer 344, as shown in FIG. 75.

The insulating layer 341, the conductive layer 342, the insulating layer 343, and the semiconductor layer 344 are basically configured similarly to the insulating layer 141, the conductive layer 142, the insulating layer 143, and the semiconductor layer 144.

However, in an XY cross section of the kind exemplified in FIG. 75, the insulating layer 341 is formed with a constant thickness along an outer peripheral surface of the via wiring 306. The conductive layer 342, the insulating layer 343, and the semiconductor layer 344 are formed with constant thicknesses along circles centered on a center position of the via wiring 306, in a range more to a positive side in the Y-direction than a position in the Y-direction corresponding to an end portion on a negative side in the Y-direction of the conductive layer 122.

Moreover, in an XY cross section of the kind exemplified in FIG. 74, the semiconductor layer 344 is formed with a constant thickness along a circle centered on the center position of the via wiring 306, in a range more to a positive side in the Y-direction than a position in the Y-direction corresponding to an end portion on a negative side in the Y-direction of the conductive layer 122. Moreover, the semiconductor layer 344 is connected to the outer peripheral surface of the via wiring 306.

It is possible for the via wiring 306 according to the third embodiment, too, to be formed simultaneously with the opening 104A in the step described with reference to FIGS. 14 and 15, similarly to the via wiring 206 according to the second embodiment. This enables a reduction in the number of steps.

Moreover, the transistor structure 340 according to the third embodiment is smaller-sized than the transistor structure 140 according to the first embodiment and the transistor structure 240 according to the second embodiment. It is thus possible for the transistor region $R_{TrL}$ to be downsized in the Y-direction, and for an area of the transistor region $R_{TrL}$ to thereby be reduced.

Fourth Embodiment

The semiconductor layer 144 according to the first embodiment, the semiconductor layer 244 according to the second embodiment, and the semiconductor layer 344 according to the third embodiment each have both of their side surfaces in the X-direction connected to the conductive layer 122. However, such a configuration is merely an exemplification, and a semiconductor layer functioning as the channel region of the transistor TrL may have solely a side surface on one side in the X-direction connected to the conductive layer 122. Such an example will be described below.

Figure 76:
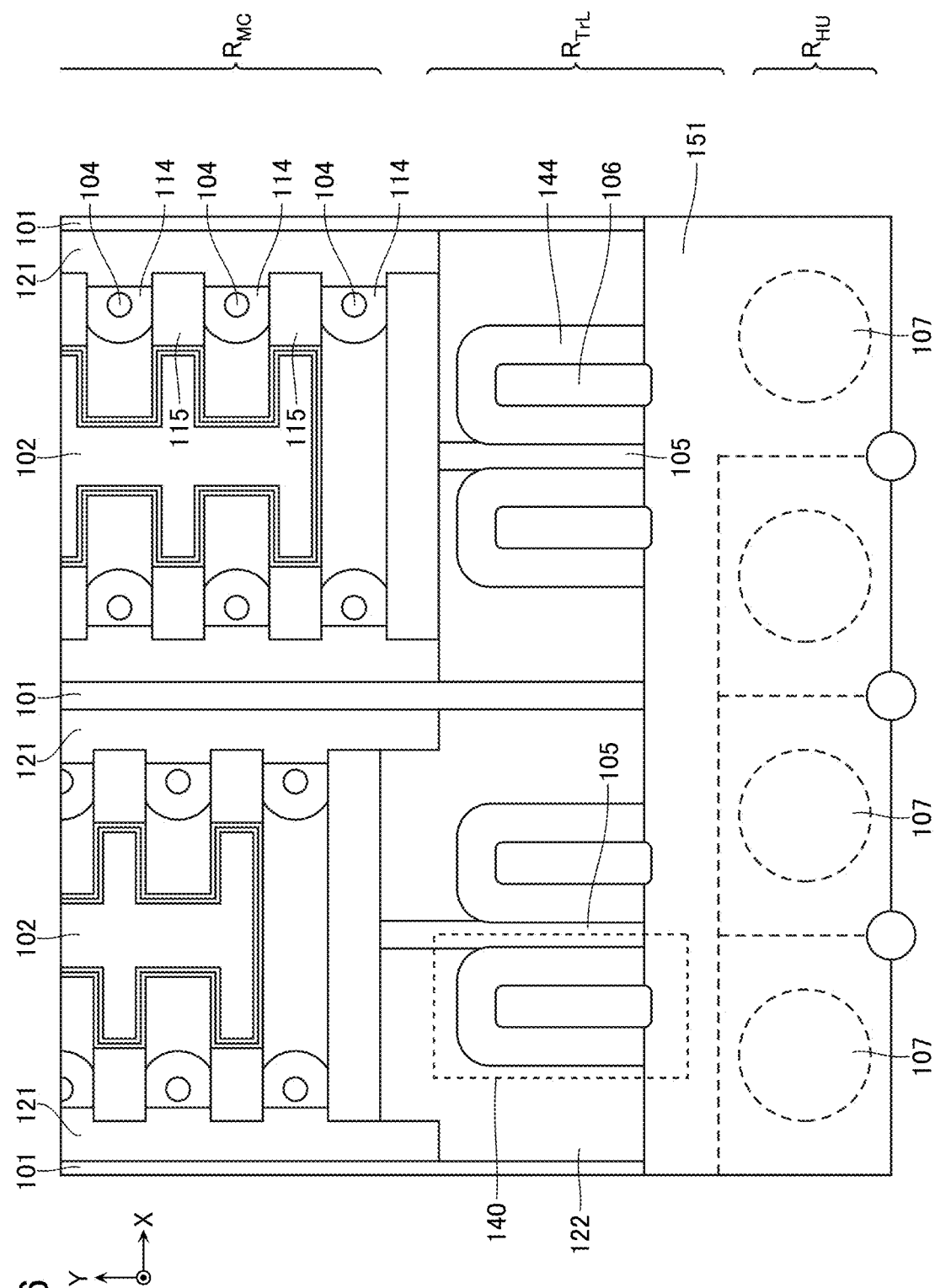
FIG. 76 is a schematic cross-sectional view showing configurations of a semiconductor memory device according to a fourth embodiment.

FIG. 76 is a schematic XY cross-sectional view showing configurations of a semiconductor memory device according to a fourth embodiment. In the following description, configurations similar to in the first embodiment will be assigned with the same symbols as in the first embodiment, and descriptions thereof will be omitted.

The semiconductor memory device according to the fourth embodiment is basically configured similarly to the semiconductor memory device according to the first embodiment, and comprises the transistor structure 140 according to the first embodiment.

However, in the semiconductor memory device according to the fourth embodiment, although a side surface on an insulating layer 101 side, in the X-direction, of the semiconductor layer 144 is connected to the conductive layer 122, a side surface on an insulating layer 105 side, in the X-direction, of the semiconductor layer 144 is not connected to the conductive layer 122.

Due to the semiconductor memory device according to the fourth embodiment, it is sometimes possible for the transistor region $R_{TrL}$ to be downsized in the X-direction, and for the area of the transistor region $R_{TrL}$ to thereby be reduced.

Note that the semiconductor memory device according to the fourth embodiment may comprise the transistor structure 240 according to the second embodiment or the transistor structure 340 according to the third embodiment, rather than the transistor structure 140 according to the first embodiment.

Moreover, in the semiconductor memory device according to the fourth embodiment, it is possible for the semiconductor layer functioning as the channel region of the transistor TrL to have a side surface on the insulating layer 105 side, in the X-direction, connected to the conductive layer 122, and not to have a side surface on the insulating layer 101 side, in the X-direction, connected to the conductive layer 122.

Moreover, in the semiconductor memory device according to the fourth embodiment, the semiconductor layer functioning as the channel region of the transistor TrL need not have a side surface on one side (the memory cell region $R_{MC}$ side) in the Y-direction connected to the conductive layer 122.

Other Embodiments

That concludes description of the semiconductor memory devices according to the first to fourth embodiments. However, the semiconductor memory devices according to these embodiments are merely exemplifications, and their specific configurations, and so on, may be appropriately adjusted.

For example, in the semiconductor memory devices according to the first to fourth embodiments, the global bit line GBL is provided below the memory layers ML0 to ML3. However, such a configuration is merely an exemplification, and the specific configuration may be appropriately adjusted. The global bit line GBL may be provided above the memory layers ML0 to ML3.

Moreover, the semiconductor memory devices according to the first to fourth embodiments are assumed to have structures of the kind formed by having their memory cell array MCA and their peripheral circuit which is connected to the memory cell array MCA, manufactured on separate wafers, and by having these wafers bonded. However, it is possible too for the semiconductor memory devices according to the first to fourth embodiments to be manufactured on a single wafer.

Moreover, in the semiconductor memory devices according to the first to fourth embodiments, the via wiring 104 functioning as the bit line BL sometimes includes a conductive oxide such as indium tin oxide (ITO). However, such a conductive oxide may be included in the transistor structure 110, rather than in the via wiring 104 extending in the Z-direction. Moreover, the via wiring 104 and the transistor structure 110 may include another material, and so on.

Similarly, in the semiconductor memory devices according to the first to fourth embodiments, the via wiring 106, and so on, functioning as the word line select line LW sometimes includes a conductive oxide such as indium tin oxide (ITO). However, such a conductive oxide may be included in the transistor structure 140, and so on, configuring the transistor TrL, rather than in the via wiring 106, and so on, extending in the Z-direction. Moreover, the via wiring 106, and so on, and the transistor structure 140, and so on, may include another material, and so on.

Similarly, in the semiconductor memory devices according to the first to fourth embodiments, the conductive layer 122 functioning as the drain electrode of the transistor TrL sometimes includes a conductive oxide such as indium tin oxide (ITO). However, such a conductive oxide may be included in the transistor structure 140, and so on, configuring the transistor TrL, rather than in the conductive layer 122. Moreover, the conductive layer 122 and the transistor structure 140, and so on, may include another material, and so on.

Moreover, in the above description, as has been described with reference to FIG. 4, and so on, the position in the Y-direction of the end portion on the negative side in the Y-direction of the semiconductor layer 144, and so on, functioning as the channel region of the transistor TrL, coincides with the position in the Y-direction of the end portion on a negative side in the Y-direction of the conductive layer 122. However, in the step described with reference to FIGS. 66 and 67 or a step corresponding thereto, a position in the Y-direction of the end portion on a negative side in the Y-direction of the semiconductor layer 144, and so on, is sometimes provided more to a positive side in the Y-direction than the position in the Y-direction of the end portion on a negative side in the Y-direction of the conductive layer 122. That is, the position in the Y-direction of the end portion on a negative side in the Y-direction of the conductive layer 122 is sometimes provided more to a negative side in the Y-direction than the position Y2 described with reference to FIG. 4.

Moreover, in the semiconductor memory device according to the first embodiment, the end portion on a negative side in the Y-direction of the via wiring 106 functioning as the word line select line LW is provided more to a negative side in the Y-direction than the end portion on a negative side in the Y-direction of the semiconductor layer 144. However, a position in the Y-direction of the end portion on a negative side in the Y-direction of the via wiring 106, may coincide with a position in the Y-direction of the end portion on a negative side in the Y-direction of the semiconductor layer 144. Moreover, the end portion on a negative side in the Y-direction of the via wiring 106 may be provided more to a positive side in the Y-direction than the end portion on a negative side in the Y-direction of the semiconductor layer 144.

Note that in the semiconductor memory device according to the first embodiment, in the step described with reference to FIGS. 51 and 52, the opening 106A is formed at a position corresponding to the via wiring 106. Moreover, in the step described with reference to FIGS. 53 and 54, a part of the sacrifice layer 120A is selectively removed via the opening 106A, and the opening 142A is formed. Now, when end portions on a negative side in the Y-direction of the opening 106A and the opening 142A is separated from the sacrifice layer 150B, the sacrifice layer 142B sometimes cannot be removed in the step described with reference to FIGS. 66 and 67. For such a reason, a distance between the opening 106A and the sacrifice layer 150B is at least smaller than an amount of the sacrifice layer 120A removed in the step described with reference to FIGS. 53 and 54. Hence, even when the end portion on a negative side in the Y-direction of the via wiring 106 is provided more to a positive side in the Y-direction than the end portion on a negative side in the Y-direction of the semiconductor layer 144, a distance in the Y-direction between these end portions will be at least smaller than a shortest distance between a contact surface of the semiconductor layer 144 and the conductive layer 122 and a contact surface between the semiconductor layer 144 and the via wiring 106. The same applies to the third embodiment and the fourth embodiment, too.

Moreover, in the semiconductor memory device according to the second embodiment, such a relationship holds for a via wiring 206 provided at a position closest to the conductive layer 150 (a via wiring 206 provided most to a negative side in the Y-direction), of the plurality of via wirings 206 arranged in the Y-direction.

Furthermore, in the semiconductor memory device according to the second embodiment, a distance between two via wirings 206 adjacent in the Y-direction is at least smaller than twice a shortest distance between a contact surface between the semiconductor layer 244 and the conductive layer 122 and a contact surface with either of the via wirings 206, of the semiconductor layer 244.

Moreover, in the semiconductor memory device according to the second embodiment, the plurality of via wirings 206 shared by one transistor structure 240 are separated from each other in the Y-direction. However, at least two of such a plurality of via wirings 206 may be connected to each other.

Moreover, in the semiconductor memory devices according to the first to fourth embodiments, the semiconductor layer 114 functioning as the channel region of the transistor TrC and the semiconductor layer 144 functioning as the channel region of the transistor TrL are provided facing both an upper surface and a lower surface of the gate electrode of these transistors. However, the semiconductor layers 114, 144 are not limited to this configuration, and may be provided facing either one of the upper surface and a lower surface of the gate electrode of these transistors.

Moreover, in the above description, there has been described an example where the capacitor CpC is adopted as the memory portion connected to the transistor structure 110. However, the memory portion need not be the capacitor CpC. For example, the memory portion may be one that includes a ferroelectric material, a ferromagnetic material, a chalcogen material of the likes of GeSbTe, or other material, and that utilizes characteristics of these materials to store data. For example, any of these materials may be included in an insulating layer between the electrodes forming the capacitor CpC, in any of the structures described above.

Moreover, the transistor structure 110 configuring the transistor TrC may comprise a similar structure to the likes of the transistor structure 140 configuring the transistor TrL, in any of the first to fourth embodiments.

Moreover, the methods of manufacturing the semiconductor memory devices according to the first to fourth embodiments, too, may be appropriately adjusted. For example, an order of any two of the above-mentioned steps may be switched, or any two of the above-mentioned steps may be simultaneously executed. For example, the step described with reference to FIGS. 45 to 48 may be executed later than the step described with reference to FIGS. 51 and 52.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of memory layers arranged in a first direction intersecting a surface of the substrate; and
a first via wiring and a second via wiring that extend in the first direction, and have different positions from each other in a second direction intersecting the first direction, wherein
the plurality of memory layers each comprise:
a first transistor which is electrically connected to the first via wiring;
a memory portion which is electrically connected to the first transistor;
a first wiring which is electrically connected to the first transistor, and extends in the second direction;
a second transistor which is electrically connected to the second via wiring, and is electrically connected to the first wiring;
an electrode which is electrically connected to the second transistor, and is provided in a current path between the second transistor and the first wiring; and
a second wiring which is electrically connected to the second transistor, and extends in a third direction intersecting the first direction and the second direction,
the second transistor comprises:
a first semiconductor layer which is electrically connected to the electrode and the second via wiring;
a first gate electrode which is connected to the second wiring, and faces the first semiconductor layer; and
a first gate insulating film which is provided between the first semiconductor layer and the first gate electrode,
the first semiconductor layer faces at least one of surfaces on one side or the other side in the first direction of the first gate electrode, and
the electrode includes a portion arranged with the second via wiring in the third direction.

2. The semiconductor memory device according to claim 1 comprising:
a first position and a second position which respectively correspond to end portions of the first semiconductor layer on a first wiring side and an opposite side to the first wiring side in the second direction; and
a third position which is a center position of the first position and the second position in the second direction, wherein
a side surface of the first semiconductor on one side in the third direction comprises a first portion provided at the third position,
a side surface of the first semiconductor on the other side in the third direction comprises a second portion provided at the third position, and
one or both of the first portion and the second portion is/are connected to the electrode.

3. The semiconductor memory device according to claim 2, wherein
an end portion of the electrode on an opposite side to the first wiring in the second direction reaches the second position.

4. The semiconductor memory device according to claim 2, wherein
an end portion of the electrode on an opposite side to the first wiring in the second direction is further from the first wiring than the second position.

5. The semiconductor memory device according to claim 2, wherein
an end portion, on an opposite side to the first wiring, of a connecting surface between the first semiconductor layer and the electrode reaches the second position.

6. The semiconductor memory device according to claim 2, wherein
an end portion of the second via wiring on an opposite side to the first wiring in the second direction reaches the second position.

7. The semiconductor memory device according to claim 6, wherein
the end portion of the second via wiring on the opposite side to the first wiring in the second direction is further from the first wiring than the second position.

8. The semiconductor memory device according to claim 2, wherein
an end portion of the second via wiring on an opposite side to the first wiring in the second direction does not reach the second position.

9. The semiconductor memory device according to claim 1, wherein
a length of the second via wiring in the second direction is larger than a length of the second via wiring in the third direction.

10. The semiconductor memory device according to claim 1, wherein
a length of the first semiconductor layer in the second direction is larger than a length of the first semiconductor layer in the third direction.

11. The semiconductor memory device according to claim 1, comprising
a third via wiring that extends in the first direction, wherein
the third via wiring is arranged in the second direction with the second via wiring, and
the first semiconductor layer is electrically connected to the third via wiring.

12. The semiconductor memory device according to claim 11, wherein
the second via wiring and the third via wiring are electrically common.

13. The semiconductor memory device according to claim 11, wherein
the second via wiring and the third via wiring are separated in the second direction.

14. The semiconductor memory device according to claim 2, wherein
both of the first portion and the second portion are connected to the electrode.

15. The semiconductor memory device according to claim 2, wherein
one of the first portion and the second portion is connected to the electrode, and the other of the first portion and the second portion is not connected to the electrode.

16. The semiconductor memory device according to claim 1, wherein
the memory portion is a capacitor.

17. The semiconductor memory device according to claim 1, wherein
the first transistor comprises:
a second semiconductor layer which is electrically connected to the memory portion and the first via wiring;

a second gate electrode which is connected to the first wiring, and faces the second semiconductor layer; and a second gate insulating film which is provided between the second semiconductor layer and the second gate electrode, and the second semiconductor layer faces at least one of surfaces on one side or the other side in the first direction of the second gate electrode.

18. The semiconductor memory device according to claim 1, wherein the first semiconductor layer includes an oxide semiconductor.

19. The semiconductor memory device according to claim 1, wherein the first semiconductor layer includes: at least one element of gallium (Ga) or aluminum (Al); indium (In); zinc (Zn); and oxygen (O).

* * * * *